US012596307B2

(12) United States Patent
Rostalski et al.

(10) Patent No.: US 12,596,307 B2
(45) Date of Patent: Apr. 7, 2026

(54) IMAGING OPTICAL UNIT

(71) Applicant: Carl Zeiss SMT GmbH, Oberkochen (DE)

(72) Inventors: Hans-Jürgen Rostalski, Oberkochen (DE); Holger Münz, Aalen (DE); Christoph Menke, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 94 days.

(21) Appl. No.: 18/516,648

(22) Filed: Nov. 21, 2023

(65) Prior Publication Data

US 2024/0094637 A1 Mar. 21, 2024

Related U.S. Application Data

(63) Continuation of application No. PCT/EP2022/065226, filed on Jun. 3, 2022.

(30) Foreign Application Priority Data

Jun. 8, 2021 (DE) .................... 10 2021 205 774.8

(51) Int. Cl.
G03F 7/00 (2006.01)
G02B 5/08 (2006.01)
G02B 17/06 (2006.01)

(52) U.S. Cl.
CPC ........... *G03F 7/702* (2013.01); *G02B 5/0891* (2013.01); *G02B 17/0663* (2013.01)

(58) Field of Classification Search
CPC .. G02B 13/08; G02B 17/0663; G02B 5/0891; G03F 7/702; G03F 7/70233
See application file for complete search history.

(56) References Cited

U.S. PATENT DOCUMENTS 6,577,443 B2 6/2003 Dinger et al.
8,027,022 B2 9/2011 Zellner et al.
(Continued)

FOREIGN PATENT DOCUMENTS

DE 101 55 711 A 2/2006
DE 10 2009 011 328 A1 8/2010
(Continued)

OTHER PUBLICATIONS

International Search Report and Written Opinion for corresponding PCT Appl. No. PCT/EP2022/065226, mailed Sep. 27, 2022.
(Continued)

*Primary Examiner* — Deoram Persaud
(74) *Attorney, Agent, or Firm* — Fish & Richardson P.C.

(57) ABSTRACT

An imaging optical unit comprises a plurality of mirrors for imaging an object field in an object plane into an image field in an image plane. An image-side numerical aperture is greater than 0.55. A ratio between an object/image offset and a meridional transverse direction is at least 0.5. A ratio between a working distance between the object plane and a reflection portion, closest to the object plane, of one of the mirrors and the meridional transverse dimension is at least 0.05. The working distance is at least 270 mm. This can yield an imaging optical unit, the use of which is relatively manageable in a projection exposure apparatus, such as for EUV projection lithography.

20 Claims, 4 Drawing Sheets

(56) References Cited

U.S. PATENT DOCUMENTS

| | | | | |
|---|---|---|---|---|
| 9,366,968 | B2 | 6/2016 | Mann | |
| 10,527,832 | B2 | 1/2020 | Schwab et al. | |
| 11,650,510 | B2 * | 5/2023 | Rostalski | G03F 7/7015 |
| | | | | 355/71 |
| 2007/0058269 | A1 | 3/2007 | Mann et al. | |
| 2014/0038110 | A1 | 2/2014 | Mann et al. | |
| 2016/0085061 | A1 | 3/2016 | Schwab | |
| 2018/0074303 | A1 | 3/2018 | Schwab | |
| 2018/0088303 | A1 | 3/2018 | Schwab et al. | |
| 2018/0252904 | A1 | 9/2018 | Wolf et al. | |
| 2019/0121107 | A1 * | 4/2019 | Schwab | G02B 17/0663 |
| 2025/0116940 | A1 * | 4/2025 | Schwab | G03F 7/70033 |

FOREIGN PATENT DOCUMENTS

| | | | |
|---|---|---|---|
| DE | 10 2009 045 096 | A1 | 10/2010 |
| DE | 10 2012 202 675 | A1 | 1/2013 |
| DE | 10 2015 226 531 | A1 | 10/2016 |
| DE | 10 2019 219 209 | A1 | 1/2020 |
| DE | 10 2019 208 961 | A1 | 12/2020 |
| WO | WO 2009/010213 | A1 | 1/2009 |
| WO | WO 2012/126867 | A | 9/2012 |
| WO | WO 2016/166080 | A1 | 10/2016 |

OTHER PUBLICATIONS

GPTO Office Action, with translation thereof, for corresponding DE Appl No. 10 2021 205 7774.8 dated Mar. 10, 2022.
Office Action in European Appln. No. 22732142.9, mailed on Oct. 23, 2025, 7 pages.

\* cited by examiner

IMAGING OPTICAL UNIT

CROSS-REFERENCE TO RELATED APPLICATIONS

The present application is a continuation of, and claims benefit under 35 USC 120 to, international application PCT/EP2022/065226, filed Jun. 3, 2022, which claims benefit under 35 USC 119 of German Application No 10 2021 205 774.8, filed Jun. 8, 2021. The entire disclosure of each these applications is incorporated by reference herein.

FIELD

The patent application relates to an imaging optical unit comprising a plurality of mirrors for imaging the object field into an image field, the mirrors of the imaging optical unit being able to be measured via the testing optical unit. Further, the disclosure relates to an optical system comprising such an imaging optical unit, an illumination system comprising such an optical system, a projection exposure apparatus comprising such an illumination system, a method for producing a microstructured or nanostructured component, and a microstructured or nanostructured component produced by any such method.

BACKGROUND

Imaging optical units or projection optical units are known from DE 10 2019 219 209 A1, DE 10 2019 208 961 A1, WO 2009/010213 A1, US 2016/0085061 A1, DE 10 2012 202 675 A1, DE 10 2009 011 328 A1, U.S. Pat. No. 8,027,022 B2 and U.S. Pat. No. 6,577,443 B2. An illumination optical unit for a projection exposure apparatus is known from DE 10 2009 045 096 A1.

SUMMARY

The present disclosure seeks to develop an imaging optical unit of the type mentioned in the introduction in such a way that the use thereof in a projection exposure apparatus is relatively manageable, for example for EUV projection lithography.

According to the disclosure, it was recognized that dimensional ratios of the imaging optical unit with a ratio that is as large as possible between the object/image offset and the meridional transverse dimension on the one hand and between the working distance and the meridional transverse dimension on the other hand lead to imaging optical units that ensure that a wafer holder does not collide with optical components of an illumination optical unit upstream of the imaging optical unit (condition of a relatively large object/image offset), ensure that enough installation space is available adjacent to the object plane for an object holder, which is optionally designed for replacing an object (relatively large working distance), and that a possible vacuum container, in which an entire optical unit of the projection exposure apparatus is housed, need not be made with undesirably large dimensions (relatively small meridional transverse dimension)

An object or a portion thereof with structures to be imaged can be arranged on the object field. A substrate which the object structures are imaged or a substrate portion can be arranged in the image field.

In an aspect, the disclosure provides an imaging optical unit
   comprising a plurality of mirrors for imaging an object field in an object plane into an image field in an image plane,
   having an image-side numerical aperture greater than 0.55,
   having an object/image offset A between
      a separation plane, in which a centre of the object field is located and which is perpendicular to a meridional plane of the imaging optical unit, and
      a centre of the image field,
   having a working distance B between
      the object plane and
      a reflection portion, closest to the object plane, of one of the mirrors,
   having a meridional transverse dimension C between
      the separation plane and
      a reflection portion, furthest from the separation plane, of one of the mirrors,
   wherein the following applies:
      the ratio A/C is at least 0.5,
      the ratio B/C is at least 0.05,
   with the working distance B being at least 270 mm.

Such an imaging optical unit is a relatively manageable form on account of the given dimensional ratios In some embodiments, one or more of the following can hold: A is at least 1500 mm; B is at least 275 mm; and C at most 4500 mm. Such absolute dimensions were found to be particularly advantageous.

In some embodiments, the imaging optical unit is an anamorphic imaging optical unit. Advantages of the disclosure can be particularly pronounced in such embodiments. A corresponding anamorphic optical unit is known from U.S. Pat. No. 9,366,968.

In some embodiments, the imaging optical unit has a wavefront aberration of no more than 20 mλ. Such an imaging optical unit can provide for high-quality structure imaging.

In some embodiments, the mirrors total at least eight. Such an imaging optical unit can facilitate good imaging correction over a given image field size.

In some embodiments, the imaging optical unit has at least four grazing incidence (GI) mirrors and/or at least three normal incidence (NI) mirrors. Such imaging optical units have proven their worth in practice. There can be more than four GI mirrors, these may total six or eight for example. There can be more than three NI mirrors, these may total four for example.

An optical system can include an imaging optical unit according to the disclosure and an illumination optical unit for illuminating the object field with illumination and imaging light. An illumination system can include such an optical system and an EUV light source for producing the illumination and imaging light. A projection exposure apparatus for projection lithography can include such an illumination system. A method for producing a structured component can include the following method steps: providing a reticle and a wafer; projecting a structure on the reticle onto a light-sensitive layer of the wafer with the aid of such a projection exposure apparatus; and producing a microstructure and/or nanostructure on the wafer. A structured component can be provided using such a process. Advantages of such an optical system, an illumination system, a projection exposure apparatus, a production method, and structured (microstructured or nanostructured) component correspond to those which have already been explained above with reference to the imaging optical unit according to the disclosure.

For example, a semiconductor component, for example a memory chip, can be produced.

BRIEF DESCRIPTION OF THE DRAWINGS

Exemplary embodiments of the disclosure are explained in greater detail below with reference to the drawing, in which.

EXEMPLARY EMBODIMENTS

Figure 1:
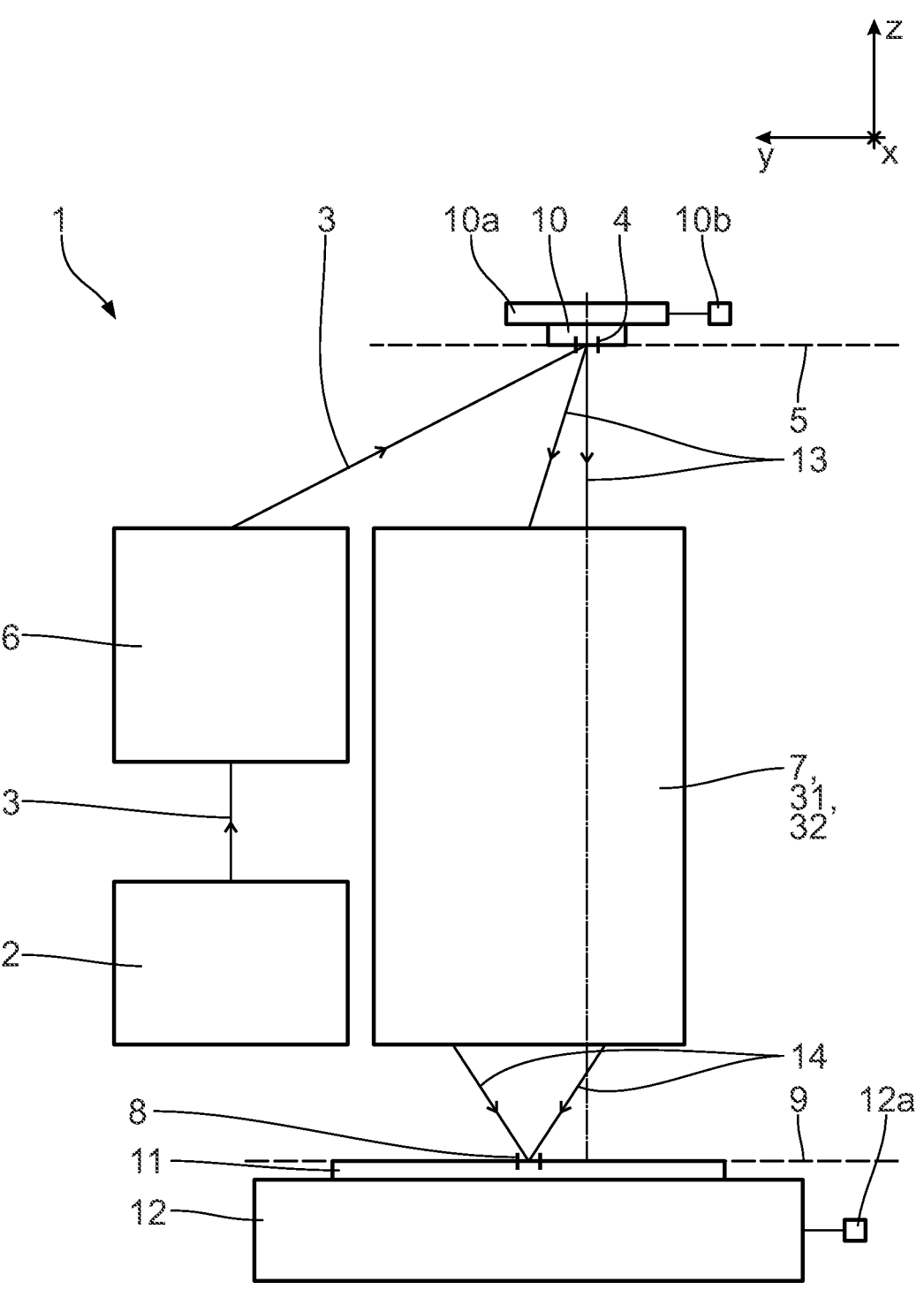
FIG. 1 schematically shows a projection exposure apparatus for EUV microlithography.

Referring to FIG. 1, a microlithographic projection exposure apparatus 1 comprises a light source 2 for illumination light or imaging light 3. The light source 2 is an EUV light source, which produces light in a wavelength range of, for example, between 5 nm and 30 nm, for example between 5 nm and 15 nm. For example, the light source 2 can be a light source with a wavelength of 13.5 nm or a light source with a wavelength of 6.9 nm. Other EUV wavelengths are also possible. In general, the illumination light 3 guided in the projection exposure apparatus 1 could even have any desired wavelength, for example visible wavelengths or else other wavelengths which may find use in microlithography (e.g. DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 is used to guide the illumination light 3 from the light source 2 to an object field 4 in an object plane 5. Using a projection optical unit or imaging optical unit 7, the object field 4 is imaged into an image field 8 in an image plane 9 with a given, possibly anamorphic reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs towards the left, and the z-direction runs upward.

The object field 4 and the image field 8 are rectangular. Alternatively, it is also possible for the object field 4 and the image field 8 to have a bent or curved embodiment, that is to say, for example, a partial ring shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

One of the exemplary embodiments depicted in FIGS. 2, 3 and 4, which will still be explained in more detail below, can be used for the projection optical unit 7.

Figure 2:
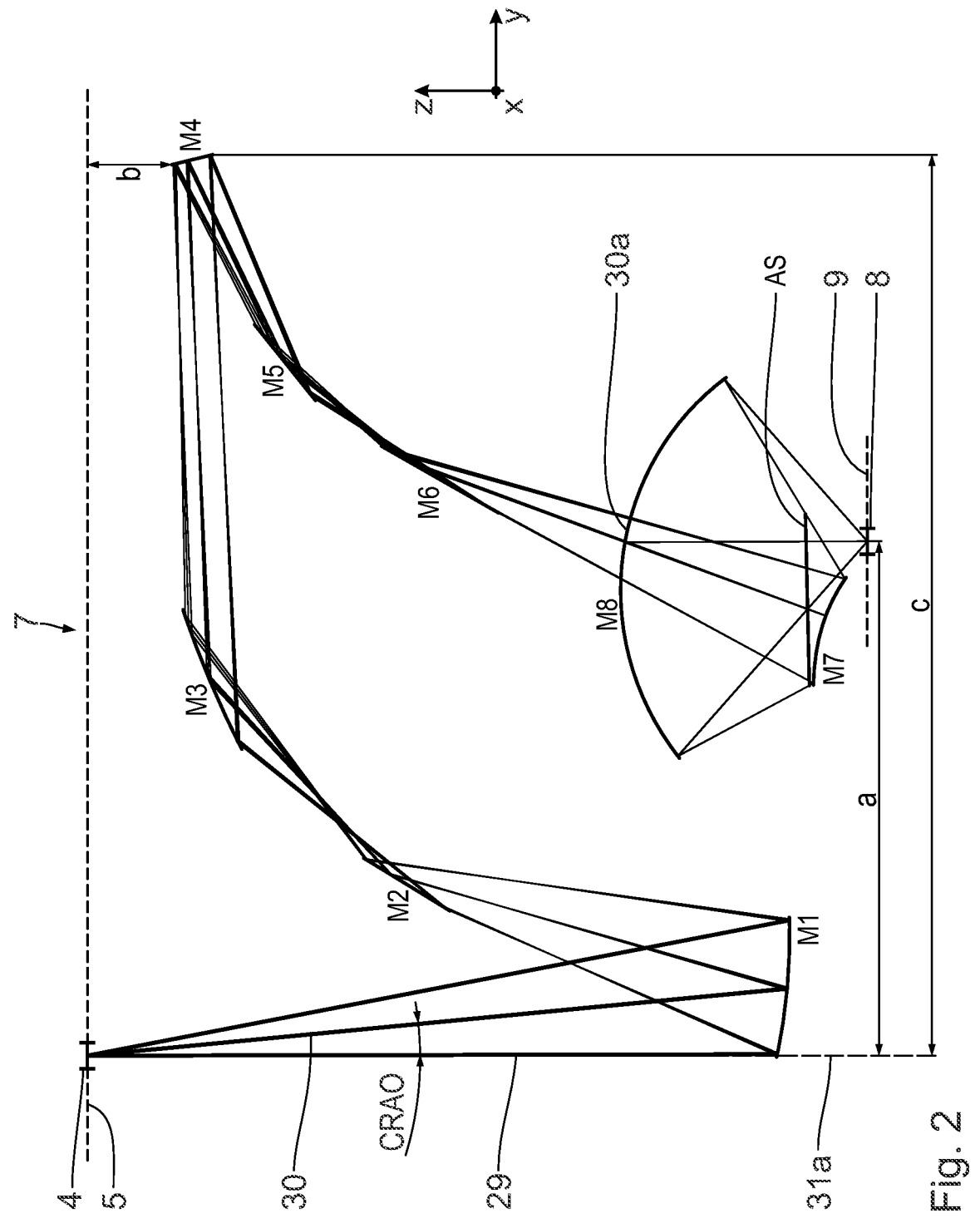
FIG. 2 shows, in a meridional section, an embodiment of an imaging optical unit which can be used as a projection lens in the projection exposure apparatus according to FIG. 1, wherein an imaging beam path for chief rays and for an upper coma ray and a lower coma ray of three selected field points is depicted.

The projection optical unit 7 according to FIG. 2 has an anamorphic embodiment. In the yz-plane, i.e. in the meridional plane of the section according to FIG. 2, the projection optical unit 7 has a reduction scale $|\beta_y|$ of 8. Thus, in the meridional plane yz, the object field 4 is imaged onto the image field with a reduction by a factor of 8. A reduction scale $|\beta_x|$ of the projection optical unit 7 is 4 in the sagittal plane xz, which is perpendicular to the meridional plane. In this xz-plane, the object field 4 is imaged with a reduction by a factor of 4 into the image field 8 between the object plane 5 and the image plane 9. Other integer or non-integer absolute reduction scales $\beta_x$, $\beta_y$ are also possible, as will still be explained below on the basis of the further exemplary embodiments.

The image field 8 has an x-extent of e.g. 26 mm and a y-extent of e.g. 2 mm.

In the embodiments of the projection optical unit 7 according to FIG. 7 et seq., the image plane 9 is arranged parallel to the object plane 5. What is imaged in this case is a portion of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically depicts, between the reticle 10 and the projection optical unit 7, abeam 13 of the illumination light 3 that enters into the projection optical unit and, between the projection optical unit 7 and the substrate 11, a beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously with one another by an appropriate actuation of the displacement drives 10b and 12a.

FIG. 2 shows the optical design of a first embodiment of the projection optical unit 7. FIG. 2 depicts the beam path of, in each case, three individual rays 29 emanating from three object field points which are spaced apart from one another in the y-direction in FIG. 2. What is depicted are chief rays 30, i.e. individual rays 29 which pass through the centre of a pupil in a pupil plane of the projection optical unit 7, and, in each case, an upper coma ray and a lower coma ray, i.e. rays that pass through the upper and lower edge of the pupil, respectively, of these two object field points. Proceeding from the object field 4, the chief rays 30 include an angle CRAO of 5.05° with a normal on the object plane 5.

The projection optical unit 7 has an image-side numerical aperture of 0.75.

The projection optical unit 7 according to FIG. 2 has a total of eight mirrors, which, proceeding from the object field 4, are numbered M1 to M8 in the sequence of the beam path of the individual rays 29. The imaging optical unit 7 can also have a different number of mirrors, for example four mirrors, six mirrors, nine mirrors, ten mirrors, eleven mirrors or even more mirrors.

FIG. 2 depicts the calculated reflection surfaces of the mirrors M1 to M8. Optionally only a portion of these calculated reflection surfaces is used. Only this actually used region of the reflection surfaces is actually present in the real mirrors M1 to M8. These used reflection surfaces are carried by mirror bodies in a manner known per se.

In the projection optical unit 7 according to FIG. 2, the mirrors M1, M4, M7 and M8 are configured as mirrors for normal incidence (NI mirrors), that is to say as mirrors onto which the imaging light 3 impinges with an angle of incidence that is smaller than 45°. Thus, overall, the projection optical unit 7 according to FIG. 2 has four mirrors M1, M4, M7 and M8 for normal incidence.

The mirrors M2, M3, M5 and M6 are mirrors for grazing incidence of the illumination light 3 (GI mirrors), that is to say mirrors onto which the illumination light 3 impinges with angles of incidence that are greater than 60°. A typical angle of incidence of the individual rays 29 of the imaging light 3 on the mirrors M2, M3, M5 and M6 for grazing incidence lies in the region of 80°. Overall, the projection optical unit 7 according to FIG. 2 has exactly four mirrors M2, M3, M5 and M6 for grazing incidence.

The mirrors M2, M3 on the one hand and M5, M6 on the other hand are designed as pairs of successive mirrors and reflect the imaging light 3 in such a way that the angles of reflection of the individual rays 29 at the respective mirrors of the pairs M2, M3 on the one hand and M5, M6 and the other hand summate, that is to say amplify in terms of the deflection effect.

The mirrors M1 to M8 carry a coating optimizing the reflectivity of the mirrors M1 to M8 for the imaging light 3. This can be a ruthenium coating, a molybdenum coating or a molybdenum coating with an uppermost layer of ruthenium. In the mirrors M2, M3, M5 and M6 for grazing incidence, use can be made of a coating with e.g. one ply of molybdenum or ruthenium. These highly reflecting layers, for example of the mirrors M1, M4, M7 and M8 for normal incidence, can be configured as multi-ply layers, wherein successive layers can be manufactured from different materials. Alternating material layers can also be used. A typical multi-ply layer can have fifty bilayers, respectively made of a layer of molybdenum and a layer of silicon. A multi-ply layer may be provided with an additional capping layer, for example made of ruthenium.

For the purposes of calculating an overall reflectivity of the projection optical unit 7, a system transmission can be calculated as follows: A mirror reflectivity is determined at each mirror surface on the basis of the angle of incidence of a guide ray, i.e. a chief ray of a central object field point, and combined by multiplication to form the system transmission.

Further information concerning the system transmission can be found in US 2016/0085061 A1.

Further information concerning reflection at a GI mirror (grazing incidence mirror) can be found in WO 2012/126867 A. Further information concerning the reflectivity of NI mirrors (normal incidence mirrors) can be found in DE 101 55 711 A.

The mirror M8, that is to say the ultimate mirror upstream of the image field 8 in the imaging beam path, has a passage opening 30a for the passage of the imaging light 3 which is reflected from the antepenultimate mirror M6 toward the penultimate mirror M7. The mirror M8 is used in a reflective manner around the passage opening 30a. All other mirrors M1 to M7 do not have a passage opening and are used in a reflective manner in a region connected in a gap-free manner.

A stop AS is disposed in the imaging beam path between the mirrors M6 and M7, the stop having both the function of an aperture stop and the function of an obscuration stop. Thus, the stop AS firstly specifies the image-side numerical aperture of the projection optical unit 7 and secondly specifies the size of an inner pupil obscuration.

The stop AS can be designed as a split stop, as known from U.S. Pat. No. 10,527,832.

The projection optical unit 7 is approximately telecentric on the object side. If the imaging beam path is only taken into account in relation to the individual rays that pass through the object field 4, the entrance pupil is located 4052.44 mm downstream of the object field 5 in the xz-plane and 41876.50 mm downstream of the object field 4 in the yz-plane.

In the projection optical unit 7, a pupil plane is present in the beam path of the imaging light 3 between the mirrors M1 and M2.

A first intermediate image plane is present in the beam path between the mirrors M2 and M3. A further intermediate image plane is present in the beam path between the mirrors M5 and M6. There is no intermediate image plane in the region of the passage opening 30a in the case of the projection optical unit 7. The number of intermediate image planes differs from the number of intermediate images in the meridional plane according to FIG. 2 from the number of intermediate images in a plane perpendicular thereto. Such projection optical units with different numbers of intermediate images in mutually perpendicular planes are known from WO 2016/166080 A1 and DE 10 2015 226 531 A1 as a matter of principle.

The stop AS is located in the beam path between the mirrors M7 and M8, in the region of a further pupil plane of the projection optical unit 7.

The mirrors M1 to M8 are embodied as free-form surfaces which cannot be described by a rotationally symmetric function. Other embodiments of the projection optical unit 7, in which at least one of the mirrors M1 to M8 is embodied as a rotationally symmetric asphere, are also possible. It is also possible for all mirrors M1 to M8 to be embodied as such aspheres.

A free-form surface can be described by the following free-form surface equation (Equation 1):

$$Z = \frac{c_x x^2 + c_y y^2}{1 + \sqrt{1 - (1 + k_x)(c_x x)^2 - (1 + k_y)(c_y y)^2}} + C_1 x + C_2 y + C_3 x^2 + \quad (1)$$

$$C_4 xy + C_5 y^2 + C_6 x^3 + \ldots + C_9 y^3 + C_{10} x^4 + \ldots + C_{12} x^2 y^2 + \ldots +$$

$$C_{14} y^4 + C_{15} x^5 + \ldots + C_{20} y^5 + C_{21} x^6 + \ldots + C_{24} x^3 y^3 + \ldots + C_{27} y^6 + \ldots$$

The following applies to the parameters of this Equation (1):

Z is the sagittal height of the free-form surface at the point x, y, where $x^2 + y^2 = r^2$. Here, r is the distance from the reference axis of the free-form surface equation $$(x=0; y=0).$$

In the free-form surface Equation (1), $C_1$, $C_2$, $C_3$ . . . denote the coefficients of the free-form surface series expansion in powers of x and y.

In the case of a conical base area, $c_x$, $c_y$ is a constant corresponding to the vertex curvature of a corresponding asphere. Thus, $c_x=1/R_x$ and $c_y=1/R_y$ applies. $k_x$ and $k_y$ each correspond to a conical constant of a corresponding asphere. Thus, Equation (1) describes a biconical free-form surface.

An alternative possible free-form surface can be produced from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and gradients associated therewith. Depending on the respective type of the spline surface, the complete surface is obtained by interpolation between the grid points using e.g. polynomials or functions which have specific properties in respect of the continuity and the differentiability thereof. Examples for this are analytical functions.

The optical design data of the reflection surfaces of the mirrors M1 to M8 (=M01 to M08) of the projection optical unit 7 can be gathered from the following tables.

The first of these tables provides vertex point radii (Radiusx=$R_x$, Radiusy=$R_y$) and refractive power values (Powerx, Powery) for the optical surfaces of the optical components. Negative values of radius mean curves which are concave toward the incident illumination light 3 in the section of the respective surface with the considered plane (xz, yz), which is spanned by a surface normal at the vertex point with the respective direction of curvature (x, y). The two radii Radiusx, Radiusy may explicitly have different signs.

The vertices at each optical surface are defined as points of incidence of a guide ray which travels from an object field centre to the image field 8 along a plane of symmetry x=0, i.e. the plane of the drawing of FIG. 2 (meridional plane). The refractive powers Powerx ($P_x$), Powery ($P_y$) at the vertices are defined as:

8

$$P_x = -\frac{2\cos AOI}{R_x}$$

$$P_y = -\frac{2}{R_y \cos AOI}$$

Here, AOI denotes an angle of incidence of the guide ray with respect to the surface normal.

The second table specifies the absolute value along which the respective mirror, proceeding from a reference surface, was decentred ($D_y$) in the y-direction, displaced ($D_z$) in the z-direction and tilted ($\alpha_x$, $\alpha_y$, $\alpha_z$). This corresponds to a parallel shift and a tilting in the case of the free-form surface design method. Here, a displacement is carried out along the y-direction and in the z-direction in mm, and tilting is carried out about the x-axis, about the y-axis and about the z-axis. In this case, the angle of rotation is specified in degrees. Decentring is carried out first, followed by tilting. The reference surface during decentring is in each case the first surface of the specified optical design data. Decentring in the y-direction and in the z-direction is also specified for the object field 4 (reticle). In addition to values assigned to the individual mirrors M1 to M8, this table also tabulates the object plane (reticle) as a first surface, the image plane (wafer) as an ultimate surface and a stop surface (denoted "stop") as an arrangement plane for an aperture or obscuration stop.

The third table (Tables 3a to 3c) specifies the free-form surface coefficients $C_n$, respectively assigned to the polynomials $x^k$, $y^l$, for the mirrors M1 to M8. Coefficients $C_1$ not tabulated in the table each have the value of 0.

The fourth table specifies a boundary of the stop AS as a polygonal line in local coordinates xy. As described above, the stop is decentred and tilted. In this table, the coordinates are specified in two columns. The first column (consisting of an x- and a y-coordinate) contains the coordinates of the corners 1 to M/2 of the polygon, and the second column contains the coordinates of the corners N/2+1 to N. Each row therefore contains four numbers, specifically $x_i$, $y_i$, $x_{i+N/2}$, $y_{i+N/2}$.

TABLE 1 for FIG. 2
Radii of the surfaces

| | Radius$_x$ [mm] | Power$_x$ [1/mm] | Radius$_y$ [mm] | Power$_y$ [1/mm] |
|---|---|---|---|---|
| M01 | −4034.99337674 | 0.00048480 | −1919.37995952 | 0.00101917 |
| M02 | 2920.41917039 | −0.00008695 | 11587.03874383 | −0.00002192 |
| M03 | −26015.99761308 | 0.00003162 | −3094.46673369 | 0.00026583 |
| M04 | −2953.96843662 | 0.00066710 | −3212.98631374 | 0.00061332 |
| M05 | −6775.34133198 | 0.00008890 | −6077.62957307 | 0.00009911 |
| M06 | 153274.17405730 | −0.00000042 | 11112.52442081 | −0.00000576 |
| M07 | 9368.75423580 | −0.00018587 | 596.79271790 | −0.00291783 |
| M08 | −1010.31540632 | 0.00194976 | −863.43988213 | 0.00228143 |

TABLE 2 for FIG. 2
Decentring (location, angle) the surfaces

| | D$_x$ [mm] | D$_y$ [mm] | D$_z$ [mm] |
|---|---|---|---|
| Reticle | 0.000000000 | 0.000000000 | 0.000000000 |
| M01 | 0.000000000 | −215.931440053 | 2242.533747038 |

TABLE 2-continued for FIG. 2
Decentring (location, angle) the surfaces

| M02 | 0.000000000 | −581.615773686 | 972.087125641 |
| M03 | 0.000000000 | −1211.474170454 | 389.630407074 |
| M04 | 0.000000000 | −2870.974936716 | 320.829470405 |
| M05 | 0.000000000 | −2227.616068614 | 627.737948335 |
| M06 | 0.000000000 | −1901.343414992 | 1040.317765822 |
| M07 | −0.000000000 | −1411.845146534 | 2366.757744378 |
| Stop | −0.000000000 | −1433.339697092 | 2308.511917952 |
| M08 | 0.000000000 | −1649.877036267 | 1721.740110900 |
| Wafer | −0.000000000 | −1649.832513636 | 2500.204827932 |

| | $\alpha_x$ [°] | $\alpha_y$ [°] | $\alpha_z$ [°] |
| --- | --- | --- | --- |
| Reticle | 0.000000000 | 0.000000000 | 0.000000000 |
| M01 | −5.278946214 | 0.000000000 | 0.000000000 |
| M02 | 58.351487888 | 180.000000000 | 0.000000000 |
| M03 | 202.567461898 | 0.000000000 | 0.000000000 |
| M04 | −76.061447244 | 180.000000000 | 0.000000000 |
| M05 | 218.582857583 | 0.000000000 | 0.000000000 |
| M06 | 60.703505424 | 180.000000000 | 0.000000000 |
| M07 | −20.255654399 | −0.000000000 | −0.000000000 |
| Stop | 1.326318383 | 180.000000000 | −0.000000000 |
| M08 | −10.129465655 | 180.000000000 | −0.000000000 |
| Wafer | −0.003276910 | −0.000000000 | 0.000000000 |

TABLE 3a for FIG. 2
Free−form coefficients of the surfaces

| Coefficient Formula | | M01 | M02 | M03 |
| --- | --- | --- | --- | --- |
| C7 | $x^2 y$ | 2.1521350904e−08 | 1.1787316958e−07 | −1.4132123554e−07 |
| C9 | $y^3$ | 8.7024735141e−09 | −3.3367018008e−07 | 3.9356983474e−08 |
| C10 | $x^4$ | 5.5560957075e−12 | 3.4025225495e−11 | −6.5750183525e−11 |
| C12 | $x^2 y^2$ | 7.5032152159e−12 | −1.9736140793e−10 | 7.6565679325e−11 |
| C14 | $y^4$ | −3.9878920961e−11 | 8.3176214710e−10 | 7.4538149503e−12 |
| C16 | $x^4 y$ | 1.9761473535e−14 | 9.7263173621e−14 | 3.5762077821e−14 |
| C18 | $x^2 y^3$ | 4.9899022378e−14 | 7.9538468016e−14 | −2.2829082429e−14 |
| C20 | $y^5$ | −7.9997851101e−14 | −2.0149908433e−12 | −5.5078057337e−14 |
| C21 | $x^6$ | 6.7688627599e−18 | −1.1837742413e−17 | 1.9487417140e−18 |
| C23 | $x^4 y^2$ | 6.2287464539e−18 | 2.1507653236e−16 | 1.4070268782e−17 |
| C25 | $x^2 y^4$ | 8.9820067762e−17 | −2.8579314403e−16 | −4.9037732040e−17 |
| C27 | $y^6$ | −1.7199085361e−16 | 6.9745386669e−15 | 7.5895230730e−17 |
| C29 | $x^6 y$ | −7.9726966250e−21 | 2.4802802663e−19 | 2.0013048846e−20 |
| C31 | $x^4 y^3$ | −2.2580790713e−20 | −9.7206078620e−19 | −5.7407912103e−20 |
| C33 | $x^2 y^5$ | 1.2004739572e−19 | −1.0648476929e−19 | 2.0650200707e−20 |
| C35 | $y^7$ | −1.4869410891e−21 | −1.2608475036e−17 | 4.5515851277e−19 |
| C36 | $x^8$ | −5.9918913447e−24 | 3.2759947243e−22 | 5.7195698345e−23 |
| C38 | $x^6 y^2$ | 3.8210947146e−24 | −1.2399767203e−22 | −6.1461254760e−23 |
| C40 | $x^4 y^4$ | 2.3657574745e−23 | 9.9003718858e−22 | 2.0211891359e−22 |
| C42 | $x^2 y^6$ | −3.5893911196e−23 | 2.5795548778e−21 | 2.5989240605e−21 |
| C44 | $y^8$ | 1.0862009204e−21 | −2.1799987369e−19 | −3.9696603728e−22 |
| C46 | $x^8 y$ | 2.7623417895e−26 | 1.9187001763e−26 | −1.1898117464e−25 |
| C48 | $x^6 y^3$ | 3.2302452678e−25 | −5.7877652911e−25 | 2.3993987486e−25 |
| C50 | $x^4 y^5$ | 2.3212765682e−24 | 1.0036656167e−23 | 2.0979738694e−24 |
| C52 | $x^2 y^7$ | −2.9540953870e−24 | 1.0845106904e−22 | −9.2125961341e−24 |
| C54 | $y^9$ | −1.9775620518e−23 | 1.8791932171e−21 | −3.6054702892e−23 |
| C55 | $x^{10}$ | −7.8656225734e−31 | −1.1426249301e−27 | −2.2725313266e−28 |
| C57 | $x^8 y^2$ | −8.6492497072e−29 | 4.8911298402e−27 | 4.5835274737e−28 |
| C59 | $x^6 y^4$ | −2.5458706650e−27 | 5.8300212318e−27 | −1.6449310234e−28 |
| C61 | $x^4 y^6$ | 1.0727981205e−27 | −3.0794278556e−26 | −3.1071106797e−26 |
| C63 | $x^2 y^8$ | −5.9157827970e−27 | −1.2558855465e−24 | −1.6560734754e−25 |
| C65 | $y^{10}$ | −1.9658357053e−25 | −3.2949399728e−24 | 1.2704474400e−25 |
| C67 | $x^{10} y$ | −1.0763473925e−31 | 1.0453631883e−30 | 5.6807442176e−31 |
| C69 | $x^8 y^3$ | −3.1619674535e−30 | 1.2274256167e−29 | −1.5423191780e−31 |
| C71 | $x^6 y^5$ | −3.6302312311e−29 | 1.3105506757e−28 | −2.1528307642e−29 |
| C73 | $x^4 y^7$ | −9.0724878973e−29 | −2.5212060185e−27 | −8.4338804346e−29 |
| C75 | $x^2 y^9$ | 2.1818185390e−28 | −5.9079606952e−27 | 7.4194764024e−28 |
| C77 | $y^{11}$ | −1.1731058142e−28 | −2.3664039350e−26 | 1.0068178666e−27 |
| C78 | $x^{12}$ | 1.1859547340e−34 | 4.6569698415e−33 | 2.0928678345e−34 |
| C80 | $x^{10} y^2$ | 8.0754311628e−34 | −5.2503795225e−32 | −2.0835452019e−33 |
| C82 | $x^8 y^4$ | 2.7117648894e−32 | 4.4038353142e−32 | −4.9505362121e−33 |
| C84 | $x^6 y^6$ | 2.1371956884e−31 | −9.5358323891e−31 | 9.0318380750e−32 |

TABLE 3a-continued for FIG. 2
Free-form coefficients of the surfaces

| Coefficient | Formula | M01 | M02 | M03 |
|---|---|---|---|---|
| C86 | $x^4 y^8$ | −9.0437590127e−32 | 2.1126113378e−29 | 2.1301887206e−30 |
| C88 | $x^2 y^{10}$ | 1.5464341810e−30 | 1.4749252853e−28 | 5.8117607059e−30 |
| C90 | $y^{12}$ | 3.9640791475e−30 | 1.6823058962e−28 | −5.3769877539e−30 |
| C92 | $x^{12} y$ | 3.6566336252e−37 | 3.9960551727e−35 | −1.8005079646e−36 |
| C94 | $x^{10} y^3$ | 1.5740653862e−35 | 6.3186990963e−35 | −1.4177462413e−35 |
| C96 | $x^8 y^5$ | 2.3437356064e−34 | −3.2083538854e−33 | 4.5602299584e−35 |
| C98 | $x^6 y^7$ | 1.5224165082e−33 | −8.7996119915e−34 | 1.0275489722e−33 |
| C100 | $x^4 y^9$ | 2.4585083713e−34 | 1.5999608638e−31 | 6.5014081591e−34 |
| C102 | $x^2 y^{11}$ | −6.7057882610e−34 | −2.1476462249e−31 | −2.5737947868e−32 |
| C104 | $y^{13}$ | 8.5612655825e−33 | 1.4165280832e−31 | −1.4773288630e−32 |
| C105 | $x^{14}$ | −5.0629738724e−40 | −1.6613826132e−38 | 8.2934045453e−40 |
| C107 | $x^{12} y^2$ | −2.9228885198e−39 | 5.7332753831e−37 | 1.9455944074e−39 |
| C109 | $x^{10} y^4$ | −1.3732735962e−37 | −1.4722825961e−36 | 1.3250679569e−40 |
| C111 | $x^8 y^6$ | −1.8821837369e−36 | 6.0412526109e−36 | −6.8798222979e−38 |
| C113 | $x^6 y^8$ | −7.1669783192e−36 | 1.1533223185e−35 | −6.8321084910e−36 |
| C115 | $x^4 y^{10}$ | 2.6980183245e−36 | −2.4424274448e−33 | −7.3177564183e−35 |
| C117 | $x^2 y^{12}$ | −3.2695372702e−35 | −7.4338389363e−33 | −1.1561720127e−34 |
| C119 | $y^{14}$ | −2.2061944591e−35 | −1.2105673148e−32 | 1.1743710862e−34 |
| C121 | $x^{14} y$ | −1.5117318447e−42 | −2.3935729252e−40 | 2.8729291230e−42 |
| C123 | $x^{12} y^3$ | −3.7673388736e−41 | −1.1438639618e−39 | 9.6607924020e−41 |
| C125 | $x^{10} y^5$ | −8.9668820572e−40 | 1.9296715371e−38 | 2.3637253908e−40 |
| C127 | $x^8 y^7$ | −6.4444995226e−39 | 1.6954135404e−37 | −2.3722052788e−39 |
| C129 | $x^6 y^9$ | −3.1133119253e−38 | 4.1128177470e−38 | −1.7067490431e−38 |
| C131 | $x^4 y^{11}$ | 5.6003617485e−38 | 4.6354160402e−36 | 2.7522436870e−38 |
| C133 | $x^2 y^{13}$ | −1.3393429419e−37 | 5.4493236330e−35 | 4.4362813883e−37 |
| C135 | $y^{15}$ | −8.8106147316e−38 | 9.9192863836e−35 | 7.6420972557e−38 |
| C136 | $x^{16}$ | 9.6154995568e−46 | 8.5297756139e−44 | −3.4184161211e−45 |
| C138 | $x^{14} y^2$ | 6.7746448350e−45 | −3.1863970035e−42 | 1.8274751399e−44 |
| C140 | $x^{12} y^4$ | 3.4257874836e−43 | 9.4655639529e−42 | 1.9667036469e−43 |
| C142 | $x^{10} y^6$ | 6.7068589418e−42 | 3.1566917339e−41 | 4.1973634791e−43 |
| C144 | $x^8 y^8$ | 4.8132117640e−41 | −8.6577384776e−40 | 1.4656676566e−41 |
| C146 | $x^6 y^{10}$ | 9.5499786182e−41 | 2.4587656881e−39 | 1.6669776050e−40 |
| C148 | $x^4 y^{12}$ | 4.1344982064e−41 | 5.3381961023e−38 | 1.3146865269e−39 |
| C150 | $x^2 y^{14}$ | −4.1983194544e−42 | −1.5991093786e−37 | 1.1388831730e−39 |
| C152 | $y^{16}$ | −3.2387947839e−40 | −3.8089349527e−37 | −1.2244387226e−39 |
| C154 | $x^{16} y$ | 2.7813838445e−48 | 6.6042019465e−46 | 1.9425833013e−49 |
| C156 | $x^{14} y^3$ | 2.7146181955e−47 | 5.7160365834e−45 | −1.9339907360e−46 |
| C158 | $x^{12} y^5$ | 1.2332440828e−45 | −2.8888344096e−44 | −1.0515363766e−45 |
| C160 | $x^{10} y^7$ | 1.2483967050e−44 | −5.8153596336e−43 | 1.5316944697e−45 |
| C162 | $x^8 y^9$ | 5.6496635012e−44 | −2.4317993102e−42 | 6.5153788043e−45 |
| C164 | $x^6 y^{11}$ | 2.5065946151e−43 | −2.4067164278e−41 | 1.5951592927e−43 |
| C166 | $x^4 y^{13}$ | −9.9208048186e−43 | −2.8832467322e−40 | −6.5233797249e−43 |
| C168 | $x^2 y^{15}$ | 2.5987717141e−42 | 2.1215687366e−40 | −2.7704535512e−42 |
| C170 | $y^{17}$ | −9.7463316249e−43 | 7.2212195135e−40 | −3.3529825374e−44 |
| C171 | $x^{18}$ | −7.6877343532e−52 | −1.2241128080e−49 | 3.6512857520e−51 |
| C173 | $x^{16} y^2$ | −9.8514184953e−51 | 8.3091980783e−48 | −4.3883060351e−50 |
| C175 | $x^{14} y^4$ | −3.1668123053e−49 | −6.7731554852e−48 | −6.8194662879e−49 |
| C177 | $x^{12} y^6$ | −9.1485218816e−48 | −1.8925844722e−46 | −1.6981489713e−48 |
| C179 | $x^{10} y^8$ | −8.6066486288e−47 | 1.9622506386e−45 | −3.1046718597e−47 |
| C181 | $x^8 y^{10}$ | −4.2346481695e−46 | 1.6072975736e−44 | −1.5367380933e−46 |
| C183 | $x^6 y^{12}$ | −3.0153790442e−46 | 5.3471372986e−44 | −1.7408374500e−45 |
| C185 | $x^4 y^{14}$ | −1.9632777042e−45 | 4.1871053244e−43 | −8.9549573898e−45 |
| C187 | $x^2 y^{16}$ | 7.0003037571e−45 | −1.0664888409e−43 | −5.0794796208e−45 |
| C189 | $y^{18}$ | −4.7581812824e−46 | −5.4126862903e−43 | 5.2086604563e−45 |

TABLE 3b for FIG. 2

| Coefficient | Formula | M04 | M05 | M06 |
|---|---|---|---|---|
| C7 | $x^2 y$ | 2.1660952734e−08 | 3.1333885220e−08 | −3.3030773408e−08 |
| C9 | $y^3$ | 3.9266375372e−08 | 5.0988995907e−08 | −2.9178103112e−08 |
| C10 | $x^4$ | 2.8829949631e−12 | −4.8249179223e−13 | 6.7529892237e−11 |
| C12 | $x^2 y^2$ | 1.1253311565e−10 | −3.0274062932e−11 | 8.0570609182e−11 |
| C14 | $y^4$ | 4.3077253594e−10 | −8.5400978420e−11 | 5.1962046362e−11 |
| C16 | $x^4 y$ | 1.5843061838e−14 | −9.2516756288e−15 | 7.0685883753e−14 |
| C18 | $x^2 y^3$ | 3.5040147006e−13 | −2.5611651479e−14 | 3.0604682247e−14 |
| C20 | $y^5$ | −1.0474638103e−12 | 1.8578320289e−13 | −5.6179910868e−14 |
| C21 | $x^6$ | 1.0293405300e−18 | 8.5967220986e−18 | −1.6735697691e−16 |
| C23 | $x^4 y^2$ | 7.9434013734e−17 | 3.6705182502e−17 | 5.7859209076e−16 |
| C25 | $x^2 y^4$ | 9.0120514561e−16 | 1.5039899738e−16 | −2.8688402112e−16 |

TABLE 3b-continued

| | | for FIG. 2 | | |
|---|---|---|---|---|
| Coefficient | Formula | M04 | M05 | M06 |
| C27 | $y^6$ | −2.2374733431e−14 | −4.1879219875e−16 | 7.3923810896e−16 |
| C29 | $x^6 y$ | 1.0226788796e−20 | −2.9562274975e−20 | −5.0026120248e−19 |
| C31 | $x^4 y^3$ | 2.2769066499e−19 | 5.6781871174e−21 | 1.6634301383e−18 |
| C33 | $x^2 y^5$ | −1.6872068907e−17 | −5.3417521961e−19 | −2.7189191125e−18 |
| C35 | $y^7$ | −1.2783950389e−16 | 9.6964121839e−19 | −1.5469681891e−17 |
| C36 | $x^8$ | −1.7971363712e−24 | 2.1622792330e−22 | −6.3269019016e−21 |
| C38 | $x^6 y^2$ | 3.1525788327e−23 | −1.5616915290e−22 | −3.5266205499e−21 |
| C40 | $x^4 y^4$ | −3.0162742950e−21 | −1.1434360642e−21 | −5.4681625969e−20 |
| C42 | $x^2 y^6$ | 1.7332353923e−19 | −7.7718331673e−22 | 3.6130768205e−20 |
| C44 | $y^8$ | 2.1593432167e−17 | −7.9333587218e−21 | 6.4890060940e−20 |
| C46 | $x^8 y$ | −1.5390653103e−27 | −7.8435745509e−25 | −2.2831990708e−22 |
| C48 | $x^6 y^3$ | 8.8568076913e−25 | 1.0155690743e−24 | 3.8060229125e−22 |
| C50 | $x^4 y^5$ | 1.5519454651e−22 | 7.5599473736e−24 | 4.8848696934e−22 |
| C52 | $x^2 y^7$ | 1.6189164310e−20 | 4.8909071330e−26 | −2.9627761818e−22 |
| C54 | $y^9$ | 7.9652339881e−20 | 6.6138481693e−23 | 8.2333391252e−22 |
| C55 | $x^{10}$ | 5.9094480530e−30 | −2.6077557400e−27 | 7.0809951961e−25 |
| C57 | $x^8 y^2$ | 2.6809201148e−28 | 3.2771923020e−27 | −3.6506220356e−24 |
| C59 | $x^6 y^4$ | 6.1333047370e−26 | 7.6108243931e−27 | −2.1544477960e−24 |
| C61 | $x^4 y^6$ | 7.1838124486e−24 | 3.7933919694e−26 | 1.1745883624e−23 |
| C63 | $x^2 y^8$ | −9.1098026402e−24 | 1.3794443835e−25 | 2.6315555304e−24 |
| C65 | $y^{10}$ | −4.3457989750e−21 | 2.3404380085e−25 | −8.6844242237e−24 |
| C67 | $x^{10} y$ | 1.4784475567e−32 | 1.4678117646e−29 | 2.0691255128e−26 |
| C69 | $x^8 y3$ | 4.1923693697e−30 | −1.9763343438e−29 | −5.0658919158e−26 |
| C71 | $x^6 y^5$ | 8.1823569000e−28 | −1.0730104633e−28 | −1.9099808443e−25 |
| C73 | $x^4 y^7$ | −3.0128056195e−26 | −3.6782086540e−28 | −1.4075411360e−25 |
| C75 | $x^2 y^9$ | −2.9490517356e−24 | −5.1710044246e−28 | 2.4493963042e−26 |
| C77 | $y^{11}$ | −1.9094350088e−23 | −4.5276503089e−27 | 3.3907003478e−27 |
| C78 | $x^{12}$ | −5.7249163483e−36 | 1.4006486404e−32 | −3.2017705884e−29 |
| C80 | $x^{10} y^2$ | −1.1201070735e−33 | −4.5922239946e−32 | 3.4008842678e−28 |
| C82 | $x^8 y^4$ | −2.0366019740e−31 | −9.8693256802e−33 | 1.1576925077e−27 |
| C84 | $x^6 y^6$ | −4.0937814696e−29 | 1.8239826155e−31 | 8.9515522467e−28 |
| C86 | $x^4 y^8$ | −2.1648505724e−27 | −3.0389746406e−30 | −7.8567743843e−28 |
| C88 | $x^2 y^{10}$ | 8.1759146860e−27 | 7.5865748174e−31 | −5.6053032642e−28 |
| C90 | $y^{12}$ | 8.2108120807e−25 | −1.2538187576e−29 | 3.3365316022e−28 |
| C92 | $x^{12} y$ | −5.0548663615e−38 | −1.1129185971e−34 | −8.8522950187e−31 |
| C94 | $x^{10} y^3$ | −3.1655268140e−35 | 2.1883222778e−34 | 2.3936539218e−30 |
| C96 | $x^8 y^5$ | −5.5380485066e−33 | 7.0423680847e−34 | 1.8305172115e−29 |
| C98 | $x^6 y^7$ | −5.2430548906e−31 | 4.5199562366e−33 | 2.3409101496e−29 |
| C100 | $x^4 y^9$ | 1.3841354578e−30 | 1.4819899436e−32 | 1.4533837941e−29 |
| C102 | $x^2 y^{11}$ | 4.0971323331e−28 | 2.6880636940e−32 | 1.9194019601e−30 |
| C104 | $y^{13}$ | 7.7252252576e−27 | 1.9784236502e−31 | −1.8471281396e−30 |
| C105 | $x^{14}$ | 9.8475230978e−43 | −3.6370268719e−38 | 8.2490268399e−34 |
| C107 | $x^{12} y^2$ | 2.8178788967e−39 | 3.5966308029e−37 | −1.2060908669e−32 |
| C109 | $x^{10} y^4$ | 5.8382973814e−37 | −5.5591258757e−37 | −1.0382424031e−31 |
| C111 | $x^8 y^6$ | 1.1214426294e−34 | −5.6556460782e−36 | −1.9127253782e−31 |
| C113 | $x^6 y^8$ | 1.1959744206e−32 | −7.9641220855e−37 | −1.2906119442e−31 |
| C115 | $x^4 y^{10}$ | 3.4940308615e−31 | 9.2565610063e−35 | −1.8452868801e−32 |
| C117 | $x^2 y^{12}$ | 6.0329842175e−31 | −2.5886142734e−34 | 1.8181955925e−32 |
| C119 | $y^{14}$ | −7.0908670479e−29 | 3.6271206303e−34 | 2.0990219072e−33 |
| C121 | $x^{14} y$ | 2.3792130662e−43 | 3.9088709301e−40 | 1.8602086752e−35 |
| C123 | $x^{12} y^3$ | 1.4707237924e−40 | −1.1188883361e−39 | −3.0763841122e−35 |
| C125 | $x^{10} y^5$ | 2.4672375126e−38 | −2.3699864032e−39 | −8.1322782953e−34 |
| C127 | $x^8 y^7$ | 3.4227240925e−36 | 2.0057033331e−38 | −1.5331720682e−33 |
| C129 | $x^6 y^9$ | 2.0832562823e−34 | −2.6451985749e−37 | −7.4089031221e−34 |
| C131 | $x^4 y^{11}$ | 1.5835026840e−33 | 4.3633522737e−38 | −4.8347995938e−34 |
| C133 | $x^2 y^{13}$ | −2.2911046663e−33 | −1.3151815707e−36 | −1.8530290775e−34 |
| C135 | $y^{15}$ | −1.6496976386e−30 | −3.9484767292e−36 | 1.5723430812e−35 |
| C136 | $x^{16}$ | 1.8372055185e−48 | 2.9810793335e−44 | −1.1835863906e−38 |
| C138 | $x^{14} y^2$ | 1.1874709611e−45 | −1.4245325924e−42 | 1.5398085471e−37 |
| C140 | $x^{12} y^4$ | 9.0478679352e−43 | 4.7893823268e−42 | 3.5981573888e−36 |
| C142 | $x^{10} y^6$ | 5.3039437925e−41 | 1.8905276850e−41 | 1.1862951148e−35 |
| C144 | $x^8 y^8$ | 7.8290181860e−39 | 8.9415133170e−41 | 1.1246102269e−35 |
| C146 | $x^6 y^{10}$ | −1.0240940043e−37 | 8.8169810814e−41 | 6.3837515450e−36 |
| C148 | $x^4 y^{12}$ | 1.9558769764e−36 | −1.1878759927e−39 | 2.8731472061e−36 |
| C150 | $x^2 y^{14}$ | −3.9953984319e−34 | 8.2436940391e−39 | 6.8875254803e−37 |
| C152 | $y^{16}$ | −5.6474117066e−33 | −4.9413402019e−39 | −7.1767252149e−38 |
| C154 | $x^{16} y$ | −2.4582159279e−49 | −4.4754643934e−46 | −1.5161616370e−40 |
| C156 | $x^{14} y^3$ | −1.4054112660e−46 | 2.1265553221e−45 | −1.8177014275e−40 |
| C158 | $x^{12} y^5$ | −2.2495426009e−44 | 5.4790861578e−45 | 1.1798635482e−38 |
| C160 | $x^{10} y^7$ | −3.1894132838e−42 | −2.4474717948e−43 | 4.1957974177e−38 |
| C162 | $x^8 y^9$ | −3.6464445135e−40 | 3.5133942366e−43 | 2.1503331297e−38 |
| C164 | $x^6 y^{11}$ | −1.2290909798e−38 | 3.5286185580e−42 | −1.3018838762e−38 |
| C166 | $x^4 y^{13}$ | 8.5007476807e−38 | −6.8933145997e−42 | −6.4734628027e−39 |
| C168 | $x^2 y^{15}$ | −8.9963822447e−36 | 2.5472093319e−41 | −1.2121353441e−39 |
| C170 | $y^{17}$ | 6.6478733266e−35 | 2.6090514385e−41 | 1.2275453894e−40 |
| C171 | $x^{18}$ | 4.6272517509e−54 | −6.1164806513e−51 | 7.4096377325e−44 |

TABLE 3b-continued

| | | for FIG. 2 | | |
|---|---|---|---|---|
| Coefficient | Formula | M04 | M05 | M06 |
| C173 | $x^{16} y^2$ | −3.5872296762e−51 | 1.9622190489e−48 | −1.3119648435e−43 |
| C175 | $x^{14} y^4$ | −2.0307680444e−48 | −1.1885161644e−47 | −4.0756534693e−41 |
| C177 | $x^{12} y^6$ | −1.1410294961e−46 | 6.1260900289e−48 | −2.3417244739e−40 |
| C179 | $x^{10} y^8$ | −3.0791539834e−44 | 7.6867496312e−46 | −3.6340725269e−40 |
| C181 | $x^8 y^{10}$ | −1.9471591420e−42 | −4.8265841146e−45 | −1.4648853682e−40 |
| C183 | $x^6 y^{12}$ | −4.9547550378e−41 | 9.0439183673e−45 | 6.5485699735e−42 |
| C185 | $x^4 y^{14}$ | 6.0840560058e−40 | −1.7952807242e−44 | 5.3789642146e−42 |
| C187 | $x^2 y^{16}$ | −4.8904884769e−38 | −5.1391405664e−44 | 8.4380197977e−43 |
| C189 | $y^{18}$ | 4.4662799106e−37 | −8.0430224445e−45 | −7.9420102979e−44 |

TABLE 3c

| | | for FIG. 2 | |
|---|---|---|---|
| Coefficient | Formula | M07 | M08 |
| C7 | $x^2 y$ | 6.7510679990e−07 | −7.7684263707e−09 |
| C9 | $y^3$ | −5.9605264564e−07 | 2.1186549975e−08 |
| C10 | $x^4$ | 4.1200148248e−10 | −1.3310403721e−11 |
| C12 | $x^2 y^2$ | 1.1715196527e−09 | −5.7800895944e−11 |
| C14 | $y^4$ | 2.4710611185e−09 | −1.5516852239e−11 |
| C16 | $x^4 y$ | 1.0445145338e−12 | −2.0718067078e−14 |
| C18 | $x^2 y^3$ | 3.3558525987e−12 | 3.6299639507e−15 |
| C20 | $y^5$ | −7.4601451659e−12 | 2.1620702858e−14 |
| C21 | $x^6$ | 5.0072064430e−16 | −2.4229167358e−17 |
| C23 | $x^4 y^2$ | 5.2767006042e−15 | −1.0548493781e−16 |
| C25 | $x^2 y^4$ | 8.5560393410e−16 | −1.1165691898e−16 |
| C27 | $y^6$ | 2.5775475069e−14 | −2.5526161155e−17 |
| C29 | $x^6 y$ | 3.7719755046e−18 | −2.2500133737e−20 |
| C31 | $x^4 y^3$ | 1.0758424722e−17 | −2.3604770801e−20 |
| C33 | $x^2 y^5$ | 2.3536379321e−17 | 2.3845503163e−20 |
| C35 | $y^7$ | −1.2253201631e−16 | 2.6664564603e−20 |
| C36 | $x^8$ | 1.8038046924e−21 | −3.5210099395e−23 |
| C38 | $x^6 y^2$ | 1.7289657924e−20 | −1.4918697711e−22 |
| C40 | $x^4 y^4$ | 5.2859525033e−20 | −2.6237911344e−22 |
| C42 | $x^2 y^6$ | −8.6172650997e−20 | −1.7442521586e−22 |
| C44 | $y^8$ | 4.4773496698e−19 | −3.3239236285e−23 |
| C46 | $x^8 y$ | 1.0430729603e−23 | −1.6816135464e−26 |
| C48 | $x^6 y^3$ | 6.1382946192e−23 | −6.1657425487e−26 |
| C50 | $x^4 y^5$ | −1.0182272562e−22 | −6.3859678615e−27 |
| C52 | $x^2 y^7$ | 7.1501654697e−22 | 5.3937593439e−26 |
| C54 | $y^9$ | 1.4931885109e−21 | 2.2296280167e−26 |
| C55 | $x^{10}$ | 3.4404619172e−27 | −2.5536857170e−29 |
| C57 | $x^8 y^2$ | 6.4380020942e−26 | −3.0366300957e−28 |
| C59 | $x^6 y^4$ | 2.5302993381e−25 | −8.0003335407e−28 |
| C61 | $x^4 y^6$ | 1.8618106087e−24 | −9.3817108107e−28 |
| C63 | $x^2 y^8$ | 7.3440727184e−24 | −4.6308049926e−28 |
| C65 | $y^{10}$ | 7.4647804866e−24 | −9.8178685527e−29 |
| C67 | $x^{10} y$ | 1.1440401751e−30 | −1.3864315114e−32 |
| C69 | $x^8 y^3$ | 3.3217918985e−28 | 2.3417171712e−32 |
| C71 | $x^6 y^5$ | 5.0384292903e−27 | −7.9386096984e−32 |
| C73 | $x^4 y^7$ | 1.8210552798e−26 | −6.8860896221e−32 |
| C75 | $x^2 y^9$ | −2.6956396141e−26 | 2.0751570670e−32 |
| C77 | $y^{11}$ | −3.5269592340e−25 | 5.4840794182e−32 |
| C78 | $x^{12}$ | −1.1234632058e−32 | −1.3769950006e−35 |
| C80 | $x^{10} y^2$ | 4.7186915408e−31 | 4.2029120402e−34 |
| C82 | $x^8 y^4$ | 2.1285995883e−30 | 2.1957036679e−33 |
| C84 | $x^6 y^6$ | −1.6468197623e−29 | 4.5028855850e−33 |
| C86 | $x^4 y^8$ | −1.6241805572e−28 | 3.8876609446e−33 |
| C88 | $x^2 y^{10}$ | −1.0312773446e−27 | 1.2177064184e−33 |
| C90 | $y^{12}$ | 9.9848578534e−28 | 2.0141536991e−34 |
| C92 | $x^{12} y$ | 1.2130539368e−33 | −2.8165022925e−37 |
| C94 | $x^{10} y^3$ | 1.0868832417e−32 | −1.3463299808e−36 |
| C96 | $x^8 y^5$ | −4.8488251769e−32 | −1.3639608169e−36 |
| C98 | $x^6 y^7$ | −5.0885258398e−31 | 5.4967599013e−37 |
| C100 | $x^4 y^9$ | −1.5414116455e−30 | 1.7232300858e−36 |
| C102 | $x^2 y^{11}$ | 5.4469618398e−30 | 1.2942820721e−36 |
| C104 | $y^{13}$ | 1.6117823620e−29 | 1.9699596918e−37 |
| C105 | $x^{14}$ | 3.6424134489e−37 | −2.0147701926e−40 |
| C107 | $x^{12} y^2$ | 4.8125995924e−37 | −3.9820831972e−39 |
| C109 | $x^{10} y^4$ | −1.6734061278e−35 | −2.1401906247e−38 |
| C111 | $x^8 y^6$ | 2.7653631914e−34 | −5.3204956769e−38 |
| C113 | $x^6 y^8$ | 2.7717555838e−33 | −6.6483746748e−38 |

TABLE 3c-continued

| | | for FIG. 2 | |
|---|---|---|---|
| Coefficient | Formula | M07 | M08 |
| C115 | $x^4 y^{10}$ | 1.6209234047e−32 | −4.2702056479e−38 |
| C117 | $x^2 y^{12}$ | 5.4830736686e−32 | −1.1212638402e−38 |
| C119 | $y^{14}$ | −9.6951394448e−32 | −1.2358247201e−39 |
| C121 | $x^{14} y$ | −1.5196063181e−38 | 1.0591089247e−42 |
| C123 | $x^{12} y^3$ | −2.4346275366e−37 | 6.0081477285e−42 |
| C125 | $x^{10} y^5$ | −1.7784052936e−37 | 1.0106381940e−41 |
| C127 | $x^8 y^7$ | 7.9571519310e−36 | 2.3631473323e−42 |
| C129 | $x^6 y^9$ | 3.3932330746e−35 | −1.0791273202e−41 |
| C131 | $x^4 y^{11}$ | 5.6171604467e−35 | −1.2198174714e−41 |
| C133 | $x^2 y^{13}$ | −4.5020966892e−34 | −7.1232053298e−42 |
| C135 | $y^{15}$ | −3.0444101717e−34 | −1.2675299720e−42 |
| C136 | $x^{16}$ | −3.1397860935e−42 | 5.5289642085e−46 |
| C138 | $x^{14} y^2$ | −3.6764526616e−41 | 1.2408953942e−44 |
| C140 | $x^{12} y^4$ | 5.1682281559e−41 | 8.0360655159e−44 |
| C142 | $x^{10} y^6$ | −7.5724070624e−40 | 2.5002877427e−43 |
| C144 | $x^8 y^8$ | −3.5242758525e−38 | 4.1567843534e−43 |
| C146 | $x^6 y^{10}$ | −1.9290295406e−37 | 3.8776740206e−43 |
| C148 | $x^4 y^{12}$ | −8.9279321053e−37 | 1.9801753831e−43 |
| C150 | $x^2 y^{14}$ | −1.0610618019e−36 | 4.1515399107e−44 |
| C152 | $y^{16}$ | 4.2032564742e−36 | 3.3189488097e−45 |
| C154 | $x^{16} y$ | 1.3900490222e−43 | −2.6714733976e−48 |
| C156 | $x^{14} y^3$ | 3.1948332019e−42 | −1.9023703003e−47 |
| C158 | $x^{12} y^5$ | 1.5572932617e−41 | −4.6866351175e−47 |
| C160 | $x^{10} y^7$ | −3.5961276855e−41 | −4.3208550927e−47 |
| C162 | $x^8 y^9$ | −4.4994909187e−40 | 2.0571387485e−47 |
| C164 | $x^6 y^{11}$ | −1.1517175255e−39 | 6.8011061355e−47 |
| C166 | $x^4 y^{13}$ | −4.0441034977e−40 | 5.6874752660e−47 |
| C168 | $x^2 y^{15}$ | 1.8548402473e−38 | 2.8250025956e−47 |
| C170 | $y^{17}$ | −8.9835721083e−39 | 5.3246951685e−48 |
| C171 | $x^{18}$ | 2.3986122130e−47 | −1.4577504922e−51 |
| C173 | $x^{16} y^2$ | 8.1475450191e−46 | −3.0082090032e−50 |
| C175 | $x^{14} y^4$ | 7.3884777256e−45 | −2.1208177229e−49 |
| C177 | $x^{12} y^6$ | 2.7542991108e−44 | −7.6436443269e−49 |
| C179 | $x^{10} y^8$ | 1.8164049336e−43 | −1.5713795144e−48 |
| C181 | $x^8 y^{10}$ | 1.9780808155e−42 | −1.9352435230e−48 |
| C183 | $x^6 y^{12}$ | 6.6873956729e−42 | −1.4362747907e−48 |
| C185 | $x^4 y^{14}$ | 2.8702380925e−41 | −6.1025451080e−49 |
| C187 | $x^2 y^{16}$ | −3.1866212691e−41 | −1.1066868401e−49 |
| C189 | $y^{18}$ | −3.8275089169e−41 | −7.5049710077e−51 |
| C191 | $x^{18} y$ | −6.6231305715e−49 | 3.5010571058e−54 |
| C193 | $x^{16} y^3$ | −1.9531652351e−47 | 3.0239376636e−53 |
| C195 | $x^{14} y^5$ | −1.5596286432e−46 | 9.6000865790e−53 |
| C197 | $x^{12} y^7$ | −2.7612826568e−46 | 1.4288997592e−52 |
| C199 | $x^{10} y^9$ | 2.2685749027e−45 | 4.3837168676e−53 |
| C201 | $x^8 y^{11}$ | 1.1060475171e−44 | −1.3861103840e−52 |
| C203 | $x^6 y^{13}$ | 2.2481184782e−44 | −1.9505856121e−52 |
| C205 | $x^4 y^{15}$ | −5.5736348440e−44 | −1.2876676644e−52 |
| C207 | $x^2 y^{17}$ | −2.3355064681e−43 | −5.4584052762e−53 |
| C209 | $y^{19}$ | 2.4999420572e−43 | −9.9807676723e−54 |
| C210 | $x^{20}$ | −1.0353720807e−52 | 1.9354967630e−57 |
| C212 | $x^{18} y^2$ | −5.6366301161e−51 | 3.9549546692e−56 |
| C214 | $x^{16} y^4$ | −8.1535236564e−50 | 3.0235091280e−55 |
| C216 | $x^{14} y^6$ | −4.6753079245e−49 | 1.2341447797e−54 |
| C218 | $x^{12} y^8$ | −1.4492509936e−48 | 2.9999942233e−54 |
| C220 | $x^{10} y^{10}$ | −6.7059393099e−48 | 4.6089255426e−54 |
| C222 | $x^8 y^{12}$ | −4.9436079305e−47 | 4.5137492751e−54 |
| C224 | $x^6 y^{14}$ | −1.2111220000e−46 | 2.7875737733e−54 |
| C226 | $x^4 y^{16}$ | −3.4078403898e−46 | 1.0119870942e−54 |
| C228 | $x^2 y^{18}$ | 1.1009407304e−45 | 1.6135052322e−55 |
| C230 | $y^{20}$ | −5.8411328388e−46 | 9.4380058569e−57 |
| C232 | $x^{20} y$ | 1.5055586184e−54 | −2.2462277192e−60 |
| C234 | $x^{18} y^3$ | 5.2410832904e−53 | −2.2707851790e−59 |
| C236 | $x^{16} y^5$ | 5.5851300772e−52 | −8.9192926369e−59 |
| C238 | $x^{14} y^7$ | 2.2374347879e−51 | −1.8389741887e−58 |
| C240 | $x^{12} y^9$ | 7.1591347845e−52 | −1.7044880131e−58 |
| C242 | $x^{10} y^{11}$ | −3.9294714180e−50 | 2.9056131275e−59 |
| C244 | $x^8 y^{13}$ | −8.1423894706e−50 | 2.2670392369e−58 |
| C246 | $x^6 y^{15}$ | −2.3729390056e−49 | 2.3590501620e−58 |
| C248 | $x^4 y^{17}$ | 1.3995947959e−48 | 1.3535441041e−58 |
| C250 | $x^2 y^{19}$ | −1.5620953183e−48 | 4.9658777142e−59 |
| C252 | $y^{21}$ | 7.0891533326e−49 | 8.3944169943e−60 |
| C253 | $x^{22}$ | 2.2336861363e−58 | −1.3577467667e−63 |
| C255 | $x^{20} y^2$ | 1.6766401731e−56 | −2.6517938952e−62 |
| C257 | $x^{18} y^4$ | 3.1385425719e−55 | −2.1019901027e−61 |
| C259 | $x^{16} y^6$ | 2.3730923666e−54 | −9.3254487977e−61 |
| C261 | $x^{14} y^8$ | 9.8135101820e−54 | −2.5667161093e−60 |

TABLE 3c-continued

| | | for FIG. 2 | |
| --- | --- | --- | --- |
| Coefficient | Formula | M07 | M08 |
| C263 | $x^{12} y^{10}$ | 1.7231582939e−53 | −4.6597300134e−60 |
| C265 | $x^{10} y^{12}$ | 1.1075385549e−52 | −5.6882278778e−60 |
| C267 | $x^8 y^{14}$ | 3.7804650231e−52 | −4.6360430455e−60 |
| C269 | $x^6 y^{16}$ | 1.1279204591e−51 | −2.4726486765e−60 |
| C271 | $x^4 y^{18}$ | −1.3479781662e−51 | −7.9647092611e−61 |
| C273 | $x^2 y^{20}$ | 4.9488344281e−52 | −1.2052423513e−61 |
| C275 | $y^{22}$ | −4.2347282476e−52 | −7.0219628579e−63 |

TABLE 4

| | | for FIG. 2 Coordinates of the stop edge | |
| --- | --- | --- | --- |
| $x_i$ [mm] | $y_i$ [mm] | $x_{i+N/2}$ [mm] | $y_{i+N/2}$ [mm] |
| −400.659323 | −53.864111 | 401.077124 | −67.204113 |
| −400.020726 | −47.147576 | 400.855494 | −73.819131 |
| −399.097003 | −40.405795 | 400.347077 | −80.392036 |
| −397.889740 | −33.643190 | 399.552636 | −86.918876 |
| −396.400971 | −26.864237 | 398.473403 | −93.395828 |
| −394.633175 | −20.073447 | 397.111064 | −99.819197 |
| −392.589253 | −13.275354 | 395.467753 | −106.185427 |
| −390.272521 | −6.474497 | 393.546032 | −112.491097 |
| −387.686685 | 0.324586 | 391.348878 | −118.732928 |
| −384.835826 | 7.117377 | 388.879660 | −124.907779 |
| −381.724381 | 13.899380 | 386.142117 | −131.012647 |
| −378.357118 | 20.666132 | 383.140338 | −137.044665 |
| −374.739116 | 27.413207 | 379.878732 | −143.001100 |
| −370.875745 | 34.136218 | 376.362006 | −148.879345 |
| −366.772636 | 40.830822 | 372.595134 | −154.676917 |
| −362.435665 | 47.492719 | 368.583332 | −160.391451 |
| −357.870923 | 54.117650 | 364.332027 | −166.020693 |
| −353.084692 | 60.701401 | 359.846834 | −171.562494 |
| −348.083427 | 67.239799 | 355.133522 | −177.014801 |
| −342.873723 | 73.728710 | 350.197994 | −182.375652 |
| −337.462298 | 80.164036 | 345.046255 | −187.643166 |
| −331.855962 | 86.541711 | 339.684392 | −192.815537 |
| −326.061598 | 92.857696 | 334.118551 | −197.891028 |
| −320.086139 | 99.107972 | 328.354912 | −202.867963 |
| −313.936538 | 105.288533 | 322.399672 | −207.744722 |
| −307.619750 | 111.395377 | 316.259031 | −212.519734 |
| −301.142709 | 117.424499 | 309.939169 | −217.191475 |
| −294.512306 | 123.371878 | 303.446237 | −221.758461 |
| −287.735365 | 129.233469 | 296.786345 | −226.219248 |
| −280.818629 | 135.005193 | 289.965551 | −230.572424 |
| −273.768736 | 140.682927 | 282.989848 | −234.816611 |
| −266.592206 | 146.262492 | 275.865164 | −238.950459 |
| −259.295424 | 151.739651 | 268.597347 | −242.972649 |
| −251.884623 | 157.110096 | 261.192165 | −246.881888 |
| −244.365878 | 162.369444 | 253.655301 | −250.676907 |
| −236.745087 | 167.513236 | 245.992345 | −254.356465 |
| −229.027968 | 172.536938 | 238.208795 | −257.919345 |
| −221.220046 | 177.435936 | 230.310053 | −261.364353 |
| −213.326649 | 182.205550 | 222.301423 | −264.690323 |
| −205.352905 | 186.841040 | 214.188110 | −267.896111 |
| −197.303733 | 191.337614 | 205.975220 | −270.980600 |
| −189.183848 | 195.690444 | 197.667759 | −273.942700 |
| −180.997757 | 199.894686 | 189.270634 | −276.781349 |
| −172.749762 | 203.945488 | 180.788652 | −279.495514 |
| −164.443964 | 207.838015 | 172.226528 | −282.084191 |
| −156.084273 | 211.567461 | 163.588879 | −284.546410 |
| −147.674408 | 215.129069 | 154.880232 | −286.881236 |
| −139.217914 | 218.518141 | 146.105027 | −289.087767 |
| −130.718173 | 221.730059 | 137.267617 | −291.165143 |
| −122.178413 | 224.760293 | 128.372278 | −293.112542 |
| −113.601729 | 227.604421 | 119.423207 | −294.929182 |
| −104.991095 | 230.258144 | 110.424533 | −296.614329 |
| −96.349379 | 232.717300 | 101.380316 | −298.167293 |
| −87.679364 | 234.977891 | 92.294559 | −299.587430 |
| −78.983763 | 237.036106 | 83.171207 | −300.874150 |
| −70.265227 | 238.888348 | 74.014156 | −302.026909 |
| −61.526369 | 240.531266 | 64.827259 | −303.045219 |
| −52.769767 | 241.961788 | 55.614329 | −303.928646 |

TABLE 4-continued for FIG. 2
Coordinates of the stop edge

| $x_i$ [mm] | $y_i$ [mm] | $x_{i+N/2}$ [mm] | $y_{i+N/2}$ [mm] |
|---|---|---|---|
| −43.997978 | 243.177159 | 46.379144 | −304.676811 |
| −35.213545 | 244.174974 | 37.125458 | −305.289389 |
| −26.419003 | 244.953213 | 27.856997 | −305.766115 |
| −17.616879 | 245.510269 | 18.577472 | −306.106783 |
| −8.809703 | 245.844975 | 9.290577 | −306.311243 |
| 0.000000 | 245.956623 | 0.000000 | −306.379407 |
| 8.809703 | 245.844975 | −9.290577 | −306.311243 |
| 17.616879 | 245.510269 | −18.577472 | −306.106783 |
| 26.419003 | 244.953213 | −27.856997 | −305.766115 |
| 35.213545 | 244.174974 | −37.125458 | −305.289389 |
| 43.997978 | 243.177159 | −46.379144 | −304.676811 |
| 52.769767 | 241.961788 | −55.614329 | −303.928646 |
| 61.526369 | 240.531266 | −64.827259 | −303.045219 |
| 70.265227 | 238.888348 | −74.014156 | −302.026909 |
| 78.983763 | 237.036106 | −83.171207 | −300.874150 |
| 87.679364 | 234.977891 | −92.294559 | −299.587430 |
| 96.349379 | 232.717300 | −101.380316 | −298.167293 |
| 104.991095 | 230.258144 | −110.424533 | −296.614329 |
| 113.601729 | 227.604421 | −119.423207 | −294.929182 |
| 122.178413 | 224.760293 | −128.372278 | −293.112542 |
| 130.718173 | 221.730059 | −137.267617 | −291.165143 |
| 139.217914 | 218.518141 | −146.105027 | −289.087767 |
| 147.674408 | 215.129069 | −154.880232 | −286.881236 |
| 156.084273 | 211.567461 | −163.588879 | −284.546410 |
| 164.443964 | 207.838015 | −172.226528 | −282.084191 |
| 172.749762 | 203.945488 | −180.788652 | −279.495514 |
| 180.997757 | 199.894686 | −189.270634 | −276.781349 |
| 189.183848 | 195.690444 | −197.667759 | −273.942700 |
| 197.303733 | 191.337614 | −205.975220 | −270.980600 |
| 205.352905 | 186.841040 | −214.188110 | −267.896111 |
| 213.326649 | 182.205550 | −222.301423 | −264.690323 |
| 221.220046 | 177.435936 | −230.310053 | −261.364353 |
| 229.027968 | 172.536938 | −238.208795 | −257.919345 |
| 236.745087 | 167.513236 | −245.992345 | −254.356465 |
| 244.365878 | 162.369444 | −253.655301 | −250.676907 |
| 251.884623 | 157.110096 | −261.192165 | −246.881888 |
| 259.295424 | 151.739651 | −268.597347 | −242.972649 |
| 266.592206 | 146.262492 | −275.865164 | −238.950459 |
| 273.768736 | 140.682927 | −282.989848 | −234.816611 |
| 280.818629 | 135.005193 | −289.965551 | −230.572424 |
| 287.735365 | 129.233469 | −296.786345 | −226.219248 |
| 294.512306 | 123.371878 | −303.446237 | −221.758461 |
| 301.142709 | 117.424499 | −309.939169 | −217.191475 |
| 307.619750 | 111.395377 | −316.259031 | −212.519734 |
| 313.936538 | 105.288533 | −322.399672 | −207.744722 |
| 320.086139 | 99.107972 | −328.354912 | −202.867963 |
| 326.061598 | 92.857696 | −334.118551 | −197.891028 |
| 331.855962 | 86.541711 | −339.684392 | −192.815537 |
| 337.462298 | 80.164036 | −345.046255 | −187.643166 |
| 342.873723 | 73.728710 | −350.197994 | −182.375652 |
| 348.083427 | 67.239799 | −355.133522 | −177.014801 |
| 353.084692 | 60.701401 | −359.846834 | −171.562494 |
| 357.870923 | 54.117650 | −364.332027 | −166.020693 |
| 362.435665 | 47.492719 | −368.583332 | −160.391451 |
| 366.772636 | 40.830822 | −372.595134 | −154.676917 |
| 370.875745 | 34.136218 | −376.362006 | −148.879345 |
| 374.739116 | 27.413207 | −379.878732 | −143.001100 |
| 378.357118 | 20.666132 | −383.140338 | −137.044665 |
| 381.724381 | 13.899380 | −386.142117 | −131.012647 |
| 384.835826 | 7.117377 | −388.879660 | −124.907779 |
| 387.686685 | 0.324586 | −391.348878 | −118.732928 |
| 390.272521 | −6.474497 | −393.546032 | −112.491097 |
| 392.589253 | −13.275354 | −395.467753 | −106.185427 |
| 394.633175 | −20.073447 | −397.111064 | −99.819197 |
| 396.400971 | −26.864237 | −398.473403 | −93.395828 |
| 397.889740 | −33.643190 | −399.552636 | −86.918876 |
| 399.097003 | −40.405795 | −400.347077 | −80.392036 |
| 400.020726 | −47.147576 | −400.855494 | −73.819131 |
| 400.659323 | −53.864111 | −401.077124 | −67.204113 |
| 401.011674 | −60.551047 | −401.011674 | −60.551047 |

The mirrors M1, M3, M4, M5 and M8 have negative values for the radius, i.e. are, in principle, concave mirrors. The mirrors M2, M6 and M7 have positive values for the radius, i.e. they are, in principle, convex mirrors. The mirrors M1 to M8 of the projection optical unit according to FIG. 2 have no $R_x$, $R_y$ radius values with in each case different signs. None of the mirrors M1 to M8 therefore has a saddle shape as a matter of principle.

A boundary of a stop surface of the stop (cf, also, Table 4 for FIG. 2) emerges from intersection points on the stop surface of all rays of the illumination light 3 which, on the image side, propagate at the field centre point in the direction of the stop surface with a complete image-side telecentric aperture. When the stop is embodied as an aperture stop, the boundary is an inner boundary.

The stop AS can lie in a plane or else have a three-dimensional embodiment. The extent of the stop AS can be smaller in the scan direction (y) than in the cross-scan direction (x).

Further data of the projection optical unit 7 arise from Table 5 below:

TABLE 5

|  | for FIG. 2 |  |
| --- | --- | --- |
| NA | Numerical aperture | 0.75 |
| \|βx\| | Magnification scale in the cross-scan direction | 4.0 |
| \|βy\| | Magnification scale in the scan direction | 8.0 |
| RMS | Scanned wavefront deviation | 9.7 mλ |
| N | Number of mirrors | 8 |

The projection optical unit 7 has an object/image offset a between a separation plane 31a and a centre of the image field 8. A centre of the object field 4 is located in the separation plane 31a. The separation plane 31a runs parallel to the xz-plane. The separation plane 31a is perpendicular to the yz-meridional plane of the imaging optical unit 7. The object/image offset a is 1650 mm in the case of the projection optical unit 7.

The used reflection surface of the mirror M4 is the nearest neighbour to the object plane 5. The used reflection surface of the mirror M4 therefore defines a working distance b between this used reflection surface of the mirror M4 and the object plane 5. A reflection portion of the mirror M4 which is the nearest neighbour to the object plane 5 is considered within the scope of the definition of the working distance b. The working distance b is 275 mm in the case of the projection optical unit 7.

A meridional transverse dimension c is defined between the separation plane 31a and a reflection portion of one of the mirrors, once again of the mirror M4 in this case, which is furthest away from the separation plane. The meridional transverse dimension c is 2154 mm in the case of the projection optical unit 7.

A dimensional ratio a/c is 0.76 in the case of the projection optical unit 7. A dimensional ratio b/c is 0.128 in the case of the projection optical unit 7.

The projection optical unit 7 is designed for a wavelength of the illumination light 3 of 13.5 nm.

The mean wavefront aberration RMS (scanned wavefront deviation) is a measure for the imaging quality of the projection optical unit 7.

The projection optical unit 7 is at least approximately telecentric on the image side.

Figure 3:
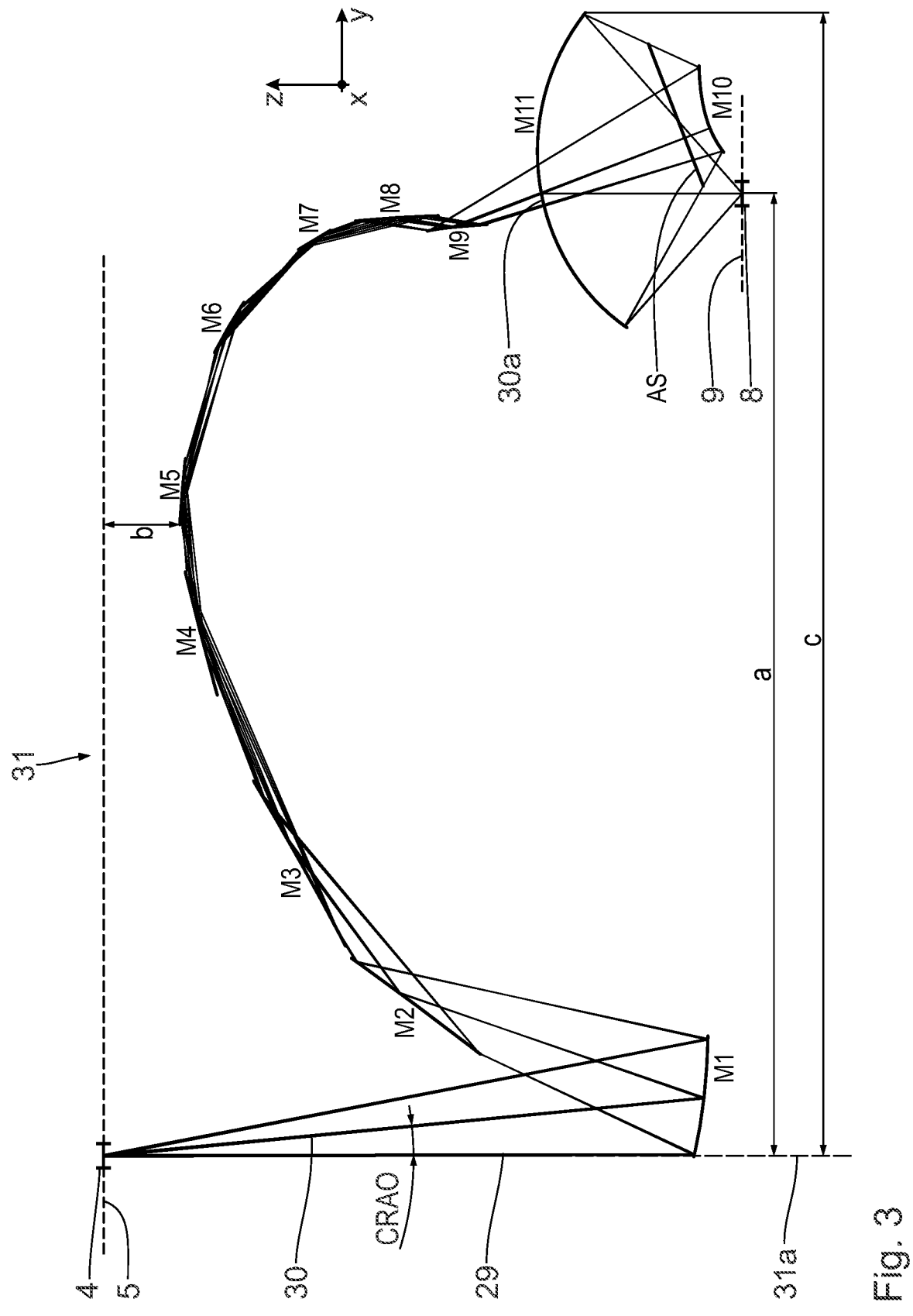
FIG. 3 shows, in an illustration similar to FIG. 2, a further embodiment of an imaging optical unit which is usable as a projection optical unit in the projection exposure apparatus in FIG. 1.

FIG. 3 shows a further embodiment of a projection optical unit or imaging optical unit 31, which can be used in the projection exposure apparatus 1 instead of the projection optical unit 7. Components and functions corresponding to those which have already been explained above with reference to FIGS. 1 and 2 have the same reference signs and will not be discussed in detail again.

The projection optical unit 31 has an image-side numerical aperture of 0.75.

The projection optical unit 31 has a total of eleven mirrors M1 to M11. The mirrors M1, M10 and M11 are embodied as mirrors for normal incidence. The mirrors M2 to M9 are embodied as mirrors for grazing incidence of the illumination light 3. The projection optical unit 31 has exactly eight mirrors for grazing incidence.

The mirrors M2 to M8, that is to say seven of the eight GI mirrors of the projection optical unit 31, reflect the imaging light 3 in such a way that the angles of reflection of the individual rays 29 at the respective mirrors M2 to M8 add up, i.e. lead to an amplification of the deflection effect thereof. The subsequent GI mirror M9 is a so-called counter mirror and reflects the imaging light 3 such that this yields a deflection effect directed against the deflection effect of the mirrors M2 to M8, that is to say this has a subtractive effect on the deflection effect of the GI mirrors M2 to M8. In accordance with the rules for the surrounding effects of the mirrors, which are specified in the context of the explanations regarding the projection optical unit in DE 10 2019 219 209 A1, the projection optical unit 31 has the following sequence of deflecting effects for the mirrors M1 to M11: RLLLLLLLROL: The projection optical unit 31 is approximately telecentric on the object side. If the imaging beam path is only taken into account in relation to the individual rays that pass through the object field 4, the entrance pupil is located 4014.30 mm downstream of the object field 5 in the xz-plane and 5750.64 mm downstream of the object field 4 in the yz-plane.

The projection optical unit 31 has a pupil plane in the beam path between the mirrors M1 and M2. An intermediate image plane is located in the region of a reflection on the mirror M5. A further pupil plane is located between the mirrors M5 and M6 in the imaging light beam path. A further intermediate image plane is located between the mirrors M6 and M7. The number of intermediate image planes differs from the number of intermediate images in the meridional plane according to FIG. 3 from the number of intermediate images in a plane perpendicular thereto. Such projection optical units with different numbers of intermediate images in mutually perpendicular planes are known from WO 2016/166080 A1 and DE 10 2015 226 531 A1 as a matter of principle.

The optical design data for the projection optical unit 31 emerge from following Tables 1 to 5, which, in turn, correspond in terms of the basic structure to Tables 1 to 5 relating to the embodiment according to FIG. 2.

TABLE 1

| | for FIG. 3 Radii of the surfaces | | | |
| --- | --- | --- | --- | --- |
| | Radius$_x$ [mm] | Power$_x$ [1/mm] | Radius$_y$ [mm] | Power$_y$ [1/mm] |
| M01 | −5029.13719149 | 0.00038797 | −2041.19092644 | 0.00095589 |
| M02 | −27726.18088887 | 0.00001519 | 8806.64410475 | −0.00004783 |
| M03 | −7556.63410985 | 0.00004602 | 11889.31888391 | −0.00002925 |
| M04 | −4613.40209240 | 0.00004549 | −13969.68056904 | 0.00001502 |
| M05 | −1484.95099271 | 0.00028553 | −4659.68392717 | 0.00009099 |
| M06 | −1013.23301051 | 0.00055220 | −1851.21517662 | 0.00030224 |
| M07 | −2311.26230546 | 0.00015940 | −6624.51684518 | 0.00005561 |
| M08 | 5271.95258536 | −0.00009301 | −4363.23285760 | 0.00011238 |
| M09 | −4641.10272093 | 0.00014769 | 2064.14241825 | −0.00033206 |
| M10 | 12237.81918069 | −0.00014301 | 387.34284857 | −0.00451843 |
| M11 | −944.21286884 | 0.00207223 | −782.41102810 | 0.00250077 |

TABLE 2

| | for FIG. 3 Decentring (location, angle) the surfaces | | |
| --- | --- | --- | --- |
| | $D_x$ [mm] | $D_y$ [mm] | $D_z$ [mm] |
| Reticle | 0.000000000 | 0.000000000 | 0.000000000 |
| M01 | 0.000000000 | 208.167034845 | 2161.897315865 |
| M02 | 0.000000000 | 586.474040464 | 1067.521292230 |
| M03 | 0.000000000 | 1137.007761372 | 664.081569966 |
| M04 | 0.000000000 | 1899.293204386 | 345.745645359 |
| M05 | 0.000000000 | 2431.941388346 | 286.993274957 |
| M06 | 0.000000000 | 2984.723951303 | 449.275081298 |
| M07 | 0.000000000 | 3296.138682846 | 751.383932581 |
| M08 | 0.000000000 | 3380.101736953 | 1042.029180798 |
| M09 | 0.000000000 | 3346.308156022 | 1257.846377059 |
| M10 | 0.000000000 | 3703.559415463 | 2183.653612397 |
| Stop | 0.000000000 | 3668.591404244 | 2093.043669197 |
| M11 | −0.000000000 | 3468.490281216 | 1574.536875135 |
| Wafer | 0.000000000 | 3468.489856034 | 2300.002089582 |

TABLE 2-continued

| | for FIG. 3 Decentring (location, angle) the surfaces | | |
| --- | --- | --- | --- |
| | $D_x$ [mm] | $D_y$ [mm] | $D_z$ [mm] |
| | $\alpha_x$ [°] | $\alpha_y$ [°] | $\alpha_z$ [°] |
| Reticle | 0.000000000 | 0.000000000 | 0.000000000 |
| M01 | 6.784694572 | 0.000000000 | 0.000000000 |
| M02 | −53.582577637 | 180.000000000 | 0.000000000 |
| M03 | 150.549843408 | 0.000000000 | 0.000000000 |
| M04 | −14.480092757 | 180.000000000 | 0.000000000 |
| M05 | 185.033188037 | 0.000000000 | 0.000000000 |
| M06 | 30.245900660 | 180.000000000 | 0.000000000 |
| M07 | 239.008897816 | 0.000000000 | 0.000000000 |
| M08 | 86.393070938 | 180.000000000 | 0.000000000 |
| M09 | 83.899354742 | 0.000000000 | 0.000000000 |
| M10 | −21.101573082 | 0.000000000 | 180.000000000 |
| Stop | 158.897499094 | −0.000000000 | −0.000000000 |
| M11 | 169.448766337 | −0.000000000 | 0.000000000 |
| Wafer | 0.000033580 | 0.000000000 | 180.000000000 |

TABLE 3a

| | for FIG. 3 Free-form coefficients of the surfaces | | | |
| --- | --- | --- | --- | --- |
| Coefficient | Formula | M01 | M02 | M03 |
| C7 | $x^2 y$ | −3.4202758877e−09 | −8.1600037120e−09 | 5.4784066641e−08 |
| C9 | $y^3$ | −5.1579184037e−09 | 2.1490169585e−08 | −1.5630842115e−09 |
| C10 | $x^4$ | −4.1758180942e−12 | 1.2422725986e−10 | 4.6214862684e−11 |
| C12 | $x^2 y^2$ | 8.9525383746e−11 | −1.4680359565e−10 | 8.9494220059e−12 |
| C14 | $y^4$ | −1.9101171293e−11 | −6.1013326570e−11 | −7.5850147156e−12 |
| C16 | $x^4 y$ | −7.6462012646e−14 | −7.6908929058e−14 | −8.1912635689e−14 |
| C18 | $x^2 y^3$ | −6.5595088710e−14 | −2.0612905257e−13 | −7.1202800735e−14 |
| C20 | $y5$ | 1.2668389322e−14 | 2.2496666963e−14 | −2.1530045613e−14 |
| C21 | $y^6$ | 1.2260375804e−17 | −3.7706929577e−17 | −1.7860995077e−16 |
| C23 | $x^4 y^2$ | −4.1462206300e−17 | −2.2047103244e−16 | −5.3142812534e−18 |
| C25 | $x^2 y^4$ | −7.0178347129e−17 | 3.0190842210e−16 | −1.7452167445e−17 |
| C27 | $y^6$ | 2.0724751930e−16 | −3.5162036726e−16 | 6.4973339128e−17 |
| C29 | $x^6 y$ | 7.8478607545e−21 | −3.1708007154e−19 | −9.4569358091e−20 |
| C31 | $x^4 y^3$ | 1.3490030999e−19 | −2.2975637164e−19 | 1.2181039714e−19 |
| C33 | $x^2 y^5$ | −5.0152079339e−19 | −5.4350876110e−19 | 2.8563131654e−19 |
| C35 | $y^7$ | −3.8866394119e−20 | −1.4335882567e−18 | −1.1086359243e−19 |
| C36 | $x^8$ | −2.3339394362e−23 | 3.9460690291e−22 | 2.9888564272e−22 |
| C38 | $x^6 y^2$ | −4.6819160973e−22 | −1.1206066225e−21 | −9.7865526917e−23 |
| C40 | $x^4 y^4$ | 1.1130713726e−21 | 1.2800571912e−21 | 5.2638737050e−22 |
| C42 | $x^2 y^6$ | 3.2076089447e−22 | 2.8639063623e−22 | −2.2596620483e−22 |
| C44 | $y^8$ | −1.0798131013e−20 | −3.0974451336e−21 | 1.9329485313e−22 |
| C46 | $x^8 y$ | −6.9989769761e−26 | 2.6157691458e−25 | −4.5285068583e−26 |
| C48 | $x^6 y^3$ | −3.3827276208e−24 | 1.7863426636e−23 | −1.0020151492e−25 |
| C50 | $x^4 y^5$ | −9.4812740396e−24 | 3.7955502533e−23 | −2.9298995798e−24 |
| C52 | $x^2 y^7$ | −2.7828827712e−23 | 1.2071534933e−23 | 4.1481525917e−25 |
| C54 | $y^9$ | −6.8502586063e−23 | −1.6956263975e−23 | 3.3338978089e−25 |
| C55 | $x^{10}$ | 6.6696912458e−28 | −2.6405295227e−28 | 2.7329539874e−28 |
| C57 | $x^8 y^2$ | 1.0556854319e−26 | 4.3604788107e−26 | −5.0740682280e−27 |
| C59 | $x^6 y^4$ | 2.1155006429e−26 | 9.5793848687e−27 | −6.6690755906e−27 |
| C61 | $x^4 y^6$ | 2.0187788389e−26 | −9.8410632955e−26 | −2.8311274084e−27 |
| C63 | $x^2 y^8$ | 3.0429078041e−25 | −6.3994145022e−26 | −5.2202669243e−27 |

TABLE 3a-continued for FIG. 3
Free-form coefficients of the surfaces

| Coeffi-cient | Formula | M01 | M02 | M03 |
|---|---|---|---|---|
| C65 | $y^{10}$ | 9.6372881505e−25 | −2.7422225856e−26 | −1.4694335966e−28 |
| C67 | $x^{10}$ $y$ | 5.7298330391e−30 | 3.8383874583e−30 | −6.7470749425e−30 |
| C69 | $x^8$ $y^3$ | 7.8002410402e−29 | −3.3050157101e−28 | 9.9965761479e−31 |
| C71 | $x^6$ $y^5$ | 3.0940331786e−28 | −1.2448438857e−27 | 4.0730523721e−29 |
| C73 | $x^4$ $y^7$ | 9.5849050883e−28 | −1.5283972886e−27 | 3.5766281424e−29 |
| C75 | $x^2$ $y^9$ | 2.5829707531e−27 | −1.5562757806e−28 | −1.4839218380e−29 |
| C77 | $y^{11}$ | 4.2694397257e−27 | 1.2836577395e−28 | −8.6704298814e−30 |
| C78 | $x^{12}$ | −1.0815329562e−32 | 6.2375129788e−33 | −1.5532155562e−32 |
| C80 | $x^{10}$ $y^2$ | −1.8038497824e−31 | −6.8732193665e−31 | 6.9039084772e−32 |
| C82 | $x^8$ $y^4$ | −6.8022364927e−31 | −9.2726253758e−31 | 8.5642898328e−32 |
| C84 | $x^6$ $y^6$ | −7.8249269991e−31 | 1.7400864771e−30 | 9.4364791826e−32 |
| C86 | $x^4$ $y^8$ | −4.1186609772e−30 | 1.8001202540e−30 | 9.8409615071e−32 |
| C88 | $x^2$ $y^{10}$ | −2.7257517404e−29 | 9.2486125841e−31 | 1.0786036596e−31 |
| C90 | $y^{12}$ | −5.1669319257e−29 | 3.8596938474e−31 | −2.2018919852e−32 |
| C92 | $x^{12}$ | −9.5983493172e−35 | −2.1755264785e−34 | 9.9526007449e−35 |
| C94 | $x^{10}$ $y^3$ | −1.2917940667e−33 | 3.6182279937e−33 | 7.1354156561e−35 |
| C96 | $x^8$ $y^5$ | −6.1118822034e−33 | 2.1159798424e−32 | −4.4506711806e−34 |
| C98 | $x^6$ $y^7$ | −1.9673212417e−32 | 4.4692492346e−32 | −9.4608090853e−34 |
| C100 | $x^4$ $y^9$ | −5.1891177511e−32 | 3.0421749148e−32 | −3.0711170516e−34 |
| C102 | $x^2$ $y^{11}$ | −1.1466469103e−31 | −9.9633641271e−34 | 1.3166576085e−34 |
| C104 | $y^{13}$ | −1.5994476367e−31 | 1.0277888248e−33 | 1.3551050694e−34 |
| C105 | $x^{14}$ | 1.0112202758e−37 | −1.8527612914e−37 | 5.3021648224e−38 |
| C107 | $x^{12}$ $y^2$ | 1.8787266933e−36 | 5.5463175543e−36 | −3.8144935781e−37 |
| C109 | $x^{10}$ $y^4$ | 9.8564738206e−36 | 1.6775742718e−35 | −6.2453338969e−37 |
| C111 | $x^8$ $y^6$ | 1.7387768869e−35 | 1.2974801606e−36 | −1.2224300883e−36 |
| C113 | $x^6$ $y^8$ | 2.2681834289e−35 | −1.9550260786e−35 | −1.7363713191e−36 |
| C115 | $x^4$ $y^{10}$ | 2.9232046658e−34 | 1.3780032690e−35 | −1.7319269098e−36 |
| C117 | $x^2$ $y^{12}$ | 1.2535038132e−33 | −1.0820146117e−35 | −9.4133121050e−37 |
| C119 | $y^{14}$ | 1.7090202975e−33 | 4.8809008248e−36 | 3.5120584817e−37 |
| C121 | $x^{14}$ $y$ | 8.6607058835e−40 | 2.4631327352e−39 | −7.6131713896e−40 |
| C123 | $x^{12}$ $y^3$ | 1.3690225517e−38 | −2.2045573691e−38 | −9.1041031300e−40 |
| C125 | $x^{10}$ $y^5$ | 7.9232753449e−38 | −1.8619928426e−37 | 2.7674106762e−39 |
| C127 | $x^8$ $y^7$ | 2.6468607327e−37 | −5.9742954156e−37 | 9.4839191489e−39 |
| C129 | $x^6$ $y^9$ | 7.3576520674e−37 | −7.4089726699e−37 | 8.7492367472e−39 |
| C131 | $x^4$ $y^{11}$ | 1.5469045233e−36 | −2.4113906098e−37 | 1.3997827257e−39 |
| C133 | $x^2$ $y^{13}$ | 2.8746396170e−36 | 5.9495633408e−38 | −5.8277668773e−40 |
| C135 | $y^{15}$ | 3.6922119781e−36 | −4.0498264808e−40 | −1.6251636506e−39 |
| C136 | $x^{16}$ | −5.5486018344e−43 | 1.7656066281e−42 | −1.3428781540e−43 |
| C138 | $x^{14}$ $y^2$ | −1.2161472088e−41 | −2.4742736927e−41 | 6.3530910992e−43 |
| C140 | $x^{12}$ $y^4$ | −7.9117744888e−41 | −1.3645594080e−40 | 2.0656914423e−42 |
| C142 | $x^{10}$ $y^6$ | −1.9220472871e−40 | −2.7799880496e−40 | 8.8423178242e−42 |
| C144 | $x^8$ $y^8$ | −1.1779242046e−41 | −3.0306580962e−40 | 1.8019533718e−41 |

TABLE 3a-continued for FIG. 3
Free-form coefficients of the surfaces

| Coeffi-cient | Formula | M01 | M02 | M03 |
|---|---|---|---|---|
| C146 | $x^6 y^{10}$ | −9.0866868569e−40 | −5.0812759188e−40 | 1.9291665800e−41 |
| C148 | $x^4 y^{12}$ | −1.0589597504e−38 | −4.4330942359e−40 | 1.4669895704e−41 |
| C150 | $x^2 y^{14}$ | −3.2620542390e−38 | 2.9034466223e−40 | 3.4773500168e−42 |
| C152 | $y^{16}$ | −3.4845417046e−38 | −3.0516896497e−41 | −1.2632621610e−42 |
| C154 | $x^{16} y$ | −4.5336234429e−45 | −1.1010178086e−44 | 2.7966309948e−45 |
| C156 | $x^{14} y^3$ | −8.5714177986e−44 | 6.9195881040e−44 | 4.3617177756e−45 |
| C158 | $x^{12} y^5$ | −6.2123659373e−43 | 8.0533327253e−43 | −8.6267187632e−45 |
| C160 | $x^{10} y^7$ | −2.3563367843e−42 | 3.6191538565e−42 | −4.4829374364e−44 |
| C162 | $x^8 y^9$ | −6.4739515198e−42 | 6.9947907903e−42 | −6.1600312437e−44 |
| C164 | $x^6 y^{11}$ | −1.4524006496e−41 | 4.8026591296e−42 | −3.8331079573e−44 |
| C166 | $x^4 y^{13}$ | −2.4735749000e−41 | 6.8148847652e−44 | −3.9563424202e−45 |
| C168 | $x^2 y^{15}$ | −3.9202438764e−41 | 2.2919776746e−44 | 3.7842451927e−45 |
| C170 | $y^{17}$ | −5.1112095432e−41 | 6.6119189328e−45 | 8.7556239722e−45 |
| C171 | $x^{18}$ | 1.7669849485e−48 | −7.2146170920e−48 | 5.1798517293e−49 |
| C173 | $x^{16} y^2$ | 4.8297044297e−47 | 5.6890921630e−47 | 1.7875826058e−48 |
| C175 | $x^{14} y^4$ | 3.6511808040e−46 | 5.3293682901e−46 | −1.0904221176e−48 |
| C177 | $x^{12} y^6$ | 1.0286013254e−45 | 2.2175725023e−45 | −3.5370413683e−47 |
| C179 | $x^{10} y^8$ | −8.7120936294e−46 | 5.5970769928e−45 | −9.1856508583e−47 |
| C181 | $x^8 y^{10}$ | −7.6651593072e−45 | 8.1112830545e−45 | −1.3051093760e−46 |
| C183 | $x^6 y^{12}$ | 2.4821376776e−44 | 7.9703062027e−45 | −9.7163956148e−47 |
| C185 | $x^4 y^{14}$ | 1.9932411848e−43 | 1.3787666777e−45 | −5.7163004196e−47 |
| C187 | $x^2 y^{16}$ | 4.7170265650e−43 | −1.7135949133e−45 | −7.4449434738e−48 |
| C189 | $y^{18}$ | 4.1692610245e−43 | −1.8709479508e−47 | −1.1767681798e−48 |
| C191 | $x^{18} y$ | 1.2852059732e−50 | 1.7560896234e−50 | −3.9559581786e−51 |
| C193 | $x^{16} y^3$ | 2.8859754502e−49 | −8.7434968324e−50 | −7.5693511098e−51 |
| C195 | $x^{14} y^5$ | 2.5919190405e−48 | −1.3609856365e−48 | 9.8319371871e−51 |
| C197 | $x^{12} y^7$ | 1.2030540733e−47 | −8.0301641939e−48 | 8.3120587374e−50 |
| C199 | $x^{10} y^9$ | 3.4034259220e−47 | −2.2201643867e−47 | 1.4180259218e−49 |
| C201 | $x^8 y^{11}$ | 7.6238889168e−47 | −2.5937836818e−47 | 1.4759315303e−49 |
| C203 | $x^6 y^{13}$ | 1.2498776681e−46 | −6.6048202518e−49 | 5.8694529977e−50 |
| C205 | $x^4 y^{15}$ | 1.8726146173e−46 | 3.4967691792e−48 | 5.8439380908e−51 |
| C207 | $x^2 y^{17}$ | 2.2780198354e−46 | −3.4542661685e−48 | −1.4032340153e−50 |
| C209 | $y^{19}$ | 3.8268070940e−46 | −6.0527384080e−49 | −2.0496980344e−50 |
| C210 | $x^{20}$ | −2.9855603339e−54 | 1.0850672687e−53 | −9.6871922544e−55 |
| C212 | $x^{18} y^2$ | −1.0945118595e−52 | −5.1497169543e−53 | −5.9147787514e−54 |
| C214 | $x^{16} y^4$ | −9.2381864771e−52 | −8.1009277926e−52 | −6.2617513042e−54 |
| C216 | $x^{14} y^6$ | −2.4283073940e−51 | −5.2651139388e−51 | 5.8630217526e−53 |
| C218 | $x^{12} y^8$ | 7.9238933105e−51 | −2.0248989147e−50 | 1.8815802979e−52 |
| C220 | $x^{10} y^{10}$ | 7.8047594751e−50 | −4.1988819787e−50 | 3.2717085342e−52 |
| C222 | $x^8 y^{12}$ | 1.5303226803e−49 | −4.0289755825e−50 | 3.0713582657e−52 |

TABLE 3a-continued for FIG. 3
Free-form coefficients of the surfaces

| Coefficient | Formula | M01 | M02 | M03 |
|---|---|---|---|---|
| C224 | $x^6 y^{14}$ | −2.4775377926e−49 | −3.8115226043e−51 | 1.9326644766e−52 |
| C226 | $x^4 y^{16}$ | −1.7866765799e−48 | 3.3039287502e−51 | 8.3147949596e−53 |
| C228 | $x^2 y^{18}$ | −3.2563244015e−48 | −2.3082978925e−51 | 1.7438668546e−53 |
| C230 | $y^{20}$ | −2.5650942280e−48 | −8.4346353683e−52 | 1.7165717085e−53 |
| C232 | $x^{20} y$ | −1.5194339584e−56 | 0.0000000000e+00 | 0.0000000000e+00 |
| C234 | $x^{18} y^3$ | −4.0106786832e−55 | 0.0000000000e+00 | 0.0000000000e+00 |
| C236 | $x^{16} y^5$ | −4.3687588631e−54 | 0.0000000000e+00 | 0.0000000000e+00 |
| C238 | $x^{14} y^7$ | −2.5239118751e−53 | 0.0000000000e+00 | 0.0000000000e+00 |
| C240 | $x^{12} y^9$ | −8.3121917452e−53 | 0.0000000000e+00 | 0.0000000000e+00 |
| C242 | $x^{10} y^{11}$ | −1.7428695366e−52 | 0.0000000000e+00 | 0.0000000000e+00 |
| C244 | $x^8 y^{13}$ | −2.8874735960e−52 | 0.0000000000e+00 | 0.0000000000e+00 |
| C246 | $x^6 y^{15}$ | −1.9285524716e−52 | 0.0000000000e+00 | 0.0000000000e+00 |
| C248 | $x^4 y^{17}$ | −4.0627092527e−52 | 0.0000000000e+00 | 0.0000000000e+00 |
| C250 | $x^2 y^{19}$ | −2.0768493338e−52 | 0.0000000000e+00 | 0.0000000000e+00 |
| C252 | $y^{21}$ | −1.0720720504e−51 | 0.0000000000e+00 | 0.0000000000e+00 |
| C253 | $x^{22}$ | 2.0049530546e−60 | 0.0000000000e+00 | 0.0000000000e+00 |
| C255 | $x^{20} y^2$ | 1.1026792133e−58 | 0.0000000000e+00 | 0.0000000000e+00 |
| C257 | $x^{18} y^4$ | 1.0194079423e−57 | 0.0000000000e+00 | 0.0000000000e+00 |
| C259 | $x^{16} y^6$ | 1.7346242654e−57 | 0.0000000000e+00 | 0.0000000000e+00 |
| C261 | $x^{14} y^8$ | −2.2440134927e−56 | 0.0000000000e+00 | 0.0000000000e+00 |
| C263 | $x^{12} y^{10}$ | −2.0611456096e−55 | 0.0000000000e+00 | 0.0000000000e+00 |
| C265 | $x^{10} y^{12}$ | −7.8621089430e−55 | 0.0000000000e+00 | 0.0000000000e+00 |
| C267 | $x^8 y^{14}$ | −1.2244410209e−54 | 0.0000000000e+00 | 0.0000000000e+00 |
| C269 | $x^6 y^{16}$ | −6.2601755871e−56 | 0.0000000000e+00 | 0.0000000000e+00 |
| C271 | $x^4 y^{18}$ | 5.3242810616e−54 | 0.0000000000e+00 | 0.0000000000e+00 |
| C273 | $x^2 y^{20}$ | 6.8400181647e−54 | 0.0000000000e+00 | 0.0000000000e+00 |
| C275 | $y^{22}$ | 5.2392353627e−54 | 0.0000000000e+00 | 0.0000000000e+00 |

TABLE 3b for FIG. 3

| Coefficient | Formula | M04 | M05 | M06 |
|---|---|---|---|---|
| C7 | $x^2 y$ | −4.6919111689e−08 | 1.4018878183e−07 | −1.0081701453e−07 |
| C9 | $y^3$ | 1.8253007125e−09 | 1.6162333960e−07 | 1.9138800628e−07 |
| C10 | $x^4$ | −2.9018086007e−11 | −8.0509590704e−11 | 2.3673364745e−11 |
| C12 | $x^2 y^2$ | 8.6224557653e−12 | −2.5834562977e−10 | 3.0758167147e−10 |
| C14 | $y^4$ | −2.5035635214e−11 | −7.3073930744e−11 | 3.8614580986e−10 |
| C16 | $x^4 y$ | 3.3058503631e−14 | 1.2456814683e−13 | −1.2772621620e−13 |
| C18 | $x^2 y^3$ | −3.1589484929e−14 | 6.1984215403e−14 | −5.9980511134e−13 |
| C20 | $y5$ | −8.4642786270e−15 | 9.9374193893e−14 | −4.2774786969e−13 |
| C21 | $x^6$ | −1.4011649205e−16 | 1.7849602607e−17 | 5.5847475583e−17 |
| C23 | $x^4 y^2$ | −2.3864781097e−17 | −2.2833674225e−17 | −4.4818417386e−16 |
| C25 | $x^2 y^4$ | −4.9069998309e−17 | −1.2182931067e−16 | −5.0576058471e−15 |
| C27 | $x^6$ | −7.4654199723e−17 | 1.5300111700e−16 | −4.3607198339e−16 |
| C29 | $x^6 y$ | −4.5265599843e−20 | 1.8519879406e−19 | −1.0643353510e−21 |

TABLE 3b-continued for FIG. 3

| Coefficient | Formula | M04 | M05 | M06 |
|---|---|---|---|---|
| C31 | $x^4\,y^3$ | −4.7645527959e−20 | −1.4009807520e−19 | 2.5643866829e−18 |
| C33 | $x^2\,y^5$ | −2.6788867244e−19 | −1.7685405547e−18 | 7.0806431686e−19 |
| C35 | $y^7$ | −9.4302989834e−20 | −2.0295110973e−18 | −3.4349156239e−17 |
| C36 | $x^8$ | 2.3391237217e−22 | −2.0628266673e−22 | 2.6132020498e−22 |
| C38 | $x^6\,y^2$ | 5.5883830568e−23 | 1.8001836611e−22 | 5.6368067461e−23 |
| C40 | $x^4\,y^4$ | −4.9876036676e−22 | 2.1710049686e−21 | 2.5279269330e−20 |
| C42 | $x^2\,y^6$ | −4.5163268276e−22 | 6.4382660405e−21 | 8.9508362182e−21 |
| C44 | $x^8$ | 5.8010238179e−23 | 1.4075101538e−19 | −1.6321563225e−19 |
| C46 | $x^8\,y$ | −4.5695720559e−27 | −4.0381404993e−25 | −2.6617080446e−25 |
| C48 | $x^6\,y^3$ | −1.1212863322e−24 | 2.9094733892e−24 | −1.8127742990e−23 |
| C50 | $x^4\,y^5$ | −1.5764003940e−24 | 1.4108337367e−23 | −1.3469966836e−23 |
| C52 | $x^2\,y^7$ | 1.1213109772e−24 | −5.3421691468e−23 | 1.0748109606e−21 |
| C54 | $y9$ | 1.1424273419e−25 | 2.6461372776e−22 | 8.5875633704e−21 |
| C55 | $x^{10}$ | −6.5881676753e−28 | −8.3724676404e−29 | −8.0410002448e−28 |
| C57 | $x^8\,y^2$ | −8.5880987336e−28 | −3.5307271777e−27 | 5.6485146159e−27 |
| C59 | $x^6\,y^4$ | −1.0093204545e−27 | −2.3830739121e−26 | −2.9443445622e−26 |
| C61 | $x^4\,y^6$ | 1.0580830393e−27 | −1.7544683616e−25 | 1.5070766750e−25 |
| C63 | $x^2\,y^8$ | −8.2506562947e−27 | −2.5865101624e−24 | 9.8469051674e−24 |
| C65 | $y^{10}$ | −1.3363245211e−26 | −3.2230886817e−23 | −3.1844554132e−24 |
| C67 | $x^{10}\,y$ | 1.1233617267e−30 | 3.1613661823e−30 | 8.6718383227e−30 |
| C69 | $x^8\,y^3$ | 5.9646164696e−30 | −2.1946077692e−29 | 2.1934062477e−28 |
| C71 | $x^6\,y^5$ | 2.2722688419e−29 | −1.9459888699e−28 | 1.0018954686e−27 |
| C73 | $x^4\,y^7$ | −3.2249553976e−29 | 1.4535959356e−27 | −1.3266066652e−26 |
| C75 | $x^2\,y^9$ | −1.2191696803e−28 | 2.5705533412e−26 | −2.4262538931e−25 |
| C77 | $y11$ | −2.8964082528e−29 | 1.1613866353e−25 | −1.5738840092e−24 |
| C78 | $x^{12}$ | 4.9267991596e−33 | 5.2985481711e−33 | −1.1936992974e−32 |
| C80 | $x^{10}\,y^2$ | 7.3327143242e−33 | 1.2644776661e−32 | −1.2121388095e−31 |
| C82 | $x^8\,y^4$ | 1.2733141708e−32 | 3.4066396679e−31 | −1.3294947908e−30 |
| C84 | $x^6\,y^6$ | −8.3754850051e−32 | 3.0003234925e−30 | −5.1000348453e−30 |
| C86 | $x^4\,y^8$ | −2.3254781021e−31 | 1.6826769210e−29 | −1.5530788550e−28 |
| C88 | $x^2\,y^{10}$ | −8.5598460559e−32 | 2.7420100914e−28 | −6.8256227284e−28 |
| C90 | $y^{12}$ | 2.2180850522e−31 | 3.4186134167e−27 | 6.3322543085e−27 |
| C92 | $x^{12}\,y$ | −2.7433514556e−36 | −1.1289288324e−35 | −9.6724426897e−35 |
| C94 | $x^{10}\,y^3$ | −4.7586957087e−35 | 4.6702203629e−36 | −2.5712999447e−33 |
| C96 | $x^8\,y^5$ | −4.7545047276e−34 | 9.6780603671e−34 | −2.0510233332e−32 |
| C98 | $x^6\,y^7$ | −8.2297728621e−34 | −8.5557064896e−33 | 2.8607943365e−32 |
| C100 | $x^4\,y^9$ | 4.9628734493e−34 | −4.2841778018e−31 | 3.3578661634e−30 |
| C102 | $x^2\,y^{11}$ | 2.2276901854e−33 | −4.3443105975e−30 | 2.8261396982e−29 |
| C104 | $y^{13}$ | 5.8351464578e−34 | −2.7948744240e−29 | 1.7711923002e−28 |
| C105 | $x^{14}$ | −5.4354353797e−38 | −2.2248119285e−38 | 1.8008278590e−37 |
| C107 | $x^{12}\,y^2$ | −7.6887074368e−38 | 6.3742721923e−38 | 1.2854029898e−36 |
| C109 | $x^{10}\,y^4$ | −4.7495801026e−37 | −2.1522493974e−36 | 1.9110302655e−35 |
| C111 | $x^8\,y^6$ | −1.1773512840e−36 | −3.4881187811e−35 | 1.2096714307e−34 |
| C113 | $x^6\,y^8$ | 5.0085939154e−37 | −7.0448057868e−36 | 7.5048317624e−34 |
| C115 | $x^4\,y^{10}$ | 4.4579790243e−36 | 1.0807498528e−33 | 1.4730895606e−32 |
| C117 | $x^2\,y^{12}$ | 4.6198184857e−36 | −4.2727964578e−33 | −5.5510623066e−32 |
| C119 | $y^{14}$ | −2.9478321574e−36 | −9.7310287771e−32 | −9.1866898396e−31 |
| C121 | $x^{14}\,y$ | −3.4915632053e−41 | 1.1915690881e−41 | 2.4122261565e−40 |
| C123 | $x^{12}\,y^3$ | −1.3817996143e−40 | 5.5606726611e−40 | 1.7838267949e−38 |
| C125 | $x^{10}\,y^5$ | 1.5817215627e−39 | 4.0195460200e−40 | 1.9768338165e−37 |
| C127 | $x^8\,y^7$ | 7.4306198543e−39 | 1.1150266905e−37 | 6.6911250425e−37 |
| C129 | $x^6\,y^9$ | 9.1132401735e−39 | 4.1617307677e−37 | −1.8357811456e−35 |
| C131 | $x^4\,y^{11}$ | −5.3117409780e−39 | 3.5018938464e−35 | −3.5007085798e−34 |
| C133 | $x^2\,y^{13}$ | −2.2828974265e−38 | 2.9750511034e−34 | −1.7038138998e−33 |
| C135 | $y^{15}$ | −9.6733588226e−39 | 1.8978248618e−33 | −1.2293938704e−32 |
| C136 | $x^{16}$ | 2.6379321173e−43 | 6.3250853595e−44 | −1.2555048692e−42 |
| C138 | $x^{14}\,y^2$ | 1.6805055477e−43 | −7.4919150820e−43 | −8.3354498766e−42 |
| C140 | $x^{12}\,y^4$ | 2.1967077774e−42 | 7.5605897278e−42 | −1.2424315115e−40 |
| C142 | $x^{10}\,y^6$ | 1.2870344320e−41 | 1.7703211793e−40 | −1.4252448957e−39 |
| C144 | $x^8\,y^8$ | 2.6977135786e−41 | 4.5454498284e−40 | −8.8208994212e−40 |
| C146 | $x^6\,y^{10}$ | −8.1514424788e−42 | −8.2260761041e−39 | −5.9937093928e−38 |
| C148 | $x^4\,y^{12}$ | −6.4506268489e−41 | −2.7696063219e−37 | −6.5630931197e−38 |
| C150 | $x^2\,y^{14}$ | −9.4392874214e−41 | −1.0652214502e−36 | 9.1537402933e−36 |
| C152 | $y^{16}$ | 1.7310147389e−41 | −5.6776251107e−36 | 6.6554991728e−35 |
| C154 | $x^{16}\,y$ | 1.5317573206e−46 | 1.1388225260e−46 | 4.1747621637e−46 |
| C156 | $x^{14}\,y^3$ | 1.5654653359e−45 | −2.4857140337e−45 | −6.5877876391e−44 |
| C158 | $x^{12}\,y^5$ | 1.7895619193e−45 | −3.7797363365e−44 | −9.1835194349e−43 |
| C160 | $x^{10}\,y^7$ | −3.7082871176e−45 | −6.8971109455e−43 | −6.0401689567e−42 |
| C162 | $x^8\,y^9$ | −3.9193297983e−44 | −4.4179811943e−43 | 3.7818838134e−41 |
| C164 | $x^6\,y^{11}$ | −9.5469919734e−44 | −2.3488210996e−41 | 1.5348371315e−39 |
| C166 | $x^4\,y^{13}$ | −7.8995363375e−44 | 3.8004152927e−40 | 1.7047290765e−38 |
| C168 | $x^2\,y^{15}$ | −9.2629257347e−45 | −7.7657728219e−39 | 4.0970986264e−38 |
| C170 | $y^{17}$ | 8.2836171309e−44 | −1.4302437709e−38 | 5.0382527675e−37 |
| C171 | $x^{18}$ | −6.5333379241e−49 | −1.5057794552e−49 | 4.6695457651e−48 |
| C173 | $x^{16}\,y^2$ | 2.8610407792e−49 | 2.3735934076e−48 | 2.8165961363e−47 |

TABLE 3b-continued

| | | for FIG. 3 | | |
|---|---|---|---|---|
| Coefficient | Formula | M04 | M05 | M06 |
| C175 | $x^{14} y^4$ | −2.2515439953e−48 | −1.2637688111e−47 | 3.7976221258e−46 |
| C177 | $x^{12} y^6$ | −3.5665179513e−47 | −2.4082341714e−46 | 7.5885599371e−45 |
| C179 | $x^{10} y^8$ | −1.6171675339e−46 | −4.2823378618e−45 | 7.1006408345e−45 |
| C181 | $x^8 y^{10}$ | −2.7085338757e−46 | 1.0300759912e−44 | −4.9470914486e−44 |
| C183 | $x^6 y^{12}$ | −8.9359429915e−47 | 7.5345292637e−43 | −6.5940980794e−43 |
| C185 | $x^4 y^{14}$ | 1.5349329900e−46 | 2.0927494653e−42 | −4.2938355971e−41 |
| C187 | $x^2 y^{16}$ | 5.2740083554e−46 | 7.9802384763e−41 | −3.6576710798e−40 |
| C189 | $y^{18}$ | −1.5284540620e−47 | 8.4380122088e−41 | −2.7338055320e−39 |
| C191 | $x^{18} y$ | −1.9818000134e−52 | −3.2843622423e−52 | −2.1169359160e−51 |
| C193 | $x^{16} y^3$ | −3.3835872471e−51 | 3.5822179769e−51 | 9.8837699806e−50 |
| C195 | $x^{14} y^5$ | −1.5410213140e−50 | 1.8369624067e−49 | 1.6263584683e−48 |
| C197 | $x^{12} y^7$ | −1.1107803516e−49 | 4.5568862779e−49 | 1.6049430266e−47 |
| C199 | $x^{10} y^9$ | −3.7598742192e−49 | 6.0790621137e−47 | −9.7389029292e−48 |
| C201 | $x^8 y^{11}$ | −3.3533356521e−49 | −5.3991952333e−46 | −1.9866472076e−45 |
| C203 | $x^6 y^{13}$ | 9.1584589484e−50 | −4.8080052063e−46 | −4.5214833329e−44 |
| C205 | $x^4 y^{15}$ | 4.3754203193e−49 | −1.9158978765e−44 | −2.7767309791e−43 |
| C207 | $x^2 y^{17}$ | 1.0475851486e−48 | −2.3241218793e−43 | −2.2147383503e−44 |
| C209 | $y^{19}$ | −3.3222240956e−49 | −4.0090513637e−44 | −9.6408290230e−42 |
| C210 | $x^{20}$ | 6.8127965305e−55 | 1.9083761220e−55 | −7.1764184193e−54 |
| C212 | $x^{18} y^2$ | −1.1809602416e−54 | −2.2614079810e−54 | −3.8228959993e−53 |
| C214 | $x^{16} y^4$ | −5.3863242260e−54 | −1.2322615781e−53 | −4.2654388622e−52 |
| C216 | $x^{14} y^6$ | −1.2198550115e−53 | −4.6097235427e−52 | −1.4592372296e−50 |
| C218 | $x^{12} y^8$ | −1.1179524681e−52 | 4.7457648720e−51 | −5.0579158593e−50 |
| C220 | $x^{10} y^{10}$ | −2.4201087413e−52 | −2.3876888406e−49 | 4.4129108488e−49 |
| C222 | $x^8 y^{12}$ | −1.0775957248e−52 | 2.9374564283e−48 | 4.6805439361e−48 |
| C224 | $x^6 y^{14}$ | 1.1081530874e−52 | −1.5595949465e−47 | 1.3592595635e−46 |
| C226 | $x^4 y^{16}$ | 3.0684358801e−52 | 9.8555319140e−47 | 1.0988321855e−45 |
| C228 | $x^2 y^{18}$ | 6.5432217197e−52 | 6.3071466742e−47 | 3.2572549929e−45 |
| C230 | $y^{20}$ | −3.2748326320e−52 | 1.3699657116e−47 | 5.3682390236e−44 |

TABLE 3c

| | | for FIG. 3 | | |
|---|---|---|---|---|
| Coefficient | Formula | M07 | M08 | M09 |
| C7 | $x^2 y$ | −1.5406892486e−07 | 2.5063978769e−07 | −1.2243983927e−07 |
| C9 | $y^3$ | −1.0071762212e−07 | 1.4262511688e−07 | −7.4016702454e−07 |
| C10 | $x^4$ | −2.3927166450e−10 | −2.5853745427e−10 | 2.8395839048e−10 |
| C12 | $x^2 y^3$ | 8.5067776647e−10 | 5.9320079597e−11 | −7.4988465420e−11 |
| C14 | $y^4$ | 1.3233325218e−09 | −4.1315127363e−10 | 4.1975421828e−09 |
| C16 | $x^4 y$ | 2.6529267257e−12 | 2.6529267257e−12 | −4.4811570530e−13 |
| C18 | $x^2 y^3$ | 2.0094726034e−12 | 2.0571717855e−12 | −5.3369461863e−12 |
| C20 | $y^5$ | −7.9535263077e−12 | 1.3128908941e−12 | −2.4873922581e−11 |
| C21 | $x^6$ | 1.6623335881e−15 | −9.1271948417e−16 | 4.8689237138e−15 |
| C23 | $x^4 y^2$ | −3.8345376618e−15 | −4.1554050104e−15 | 1.1603086206e−14 |
| C25 | $x^2 y^4$ | −2.2422377702e−14 | −3.2829460952e−15 | 2.1013928712e−14 |
| C27 | $y^6$ | 4.0650730479e−14 | −6.2938426600e−15 | 1.7226074770e−13 |
| C29 | $x^6 y$ | −9.9690495446e−18 | 8.3186664273e−19 | 3.9662337450e−17 |
| C31 | $x^4 y^3$ | −2.1403663732e−17 | 5.2223840938e−18 | 7.3273705623e−17 |
| C33 | $x^2 y^5$ | 1.3176929999e−16 | 1.6332539295e−17 | −3.3811007209e−16 |
| C35 | $y^7$ | −3.6873919625e−16 | 1.9527911956e−17 | −1.0720301349e−15 |
| C36 | $x^8$ | −8.9761469416e−21 | 5.1875659439e−20 | −2.3693086180e−18 |
| C38 | $x^6 y^2$ | 3.5764406501e−20 | 3.9874086476e−20 | −3.0131458776e−18 |
| C40 | $x^4 y^4$ | 2.8526231911e−19 | 1.3728349162e−19 | −3.3736958430e−18 |
| C42 | $x^2 y^6$ | −1.8071636856e−18 | 1.9751798121e−19 | 1.8208024498e−18 |
| C44 | $y^8$ | 4.1818723033e−18 | 2.1104661222e−19 | 5.5932805556e−18 |
| C46 | $x^8 y$ | 1.4226595790e−22 | 8.9349482182e−23 | −4.1105713226e−20 |
| C48 | $x^6 y^3$ | 3.7591549180e−22 | −9.5168566014e−22 | −6.2514555514e−20 |
| C50 | $x^4 y^5$ | −3.6713175415e−21 | −7.2982775869e−22 | −1.7050519553e−20 |
| C52 | $x^2 y^7$ | 2.8635316808e−20 | 2.3154495399e−21 | 1.0577409765e−20 |
| C54 | $y^9$ | 3.0734581915e−20 | −1.8356921408e−21 | −1.0864671545e−19 |
| C55 | $x^{10}$ | 2.2058209913e−25 | −2.1116637697e−24 | 7.2691415848e−22 |
| C57 | $x^8 y^2$ | −1.0285432994e−24 | −2.6257643076e−24 | 1.3342198892e−21 |
| C59 | $x^6 y^4$ | −1.5478136163e−23 | −3.2933297424e−23 | 1.7092501943e−21 |
| C61 | $x^4 y^6$ | 1.3283605857e−22 | −7.7319254943e−23 | 1.1230041000e−21 |
| C63 | $x^2 y^8$ | 3.1654945824e−22 | −7.6300329054e−23 | 2.2059007667e−22 |
| C65 | $y^{10}$ | −1.3353127768e−21 | −2.7629081367e−23 | 2.1258842289e−21 |
| C67 | $x^{10} y$ | −3.0463775887e−27 | −2.0971761112e−26 | 2.1524607579e−23 |
| C69 | $x^8 y^3$ | −2.4577680535e−26 | 7.9413968213e−26 | 3.8528388871e−23 |
| C71 | $x^6 y^5$ | 1.8898366600e−25 | 4.0514268238e−25 | 2.2328244433e−23 |

TABLE 3c-continued for FIG. 3

| Coefficient | Formula | M07 | M08 | M09 |
|---|---|---|---|---|
| C73 | $x^4 y^7$ | 6.9673799214e−25 | −5.3032623185e−27 | 4.2868510876e−25 |
| C75 | $x^2 y^9$ | −1.1663125856e−23 | −1.6151153651e−25 | −8.5072632820e−24 |
| C77 | $y^{11}$ | 8.6214064959e−25 | 3.0808600494e−25 | 6.2916892811e−24 |
| C78 | $x^{12}$ | −4.7025762319e−30 | 6.1575537159e−29 | −1.2728739819e−25 |
| C80 | $x^{10} y^2$ | 1.3800008981e−29 | −3.7887849944e−28 | −2.0854563910e−25 |
| C82 | $x^8 y^4$ | 8.9441902344e−28 | 2.4367045898e−27 | −3.5498487783e−25 |
| C84 | $x^6 y^6$ | −8.8731267067e−28 | 1.1370350226e−26 | −4.4466835705e−25 |
| C86 | $x^4 y^8$ | −7.5455085132e−26 | 1.4669472579e−26 | −1.5780079565e−25 |
| C88 | $x^2 y^{10}$ | 5.6599295011e−26 | 9.1012727004e−27 | −4.5298651109e−26 |
| C90 | $y^{12}$ | 2.8143256028e−25 | 1.1565142424e−27 | −4.9433054127e−25 |
| C92 | $x^{12} y$ | 5.0778387731e−32 | 8.5828879377e−31 | −5.1405105085e−27 |
| C94 | $x^{10} y^3$ | 1.2925431548e−30 | −6.3856152579e−30 | −1.2206542993e−26 |
| C96 | $x^8 y^5$ | 3.3878565135e−30 | −4.2282672195e−29 | −9.2319448493e−27 |
| C98 | $x^6 y^7$ | −1.6901670373e−28 | −5.4388646850e−29 | −3.0106239902e−27 |
| C100 | $x^4 y^9$ | 2.6717388818e−28 | 1.2766417595e−29 | 2.9890289859e−28 |
| C102 | $x^2 y^{11}$ | 1.6096504879e−27 | 5.0503864774e−30 | 1.6116381504e−27 |
| C104 | $y^{13}$ | −1.2780319808e−27 | −1.9628127728e−29 | −4.0934429528e−28 |
| C105 | $x^{14}$ | 7.4118809942e−35 | −1.0677146298e−33 | 1.2659506744e−29 |
| C107 | $x^{12} y^2$ | 4.1227191307e−34 | 4.2914347971e−32 | −5.8228987522e−30 |
| C109 | $x^{10} y^4$ | −1.8651413337e−32 | −7.0412925223e−32 | −8.4754915086e−30 |
| C111 | $x^8 y^6$ | −2.2912168412e−31 | −8.8273686087e−31 | 5.7290310738e−29 |
| C113 | $x^6 y^8$ | 2.6032603416e−30 | −1.5451079608e−30 | 5.6144395274e−29 |
| C115 | $x^4 y^{10}$ | 6.2420243755e−30 | −1.4500934076e−30 | 8.7789085038e−30 |
| C117 | $x^2 y^{12}$ | −2.0055873812e−29 | −6.0445847896e−31 | 1.6579691844e−29 |
| C119 | $y^{14}$ | −3.4858578548e−29 | −3.9389786767e−32 | 9.6546892734e−29 |
| C121 | $x^{14} y$ | −3.6349990515e−37 | 1.5867771987e−35 | 6.1704054854e−31 |
| C123 | $x^{12} y^3$ | −2.6612139397e−35 | 5.1365759239e−34 | 1.8157455218e−30 |
| C125 | $x^{10} y^5$ | −4.9008380781e−34 | 2.2276809261e−33 | 1.6925225667e−30 |
| C127 | $x^8 y^7$ | 5.3391634990e−33 | 4.9049682634e−33 | 8.4721409050e−31 |
| C129 | $x^6 y^9$ | 1.6152350742e−32 | 3.3959617450e−33 | 1.7588011963e−31 |
| C131 | $x^4 y^{11}$ | −2.6638593784e−32 | −1.2895012271e−33 | −2.9719075470e−32 |
| C133 | $x^2 y^{13}$ | −2.0814565975e−31 | −2.5399961434e−36 | −3.3053502504e−31 |
| C135 | $y^{15}$ | 1.1783879640e−31 | 8.4075953276e−34 | −3.7373611679e−31 |
| C136 | $x^{16}$ | −7.8215999665e−40 | 3.0619623218e−38 | −6.6897308349e−34 |
| C138 | $x^{14} y^2$ | −1.3489787144e−38 | −1.3173933056e−36 | 4.6895739290e−33 |
| C140 | $x^{12} y^4$ | −1.1060598784e−38 | 1.1389664289e−36 | 1.1898857666e−32 |
| C142 | $x^{10} y^6$ | 6.1126918746e−36 | 3.5830121770e−35 | 2.2562474011e−33 |
| C144 | $x^8 y^8$ | −9.9472983247e−36 | 8.8708082757e−35 | −4.7162166661e−33 |
| C146 | $x^6 y^{10}$ | −1.9722176560e−34 | 1.0203286756e−34 | −3.1596641693e−33 |
| C148 | $x^4 y^{12}$ | 1.9971726633e−34 | 7.8750419222e−35 | −3.0863983815e−35 |
| C150 | $x^2 y^{14}$ | 1.4671080791e−33 | 2.2576160319e−35 | −1.6654622079e−33 |
| C152 | $y^{16}$ | 1.3446089490e−33 | 1.2262038947e−36 | −8.5600002567e−33 |
| C154 | $x^{16} y$ | −7.7868904508e−43 | −1.2435017428e−39 | −3.5824572255e−35 |
| C156 | $x^{14} y^3$ | 1.3684701008e−40 | −2.0040187099e−38 | −1.1220164391e−34 |
| C158 | $x^{12} y^5$ | 1.0582375883e−38 | −6.6701058772e−38 | −1.0546819543e−34 |
| C160 | $x^{10} y^7$ | −3.2312418322e−38 | −1.6125855254e−37 | −7.3766087623e−35 |
| C162 | $x^8 y^9$ | −6.1553564841e−37 | −2.4670225590e−37 | −2.7819778494e−35 |
| C164 | $x^6 y^{11}$ | 9.8651072991e−38 | −8.8195737950e−38 | −5.6863814041e−36 |
| C166 | $x^4 y^{13}$ | 6.4510592866e−37 | 6.4803417200e−38 | 1.5820424567e−36 |
| C168 | $x^2 y^{15}$ | 2.4833942142e−35 | 5.9661013401e−39 | 3.8155787145e−35 |
| C170 | $y^{17}$ | −5.9480019738e−36 | −2.9001250967e−38 | 6.1896806728e−35 |
| C171 | $x^{18}$ | 4.9739730359e−45 | −8.5611692145e−43 | 1.4782087574e−38 |
| C173 | $x^{16} y^2$ | 9.5905315102e−44 | 9.3461834401e−42 | −3.9712549092e−37 |
| C175 | $x^{14} y^4$ | 2.9586878537e−42 | −5.5978801474e−41 | −1.1902486685e−36 |
| C177 | $x^{12} y^6$ | −1.2329368692e−41 | −7.6546844603e−40 | −6.4720328444e−37 |
| C179 | $x^{10} y^8$ | −5.6718288083e−40 | −2.4891072483e−39 | −1.0234509613e−37 |
| C181 | $x^8 y^{10}$ | 1.4647035933e−39 | −3.6256551426e−39 | 1.3910832686e−37 |
| C183 | $x^6 y^{12}$ | −1.2077186832e−38 | −3.3874384820e−39 | 5.6031783554e−38 |
| C185 | $x^4 y^{14}$ | 2.0523944311e−38 | −2.3070171968e−39 | −1.0908467981e−38 |
| C187 | $x^2 y^{16}$ | −1.9015363173e−38 | −4.9549531406e−40 | 1.5464975975e−38 |
| C189 | $y^{18}$ | 2.1908630235e−37 | 6.9249215953e−42 | 2.9173777467e−37 |
| C191 | $x^{18} y$ | 1.7727633538e−47 | 1.5651442754e−44 | 7.7597489991e−40 |
| C193 | $x^{16} y^3$ | 8.9915008087e−46 | 2.7267428528e−43 | 1.6465278741e−39 |
| C195 | $x^{14} y^5$ | −5.9597835170e−44 | 8.8910907171e−43 | −8.3777551079e−40 |
| C197 | $x^{12} y^7$ | −3.1648393929e−43 | 1.9674453312e−42 | −2.3976535076e−43 |
| C199 | $x^{10} y^9$ | 5.0144012117e−42 | 4.3037657792e−42 | −1.3726449580e−43 |
| C201 | $x^8 y^{11}$ | −2.0537860165e−41 | 4.4303832692e−42 | −6.7580154863e−44 |
| C203 | $x^6 y^{13}$ | 4.9281119187e−41 | 3.6766291837e−43 | 2.2538999678e−40 |
| C205 | $x^4 y^{15}$ | −3.8162288999e−40 | −1.4025976322e−42 | −1.9374308562e−40 |
| C207 | $x^2 y^{17}$ | 1.3515085877e−40 | −2.7338594450e−43 | −2.0312038333e−39 |
| C209 | $y^{19}$ | 1.8651521233e−39 | 5.6124223098e−43 | −4.0283378828e−39 |
| C210 | $x^{20}$ | −1.4357270329e−50 | 8.5128605245e−48 | −1.4666394325e−44 |
| C212 | $x^{18} y^2$ | 1.1889448948e−49 | 9.6496226122e−47 | 8.2317220740e−42 |
| C214 | $x^{16} y^4$ | −6.0878348102e−48 | 1.3697170242e−45 | 2.0430686433e−41 |
| C216 | $x^{14} y^6$ | −4.7355500404e−46 | 7.4115926977e−45 | 3.7700456362e−45 |

TABLE 3c-continued for FIG. 3

| Coefficient | Formula | M07 | M08 | M09 |
|---|---|---|---|---|
| C218 | $x^{12} y^8$ | 4.4693207296e−45 | 2.7492033686e−44 | 1.9013823361e−45 |
| C220 | $x^{10} y^{10}$ | −1.4260151041e−44 | 4.9046050640e−44 | 1.0576715943e−45 |
| C222 | $x^8 y^{12}$ | 5.4241276175e−44 | 5.3510591196e−44 | 4.4536665212e−46 |
| C224 | $x^6 y^{14}$ | −1.8962541934e−43 | 4.7275574418e−44 | 2.9715636422e−46 |
| C226 | $x^4 y^{16}$ | −6.4614525109e−43 | 2.9803371275e−44 | 1.3312751769e−42 |
| C228 | $x^2 y^{18}$ | 5.7709366205e−43 | 5.4507385495e−45 | 7.2014314065e−42 |
| C230 | $y^{20}$ | 4.6374977599e−42 | −1.3595188151e−45 | 1.0683412204e−41 |

TABLE 3d

TABLE 3d-continued for FIG. 3

| Coefficient | Formula | M10 | M11 |
|---|---|---|---|
| C7 | $x^2 y$ | −1.1663231269e−06 | 1.1921829273e−08 |
| C9 | $y^3$ | 2.2591574472e−06 | −2.7002975297e−08 |
| C10 | $x^4$ | 6.6694067565e−10 | −3.1865749113e−11 |
| C12 | $x^2 y^2$ | −7.0538146018e−10 | −5.8763805693e−11 |
| C14 | $y^4$ | 1.3791783233e−09 | 2.7618522197e−13 |
| C16 | $x^4 y$ | 1.5680835348e−13 | 3.1783330086e−15 |
| C18 | $x^2 y^3$ | −5.0982360864e−12 | −1.0530824115e−14 |
| C20 | x5 | 1.5153413537e−11 | −4.7274565120e−14 |
| C21 | $x^6$ | 6.3513253971e−16 | −3.1838489578e−17 |
| C23 | $x^4 y^2$ | 1.2012523622e−14 | −1.5794540943e−16 |
| C25 | $x^2 y^4$ | −6.4957845138e−15 | −1.1537775260e−16 |
| C27 | $y^6$ | 1.3762303636e−14 | 5.9712433522e−18 |
| C29 | $x^6 y$ | −5.7897715260e−18 | 3.2000844761e−20 |
| C31 | $x^4 y^3$ | −6.6235683896e−18 | 8.7835024977e−21 |
| C33 | $x^2 y^5$ | 2.3551679890e−16 | −8.1378635008e−20 |
| C35 | $y^7$ | −1.9371589833e−16 | −7.8870432865e−20 |
| C36 | $x^8$ | 1.1217215851e−21 | −7.1595083501e−23 |
| C38 | $x^6 y^2$ | 5.5732551565e−20 | −2.3196095471e−22 |
| C40 | $x^4 y^4$ | −6.2255177021e−19 | −3.8707285634e−22 |
| C42 | $x^2 y^6$ | 1.6145485935e−18 | −1.6597527116e−22 |
| C44 | $y^8$ | 1.1215078565e−18 | 1.1716622724e−23 |
| C46 | $x^8 y$ | −6.1663790632e−23 | −2.4058234690e−26 |
| C48 | $x^6 y^3$ | 6.2561777699e−22 | 4.4714573426e−26 |
| C50 | $x^4 y^5$ | −4.5947599398e−21 | −1.4719522624e−25 |
| C52 | $x^2 y^7$ | −9.1165727777e−21 | −2.2373818860e−25 |
| C54 | y9 | 2.1177170012e−20 | −1.0676714355e−25 |
| C55 | $x^{10}$ | 4.7410465567e−27 | −4.2820557522e−29 |
| C57 | $x^8 y^2$ | −1.4132621088e−24 | −6.6137258083e−28 |
| C59 | $x^6 y^4$ | 3.6613789941e−24 | −1.2685026942e−27 |
| C61 | $x^4 y^6$ | 2.6901308095e−23 | −1.1420065923e−27 |
| C63 | $x^2 y^8$ | −1.2262504418e−22 | −3.6938615811e−28 |
| C65 | $y^{10}$ | 1.2895775113e−22 | −3.9711786056e−29 |
| C67 | $x^{10} y$ | 1.0842810117e−27 | 8.5817995970e−32 |
| C69 | $x^8 y^3$ | 1.5649106665e−27 | 1.9476168011e−31 |
| C71 | $x^6 y^5$ | −1.2400458862e−26 | 7.2361614225e−31 |
| C73 | $x^4 y^7$ | 4.6145315023e−25 | 1.4720144234e−31 |
| C75 | $x^2 y^9$ | −4.0728948833e−25 | −4.1772146063e−31 |
| C77 | $y^{11}$ | 9.7988616609e−25 | −2.4705555621e−31 |
| C78 | $x^{12}$ | 3.9956872907e−31 | −9.0354940605e−35 |
| C80 | $x^{10} y^2$ | 2.8501344472e−29 | 1.4148833708e−33 |
| C82 | $x^8 y^4$ | 1.5947979385e−28 | 3.9541954363e−33 |
| C84 | $x^6 y^6$ | −6.2995605300e−28 | 4.8334118773e−33 |
| C86 | $x^4 y^8$ | 8.9050063121e−28 | 2.0959532721e−33 |
| C88 | $x^2 y^{10}$ | −1.9194252591e−27 | 1.8421945106e−34 |
| C90 | $y^{12}$ | 7.9443383790e−27 | 1.2258733275e−34 |
| C92 | $x^{12} y$ | −2.1453912253e−32 | 2.8877305214e−37 |
| C94 | $x^{10} y^3$ | −3.0397888617e−31 | 8.7182316660e−38 |
| C96 | $x^8 y^5$ | 1.5979096613e−31 | −6.2716138081e−36 |
| C98 | $x^6 y^7$ | −4.8562548732e−30 | −9.2865904233e−36 |
| C100 | $x^4 y^9$ | −7.5175563802e−30 | −6.4348190009e−36 |
| C102 | $x^2 y^{11}$ | −1.9127771530e−29 | −2.0889634312e−36 |
| C104 | $y^{13}$ | 3.1707472515e−29 | 6.3387734034e−38 |
| C105 | $x^{14}$ | −6.6332018770e−36 | 1.9003748133e−40 |
| C107 | $x^{12} y^2$ | −3.0902875055e−34 | −1.2707556076e−38 |
| C109 | $x^{10} y^4$ | −3.7955115541e−33 | −5.4258348717e−38 |
| C111 | $x^8 y^6$ | −9.9204822424e−34 | −1.0106706383e−37 |
| C113 | $x^6 y^8$ | 1.6261522682e−32 | −8.7178347835e−38 |
| C115 | $x^4 y^{10}$ | 1.3767243112e−32 | −3.4926503706e−38 |
| C117 | $x^2 y^{12}$ | −3.4331941911e−32 | −4.3676972121e−39 |
| C119 | $y^{14}$ | −6.1806466418e−32 | −1.2324933298e−40 |
| C121 | $x^{14} y$ | 2.5975197067e−37 | −1.3374737213e−42 |
| C123 | $x^{12} y^3$ | 6.4239662272e−36 | 2.6176103826e−43 |
| C125 | $x^{10} y^5$ | 1.5189330414e−35 | 2.9252071252e−41 |
| C127 | $x^8 y^7$ | 2.6584445085e−35 | 5.8013627472e−41 |
| C129 | $x^6 y^9$ | 2.5879034229e−34 | 6.0489428779e−41 |
| C131 | $x^4 y^{11}$ | 2.1189015515e−34 | 3.5421971957e−41 |
| C133 | $x^2 y^{13}$ | 6.7439880341e−34 | 9.8262553521e−42 |
| C135 | $y^{15}$ | −1.3394227878e−33 | −6.6744421186e−43 |
| C136 | $x^{16}$ | 5.2956977734e−41 | −1.0872758046e−45 |
| C138 | $x^{14} y^2$ | 1.4771291367e−39 | 4.3905617493e−44 |
| C140 | $x^{12} y^4$ | 3.2848392693e−38 | 2.5961327928e−43 |
| C142 | $x^{10} y^6$ | 1.2899085039e−37 | 6.3726919944e−43 |
| C144 | $x^8 y^8$ | −2.4484702649e−37 | 7.7901881038e−43 |
| C146 | $x^6 y^{10}$ | 7.1545737685e−38 | 5.0220710138e−43 |
| C148 | $x^4 y^{12}$ | −2.3771571764e−36 | 1.4957115226e−43 |
| C150 | $x^2 y^{14}$ | 6.1049624783e−36 | 6.8304580815e−45 |
| C152 | $y^{16}$ | −6.4492410484e−36 | −2.6029279451e−45 |
| C154 | $x^{16} y$ | −1.9899513319e−42 | 2.7986611355e−48 |
| C156 | $x^{14} y^3$ | −6.7496233922e−41 | −2.3407634690e−48 |
| C158 | $x^{12} y^5$ | −3.6187976705e−40 | −7.0182355832e−47 |
| C160 | $x^{10} y^7$ | −3.0916476965e−40 | −1.8366866274e−46 |
| C162 | $x^8 y^9$ | −2.9750227750e−39 | −3.2427055169e−46 |
| C164 | $x^6 y^{11}$ | −3.5158521190e−39 | −3.3343027873e−46 |
| C166 | $x^4 y^{13}$ | −2.1916609772e−38 | −2.0953331736e−46 |
| C168 | $x^2 y^{15}$ | 3.1747352996e−38 | −6.7004380456e−47 |
| C170 | y17 | −1.2617547429e−38 | −4.1819131946e−48 |
| C171 | $x^{18}$ | −1.8824375264e−46 | 5.3263529060e−52 |
| C173 | $x^{16} y^2$ | 4.2534759115e−45 | −1.1910139311e−49 |
| C175 | $x^{14} y^4$ | −2.4257550168e−44 | −8.3840536070e−49 |
| C177 | $x^{12} y^6$ | −1.0671256186e−42 | −2.5099823971e−48 |
| C179 | $x^{10} y^8$ | 7.0463360147e−43 | −4.0224192498e−48 |
| C181 | $x^8 y^{10}$ | 5.2540112624e−43 | −3.7849313463e−48 |
| C183 | $x^6 y^{12}$ | 1.3022858376e−41 | −2.0055519510e−48 |
| C185 | $x^4 y^{14}$ | −4.8406462056e−41 | −5.0146704589e−49 |
| C187 | $x^2 y^{16}$ | 1.2130228813e−40 | −1.4171294592e−50 |
| C189 | $y^{18}$ | 4.8106706773e−42 | 1.0476452918e−50 |
| C191 | $x^{18} y$ | 8.3958709460e−48 | −1.9221682176e−54 |
| C193 | $x^{16} y^3$ | 3.5759206934e−46 | 1.3322328979e−53 |
| C195 | $x^{14} y^5$ | 3.0879150812e−45 | 8.4420576065e−53 |
| C197 | $x^{12} y^7$ | 5.5511480653e−45 | 2.4350151108e−52 |
| C199 | $x^{10} y^9$ | 1.3657087584e−44 | 6.7816148627e−52 |
| C201 | $x^8 y^{11}$ | 4.9398105960e−44 | 1.0948751508e−51 |
| C203 | $x^6 y^{13}$ | 1.2188999472e−43 | 1.0112519427e−51 |
| C205 | $x^4 y^{15}$ | 2.7083111619e−44 | 5.8621756652e−52 |
| C207 | $x^2 y^{17}$ | 2.8651654762e−43 | 1.7463285688e−52 |
| C209 | $y^{19}$ | 6.0937890687e−44 | 1.4331723735e−53 |
| C210 | $x^{20}$ | 1.4716572709e−52 | 1.8370771475e−57 |
| C212 | $x^{18} y^2$ | −7.1338342986e−50 | 1.8492230703e−55 |
| C214 | $x^{16} y^4$ | −1.1891390671e−48 | 1.4406362749e−54 |
| C216 | $x^{14} y^6$ | −8.8693738447e−49 | 5.0053812022e−54 |
| C218 | $x^{12} y^8$ | 1.9669384553e−48 | 9.8670699398e−54 |
| C220 | $x^{10} y^{10}$ | −3.3307534362e−47 | 1.2170423043e−53 |
| C222 | $x^8 y^{12}$ | 4.7017462222e−47 | 9.3961901328e−54 |
| C224 | $x^6 y^{14}$ | 1.5928343340e−46 | 4.2009174474e−54 |

TABLE 3d-continued for FIG. 3

| Coefficient | Formula | M10 | M11 |
|---|---|---|---|
| C226 | $x^4 y^{16}$ | 1.6372391506e−46 | 8.9550533027e−55 |
| C228 | $x^2 y^{18}$ | 2.7290698890e−46 | 1.5253757310e−56 |
| C230 | $y^{20}$ | 7.1653806087e−47 | −1.8045578293e−56 |
| C232 | $x^{20} y$ | −1.5557530817e−53 | 7.0627997627e−61 |
| C234 | $x^{18} y^3$ | −7.6874309783e−52 | −8.0490128342e−60 |
| C236 | $x^{16} y^5$ | −9.2309209046e−51 | −6.2054518548e−60 |
| C238 | $x^{14} y^7$ | −3.0920858541e−50 | −2.9024085791e−59 |
| C240 | $x^{12} y^9$ | −2.4123131534e−50 | −4.6996108463e−58 |
| C242 | $x^{10} y^{11}$ | −2.1230649056e−49 | −1.3519096896e−57 |
| C244 | $x^8 y^{13}$ | −1.5841186759e−49 | −1.9064594700e−57 |
| C246 | $x^6 y^{15}$ | −1.1385423316e−49 | −1.5837079270e−57 |
| C248 | $x^4 y^{17}$ | 8.2942189255e−50 | −8.3527425239e−58 |
| C250 | $x^2 y^{19}$ | −1.2399625495e−49 | −2.3562483130e−58 |
| C252 | $y^{21}$ | −5.4953242371e−51 | −2.3769805373e−59 |
| C253 | $x^{22}$ | 6.5863530501e−58 | −3.6342029038e−63 |
| C255 | $x^{20} y^2$ | 2.0963181489e−55 | −1.4433750110e−61 |
| C257 | $x^{18} y^4$ | 4.9123313973e−54 | −1.1596127038e−60 |
| C259 | $x^{16} y^6$ | 2.5005196495e−53 | −4.5049908232e−60 |
| C261 | $x^{14} y^8$ | 2.9688471958e−53 | −1.0488501650e−59 |
| C263 | $x^{12} y^{10}$ | 1.1384998829e−52 | −1.6065880741e−59 |
| C265 | $x^{10} y^{12}$ | −4.5646089365e−53 | −1.6457817075e−59 |
| C267 | $x^8 y^{14}$ | 4.2159820767e−53 | −1.1031569638e−59 |
| C269 | $x^6 y^{16}$ | 7.9379889950e−53 | −4.4788812744e−60 |
| C271 | $x^4 y^{18}$ | 1.3569022090e−52 | −9.6477177678e−61 |
| C273 | $x^2 y^{20}$ | −2.2227634963e−52 | −6.3911045981e−62 |
| C275 | $y^{22}$ | −4.4173883147e−54 | 7.7024114313e−63 |

TABLE 4 for FIG. 3
Coordinates of the stop edge

| $x_i$ [mm] | $y_i$ [mm] | $x_{i+N/2}$ [mm] | $y_{i+N/2}$ [mm] |
|---|---|---|---|
| −371.701055 | 57.193754 | 374.436149 | 46.430308 |
| −370.018750 | 62.373100 | 375.482415 | 40.845743 |
| −368.131269 | 67.417997 | 376.310521 | 35.125798 |
| −366.042303 | 72.328927 | 376.917804 | 29.270475 |
| −363.755654 | 77.106483 | 377.301881 | 23.279877 |
| −361.275215 | 81.751374 | 377.460659 | 17.154214 |
| −358.604931 | 86.264434 | 377.392348 | 10.893823 |
| −355.748778 | 90.646625 | 377.095454 | 4.499176 |
| −352.710738 | 94.899037 | 376.568779 | −2.029091 |
| −349.494775 | 99.022893 | 375.811402 | −8.690161 |
| −346.104819 | 103.019544 | 374.822664 | −15.483004 |
| −342.544746 | 106.890467 | 373.602137 | −22.406354 |
| −338.818365 | 110.637256 | 372.149599 | −29.458676 |
| −334.929409 | 114.261620 | 370.464992 | −36.638132 |
| −330.881523 | 117.765369 | 368.548392 | −43.942552 |
| −326.678258 | 121.150409 | 366.399966 | −51.369395 |
| −322.323071 | 124.418732 | 364.019930 | −58.915712 |
| −317.819322 | 127.572405 | 361.408515 | −66.578115 |
| −313.170273 | 130.613562 | 358.565929 | −74.352732 |
| −308.379098 | 133.544391 | 355.492320 | −82.235172 |
| −303.448885 | 136.367133 | 352.187751 | −90.220492 |
| −298.382646 | 139.084062 | 348.652172 | −98.303152 |
| −293.183323 | 141.697487 | 344.885407 | −106.476988 |
| −287.853803 | 144.209740 | 340.887138 | −114.735178 |
| −282.396921 | 146.623164 | 336.656904 | −123.070210 |
| −276.815472 | 148.940116 | 332.194105 | −131.473861 |
| −271.112223 | 151.162950 | 327.498012 | −139.937173 |
| −265.289914 | 153.294014 | 322.567786 | −148.450441 |
| −259.351268 | 155.335648 | 317.402502 | −157.003201 |
| −253.298994 | 157.290169 | 312.001185 | −165.584231 |
| −247.135790 | 159.159874 | 306.362839 | −174.181554 |
| −240.864349 | 160.947028 | 300.486497 | −182.782450 |
| −234.487356 | 162.653863 | 294.371263 | −191.373479 |
| −228.007493 | 164.282572 | 288.016360 | −199.940504 |
| −221.427438 | 165.835304 | 281.421184 | −208.468729 |
| −214.749869 | 167.314166 | 274.585355 | −216.942737 |
| −207.977466 | 168.721211 | 267.508773 | −225.346539 |
| −201.112913 | 170.058443 | 260.191668 | −233.663622 |
| −194.158903 | 171.327814 | 252.634655 | −241.877003 |

TABLE 4-continued for FIG. 3
Coordinates of the stop edge

| $x_i$ [mm] | $y_i$ [mm] | $x_{i+N/2}$ [mm] | $y_{i+N/2}$ [mm] |
|---|---|---|---|
| −187.118144 | 172.531217 | 244.838786 | −249.969290 |
| −179.993361 | 173.670492 | 236.805600 | −257.922745 |
| −172.787309 | 174.747419 | 228.537169 | −265.719339 |
| −165.502772 | 175.763719 | 220.036143 | −273.340830 |
| −158.142579 | 176.721052 | 211.305793 | −280.768822 |
| −150.709603 | 177.621017 | 202.350049 | −287.984847 |
| −143.206775 | 178.465151 | 193.173534 | −294.970434 |
| −135.637084 | 179.254924 | 183.781593 | −301.707191 |
| −128.003592 | 179.991743 | 174.180318 | −308.176890 |
| −120.309431 | 180.676944 | 164.376572 | −314.361556 |
| −112.557814 | 181.311797 | 154.377994 | −320.243559 |
| −104.752034 | 181.897500 | 144.193018 | −325.805712 |
| −96.895472 | 182.435178 | 133.830862 | −331.031368 |
| −88.991594 | 182.925880 | 123.301529 | −335.904532 |
| −81.043954 | 183.370582 | 112.615786 | −340.409958 |
| −73.056195 | 183.770179 | 101.785144 | −344.533264 |
| −65.032041 | 184.125487 | 90.821823 | −348.261034 |
| −56.975301 | 184.437243 | 79.738715 | −351.580926 |
| −48.889860 | 184.706099 | 68.549330 | −354.481770 |
| −40.779674 | 184.932623 | 57.267741 | −356.953668 |
| −32.648763 | 185.117297 | 45.908520 | −358.988079 |
| −24.501203 | 185.260520 | 34.486664 | −360.577902 |
| −16.341114 | 185.362600 | 23.017520 | −361.717536 |
| −8.172653 | 185.423760 | 11.516701 | −362.402944 |
| 0.000000 | 185.444131 | 0.000000 | −362.631685 |
| 8.172653 | 185.423760 | −11.516701 | −362.402944 |
| 16.341114 | 185.362600 | −23.017520 | −361.717536 |
| 24.501203 | 185.260520 | −34.486664 | −360.577902 |
| 32.648763 | 185.117297 | −45.908520 | −358.988079 |
| 40.779674 | 184.932623 | −57.267741 | −356.953668 |
| 48.889860 | 184.706099 | −68.549330 | −354.481770 |
| 56.975301 | 184.437243 | −79.738715 | −351.580926 |
| 65.032041 | 184.125487 | −90.821823 | −348.261034 |
| 73.056195 | 183.770179 | −101.785144 | −344.533264 |
| 81.043954 | 183.370582 | −112.615786 | −340.409958 |
| 88.991594 | 182.925880 | −123.301529 | −335.904532 |
| 96.895472 | 182.435178 | −133.830862 | −331.031368 |
| 104.752034 | 181.897500 | −144.193018 | −325.805712 |
| 112.557814 | 181.311797 | −154.377994 | −320.243559 |
| 120.309431 | 180.676944 | −164.376572 | −314.361556 |
| 128.003592 | 179.991743 | −174.180318 | −308.176890 |
| 135.637084 | 179.254924 | −183.781593 | −301.707191 |
| 143.206775 | 178.465151 | −193.173534 | −294.970434 |
| 150.709603 | 177.621017 | −202.350049 | −287.984847 |
| 158.142579 | 176.721052 | −211.305793 | −280.768822 |
| 165.502772 | 175.763719 | −220.036143 | −273.340830 |
| 172.787309 | 174.747419 | −228.537169 | −265.719339 |
| 179.993361 | 173.670492 | −236.805600 | −257.922745 |
| 187.118144 | 172.531217 | −244.838786 | −249.969290 |
| 194.158903 | 171.327814 | −252.634655 | −241.877003 |
| 201.112913 | 170.058443 | −260.191668 | −233.663622 |
| 207.977466 | 168.721211 | −267.508773 | −225.346539 |
| 214.749869 | 167.314166 | −274.585355 | −216.942737 |
| 221.427438 | 165.835304 | −281.421184 | −208.468729 |
| 228.007493 | 164.282572 | −288.016360 | −199.940504 |
| 234.487356 | 162.653863 | −294.371263 | −191.373479 |
| 240.864349 | 160.947028 | −300.486497 | −182.782450 |
| 247.135790 | 159.159874 | −306.362839 | −174.181554 |
| 253.298994 | 157.290169 | −312.001185 | −165.584231 |
| 259.351268 | 155.335648 | −317.402502 | −157.003201 |
| 265.289914 | 153.294014 | −322.567786 | −148.450441 |
| 271.112223 | 151.162950 | −327.498012 | −139.937173 |
| 276.815472 | 148.940116 | −332.194105 | −131.473861 |
| 282.396921 | 146.623164 | −336.656904 | −123.070210 |
| 287.853803 | 144.209740 | −340.887138 | −114.735178 |
| 293.183323 | 141.697487 | −344.885407 | −106.476988 |
| 298.382646 | 139.084062 | −348.652172 | −98.303152 |
| 303.448885 | 136.367133 | −352.187751 | −90.220492 |
| 308.379098 | 133.544391 | −355.492320 | −82.235172 |
| 313.170273 | 130.613562 | −358.565929 | −74.352732 |
| 317.819322 | 127.572405 | −361.408515 | −66.578115 |
| 322.323071 | 124.418732 | −364.019930 | −58.915712 |
| 326.678258 | 121.150409 | −366.399966 | −51.369395 |
| 330.881523 | 117.765369 | −368.548392 | −43.942552 |
| 334.929409 | 114.261620 | −370.464992 | −36.638132 |

TABLE 4-continued for FIG. 3
Coordinates of the stop edge

| $x_i$ [mm] | $y_i$ [mm] | $x_{i+N/2}$ [mm] | $y_{i+N/2}$ [mm] |
|---|---|---|---|
| 338.818365 | 110.637256 | −372.149599 | −29.458676 |
| 342.544746 | 106.890467 | −373.602137 | −22.406354 |
| 346.104819 | 103.019544 | −374.822664 | −15.483004 |
| 349.494775 | 99.022893 | −375.811402 | −8.690161 |
| 352.710738 | 94.899037 | −376.568779 | −2.029091 |
| 355.748778 | 90.646625 | −377.095454 | 4.499176 |
| 358.604931 | 86.264434 | −377.392348 | 10.893823 |
| 361.275215 | 81.751374 | −377.460659 | 17.154214 |
| 363.755654 | 77.106483 | −377.301881 | 23.279877 |
| 366.042303 | 72.328927 | −376.917804 | 29.270475 |
| 368.131269 | 67.417997 | −376.310521 | 35.125798 |
| 370.018750 | 62.373100 | −375.482415 | 40.845743 |
| 371.701055 | 57.193754 | −374.436149 | 46.430308 |
| 373.174643 | 51.879583 | −373.174643 | 51.879583 |

The mirrors M1, M4, M5, M6, M7 and M11 have negative values for the radius, i.e. they are, in principle, concave mirrors. The mirror M10 has positive radius values, that is to say in principle is a convex mirror. The mirrors M2, M3, M8 and M9 have $R_x$, $R_y$ radius values with differing signs in each case, i.e. are saddle-shaped as a matter of principle.

Further data of the projection optical unit 7 arise from Table 5 below:

TABLE 5 for FIG. 3

| NA | Numerical aperture | 0.75 |
|---|---|---|
| $|\beta x|$ | Magnification scale in the cross-scan direction | 4.3 |
| $|\beta y|$ | Magnification scale in the scan direction | 8.0 |
| RMS | Scanned wavefront deviation | 7.7 mλ |
| N | Number of mirrors | 11 |

The projection optical unit 31 has an object/image offset a of 3468 mm. The working distance b is present between the object plane 5 and the reflection portion of the mirror M5, closest thereto, in the case of the projection optical unit 31 and is 277 mm. The meridional transverse dimension c is present between the separation plane 31a and the reflection portion of the mirror M11, furthest therefrom, in the case of the projection optical unit 31 and is 4112 mm.

The ratio a/c is 0.84 in the case of the projection optical unit 31. The ratio b/c is 0.067 in the case of the projection optical unit 31.

Figure 4:
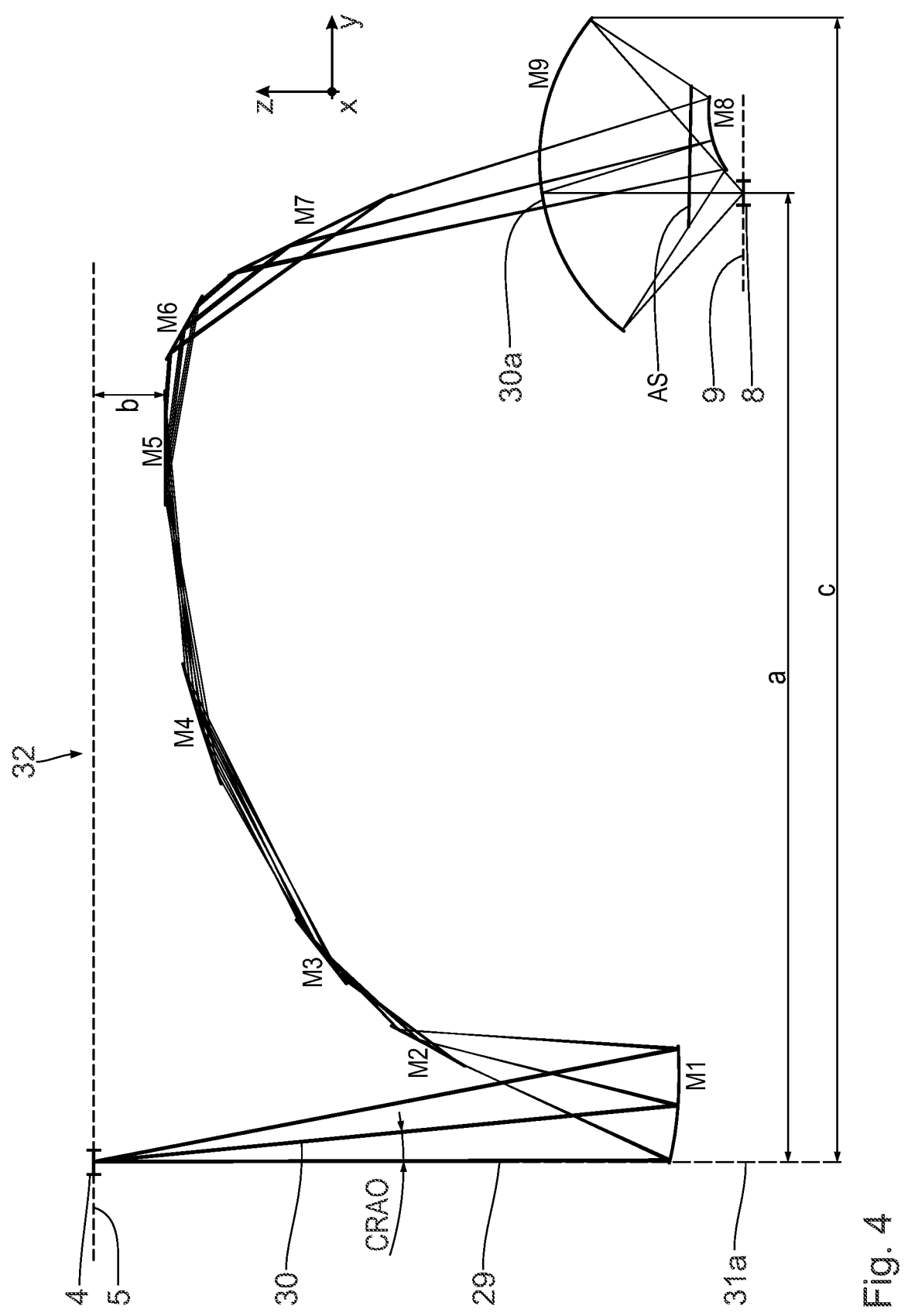
FIG. 4 shows, in an illustration similar to FIG. 2, a further embodiment of an imaging optical unit which is usable as a projection optical unit in the projection exposure apparatus in FIG. 1.

FIG. 4 shows a further embodiment of a projection optical unit or imaging optical unit 32, which can be used in the projection exposure apparatus 1 instead of the projection optical unit 7. Components and functions corresponding to those which have already been explained above with reference to FIGS. 1 to 3, and for example in conjunction with FIGS. 2 and 3, are denoted by the same reference signs and are not discussed in detail again.

The projection optical unit 32 has an image-side numerical aperture of 0.75.

The projection optical unit 32 according to FIG. 4 has a total of nine mirrors M1 to M9. The mirrors M1, M8 and M9 are embodied as mirrors for normal incidence (NI mirrors). The mirrors M2 to M7 are each embodied as mirrors for grazing incidence (GI mirrors). The projection optical unit 32 therefore comprises three NI mirrors and six GI mirrors.

The NI mirrors M2 to M7 reflect the imaging light 3 in such a way that the angles of reflection of the individual rays 29 at the respective mirrors M2 to M7 add up, i.e., lead to an amplification of the deflection effect thereof. The projection optical unit 32 has no counter GI image.

The projection optical unit 32 is approximately telecentric on the object side. If the imaging beam path is only taken into account in relation to the individual rays that pass through the object field 4, the entrance pupil is located 4161.14 mm downstream of the object field 5 in the xz-plane and −8870.82 mm upstream of the object field 4 in the yz-plane.

In the projection optical unit 32, a pupil plane is located in the imaging beam path between the mirrors M1 and M2. A first intermediate image plane is located in the beam path between the mirrors M2 and M3. A further pupil plane is located between the mirrors M3 and M4. A further intermediate image plane is located in the region of a reflection on the mirror M5. The number of intermediate image planes differs from the number of intermediate images in the meridional plane according to FIG. 4 from the number of intermediate images in a plane perpendicular thereto. Such projection optical units with different numbers of intermediate images in mutually perpendicular planes are known from WO 2016/166080 A1 and DE 10 2015 226 531 A1 as a matter of principle.

Apart from the number of GI mirrors and the lack of an arrangement of a counter GI mirror, the projection optical unit 32, in terms of its basic structure, corresponds to the projection optical unit 31.

The optical design data for the projection optical unit 32 according to FIG. 4 emerge from following Tables 1 to 5, which correspond to Tables 1 to 5 relating to the embodiment according to FIGS. 2 and 3.

TABLE 1 for FIG. 4
Radii of the surfaces

| | Radius$_x$ [mm] | Power$_x$ [1/mm] | Radius$_y$ [mm] | Power$_y$ [1/mm] |
|---|---|---|---|---|
| M01 | −3931.11630815 | 0.00049656 | −1570.16464240 | 0.00124320 |
| M02 | 9512.50982020 | −0.00002036 | 2049.16697170 | −0.00009454 |
| M03 | −91911.65122096 | 0.00000493 | −2602.53714561 | 0.00017414 |
| M04 | −8651.81713679 | 0.00004489 | −6046.86509997 | 0.00006423 |
| M05 | −5333.06971216 | 0.00003112 | 39552.26448106 | −0.00000420 |
| M06 | −1352.11765463 | 0.00062514 | −77594.92535249 | 0.00001089 |
| M07 | −2009.01512338 | 0.00015842 | −1052559.66276600 | 0.00000030 |
| M08 | 3102.28733421 | −0.00057798 | 350.18779350 | −0.00512030 |
| M09 | −928.41786149 | 0.00213630 | −837.58384060 | 0.00236798 |

TABLE 2 for FIG. 4
Decentring (location, angle) the surfaces

| | $D_x$ [mm] | $D_y$ [mm] | $D_z$ [mm] |
|---|---|---|---|
| Reticle | 0.000000000 | 0.000000000 | 0.000000000 |
| M01 | 0.000000000 | −211.605112018 | 2247.749211410 |
| M02 | 0.000000000 | −466.238794346 | 1256.764264416 |
| M03 | 0.000000000 | −830.524863567 | 854.643609596 |
| M04 | 0.000000000 | −1749.684424872 | 392.268623409 |
| M05 | 0.000000000 | −2665.245104306 | 276.266123045 |
| M06 | 0.000000000 | −3203.432432941 | 343.977562379 |
| M07 | 0.000000000 | −3527.522530730 | 752.909191048 |
| M08 | 0.000000000 | −3873.868039472 | 2404.329641621 |
| Stop | 0.000000000 | −3850.746553899 | 2294.083389947 |
| M09 | 0.000000000 | −3731.228414250 | 1724.205348944 |
| Wafer | 0.000000000 | −3731.228414184 | 2499.960932794 |

| | $\alpha_x$ [°] | $\alpha_y$ [°] | $\alpha_z$ [°] |
|---|---|---|---|
| Reticle | 0.000000000 | 0.000000000 | 0.000000000 |
| M01 | −4.516194018 | 0.000000000 | 0.000000000 |
| M02 | 241.707883459 | 0.000000000 | −0.000000000 |
| M03 | 217.265226606 | −0.000000000 | −0.000000000 |
| M04 | 196.962616285 | −0.000000000 | −0.000000000 |
| M05 | 180.025016609 | −0.000000000 | −0.000000000 |
| M06 | 150.613455982 | −0.000000000 | −0.000000000 |
| M07 | 115.121285503 | −0.000000000 | −0.000000000 |
| M08 | 11.844732475 | 0.000000000 | −0.000000000 |
| Stop | 178.951384148 | −0.000000000 | −0.000000000 |
| M09 | 185.922366235 | −0.000000000 | −0.000000000 |
| Wafer | −0.000000005 | 0.000000000 | 180.000000000 |

TABLE 3a for FIG. 4
Free-form coefficients of the surfaces

| Coefficient | Formula | M01 | M02 | M03 |
|---|---|---|---|---|
| C2 | $y$ | −2.8035400493e−04 | −1.6448533553e−03 | −8.1992834859e−04 |
| C7 | $x^2 y$ | −4.0339570673e−09 | −1.4265193251e−07 | −1.5045516468e−07 |
| C9 | $y^3$ | −1.4380695310e−08 | 6.9599256764e−07 | 7.1973243071e−08 |
| C10 | $x^4$ | 2.1535869995e−11 | 3.9718754449e−11 | 3.4225516079e−11 |
| C12 | $x^2 y^2$ | 1.0121822719e−11 | −7.8806415289e−10 | 9.4867156461e−11 |
| C14 | $y^4$ | −2.3214890328e−11 | 7.1914918084e−10 | −4.0271812483e−11 |
| C16 | $x^4 y$ | 2.7852549771e−14 | 2.2186203226e−13 | 1.3159111447e−13 |
| C18 | $x^2 y^3$ | −2.0859708359e−14 | −1.5392968391e−12 | −7.5759629529e−14 |
| C20 | $y^5$ | −5.6995662783e−14 | −5.0666504433e−12 | 8.8973157640e−14 |
| C21 | $y^6$ | 2.5786707517e−17 | −1.2548649733e−16 | −2.9457886234e−16 |
| C23 | $x^4 y^2$ | 3.4859066581e−17 | 4.1217458586e−16 | −4.6755938349e−17 |
| C25 | $x^2 y^4$ | −1.8344996941e−17 | −2.8240228462e−15 | 1.3367514212e−16 |
| C27 | $y^6$ | −1.0648759341e−16 | −5.2123844722e−14 | 9.3023660680e−16 |
| C29 | $x^6 y$ | 8.1376082326e−21 | 1.1699024297e−19 | 4.8075419760e−21 |
| C31 | $x^4 y^3$ | 1.0782185972e−19 | −3.2979326062e−18 | −4.6608002541e−20 |
| C33 | $x^2 y^5$ | −3.5912132978e−21 | 1.9831366355e−17 | −3.4583978760e−19 |
| C35 | $y^7$ | −3.0906795136e−19 | −3.5591471028e−16 | −4.9693813006e−18 |
| C36 | $x^8$ | 1.5671007700e−23 | −7.2916040661e−22 | −1.6146300607e−21 |
| C38 | $x^6 y^2$ | 5.0195942922e−23 | 5.2196521238e−21 | 3.4914926160e−22 |
| C40 | $x^4 y^4$ | 8.7802022030e−23 | −3.1881628357e−20 | 1.2757168190e−22 |
| C42 | $x^2 x^6$ | −1.9144971898e−22 | 3.0429844582e−19 | −1.7640353737e−20 |
| C44 | $y^8$ | −1.8896345075e−21 | −1.5021253713e−18 | −4.7852043740e−20 |
| C46 | $x^8 y$ | −3.6709847965e−25 | 2.1295523826e−24 | 1.9100631517e−24 |
| C48 | $x^6 y^3$ | −2.7400276816e−24 | 4.2544477421e−23 | −1.1512547475e−25 |
| C50 | $x^4 y^5$ | −6.8334963849e−24 | −1.3823316678e−22 | 8.1487362262e−24 |
| C52 | $x^2 y^7$ | −4.1563573338e−24 | 2.6352073752e−21 | −2.3650220370e−23 |
| C54 | $y^9$ | 6.8758832365e−24 | 1.0614487970e−21 | 3.9226883475e−22 |
| C55 | $x^{10}$ | −1.9962184434e−28 | 2.4618729684e−27 | 8.0329108849e−27 |
| C57 | $x^8 y^2$ | −1.0543328283e−27 | −5.1058266225e−27 | −1.7482282318e−27 |
| C59 | $x^6 y^4$ | 1.3228047093e−27 | 3.1972290836e−25 | −1.0120190869e−26 |
| C61 | $x^4 y^6$ | 1.0846113186e−26 | −1.1863805003e−24 | 2.0634081662e−25 |
| C63 | $x^2 y^8$ | 1.9251684835e−26 | 9.4882245555e−24 | 8.7053203606e−25 |
| C65 | $y^{10}$ | 2.2022467633e−25 | 3.0536533866e−23 | 1.8341252643e−24 |
| C67 | $x^{10} y$ | 7.6323638913e−30 | −1.8583365267e−29 | −8.9313041345e−30 |
| C69 | $x^8 y^3$ | 8.4202030441e−29 | −3.5189138561e−28 | −9.3489338712e−32 |
| C71 | $x^6 y^5$ | 3.5859900550e−28 | −6.8011041903e−28 | −1.9146783857e−28 |
| C73 | $x^4 y^7$ | 7.4168868476e−28 | −1.8328795163e−26 | 3.2563675364e−28 |

TABLE 3a-continued for FIG. 4
Free-form coefficients of the surfaces

| Coefficient | Formula | M01 | M02 | M03 |
|---|---|---|---|---|
| C75 | $x^2 y^9$ | −9.4459308196e−29 | −3.1706314139e−26 | 1.3044082536e−27 |
| C77 | $y^{11}$ | −6.0054042995e−28 | 1.2334232039e−26 | −2.5726922000e−26 |
| C78 | $x^{12}$ | 1.8541449239e−33 | −5.2391990154e−33 | −4.0114952403e−32 |
| C80 | $x^{10} y^2$ | 1.4680539713e−32 | 9.8314735561e−33 | −2.7917715845e−34 |
| C82 | $x^8 y^4$ | −7.8676740834e−32 | −1.9232206365e−30 | 1.3626045847e−31 |
| C84 | $x^6 y^6$ | −1.0788249758e−30 | −5.5461660647e−31 | −1.2079816853e−30 |
| C86 | $x^4 y^8$ | −1.7712475904e−30 | −2.1856773191e−29 | −1.0130696138e−29 |
| C88 | $x^2 y^{10}$ | −1.3471823074e−30 | −3.4613462211e−28 | −2.5305198323e−29 |
| C90 | $y^{12}$ | −1.4429973874e−29 | 6.0289181525e−28 | −5.2612034015e−29 |
| C92 | $x^{12} y$ | −1.3285941055e−34 | 1.0986998869e−34 | 4.9312519077e−35 |
| C94 | $x^{10} y^3$ | −1.8728839241e−33 | 1.5183939089e−33 | −9.6120635102e−36 |
| C96 | $x^8 y^5$ | −1.0711375454e−32 | 1.3164715014e−32 | 1.4723135607e−33 |
| C98 | $x^6 y^7$ | −3.5056894197e−32 | 1.4583876130e−31 | 5.0346596370e−33 |
| C100 | $x^4 y^9$ | −5.5558550295e−32 | 1.0095938158e−30 | −4.3197623857e−32 |
| C102 | $x^2 y^{11}$ | 2.8003327721e−32 | −9.0535377855e−31 | 4.8295403248e−32 |
| C104 | $y^{13}$ | 3.9728487120e−32 | 1.0911580202e−29 | 1.0008404959e−30 |
| C105 | $x^{14}$ | −1.6829759824e−38 | −8.0840904297e−39 | 1.2801127188e−37 |
| C107 | $x^{12} y^2$ | −1.0467858664e−37 | −3.0727509908e−37 | −1.0787284463e−38 |
| C109 | $x^{10} y^4$ | 2.2932241841e−36 | 5.1953742882e−36 | −7.5380122253e−37 |
| C111 | $x^8 y^6$ | 3.4019952946e−35 | 2.7622159003e−35 | 2.8736627198e−36 |
| C113 | $x^6 y^8$ | 1.2870985168e−34 | −1.9581153375e−34 | 6.0740560662e−35 |
| C115 | $x^4 y^{10}$ | 7.1434992901e−35 | 4.4436347487e−33 | 1.6795913244e−34 |
| C117 | $x^2 y^{12}$ | 1.3752280668e−35 | −4.1116650942e−33 | 6.4081860049e−34 |
| C119 | $y^{14}$ | 5.8282157419e−34 | −6.9254175620e−34 | 7.4755488932e−34 |
| C121 | $x^{14} y$ | 1.6006404041e−39 | −4.5994587629e−40 | −1.9108797125e−40 |
| C123 | $x^{12} y^3$ | 2.7806963650e−38 | −4.9175955768e−39 | 1.8155394553e−40 |
| C125 | $x^{10} y^5$ | 2.0415479612e−37 | −8.3058357142e−38 | −4.5884494595e−39 |
| C127 | $x^8 y^7$ | 8.7837766468e−37 | −9.0957343223e−37 | −5.0941053283e−38 |
| C129 | $x^6 y^9$ | 2.3228792342e−36 | −8.7364551678e−36 | 7.0388472944e−38 |
| C131 | $x^4 y^{11}$ | 2.5480650127e−36 | −7.6182058023e−36 | 9.0337718156e−37 |
| C133 | $x^2 y^{13}$ | −2.5330279174e−36 | −3.2455989608e−35 | −2.4962950651e−36 |
| C135 | $y^{15}$ | −2.2061284181e−36 | −5.2546457066e−34 | −2.1537930115e−35 |
| C136 | $x^{16}$ | 1.1383116153e−43 | 4.6134601534e−44 | −1.6732317081e−43 |
| C138 | $x^{14} y^2$ | 6.6583041568e−44 | 7.4028014380e−43 | 5.1516847865e−44 |
| C140 | $x^{12} y^4$ | −3.5532663366e−41 | −3.2291663065e−42 | 1.4283597547e−42 |
| C142 | $x^{10} y^6$ | −5.5386341132e−40 | −6.1624931086e−41 | −7.0855340081e−43 |
| C144 | $x^8 y^8$ | −3.1233928680e−39 | 1.0206311584e−39 | −1.2377309847e−40 |
| C146 | $x^6 y^{10}$ | −6.3759298763e−39 | −1.0993194156e−38 | −6.7456031568e−40 |
| C148 | $x^4 y^{12}$ | 1.6422430558e−39 | −6.0007280149e−38 | −9.3697874041e−40 |
| C150 | $x^2 y^{14}$ | 2.5031551277e−39 | −9.8784556327e−38 | −9.3457850511e−39 |
| C152 | $y^{16}$ | −1.5889338968e−38 | −2.5334051941e−36 | 2.5198928582e−40 |
| C154 | $x^{16} y$ | −1.2901300057e−44 | 7.8364334518e−46 | 3.0383372734e−46 |
| C156 | $x^{14} y^3$ | −2.7001791597e−43 | 6.1181768185e−45 | −4.6804178507e−46 |
| C158 | $x^{12} y^5$ | −2.4669412150e−42 | 1.7061739955e−43 | 4.7561262422e−45 |
| C160 | $x^{10} y^7$ | −1.3408169830e−41 | 2.3779830514e−42 | 1.0910367772e−43 |
| C162 | $x^8 y^9$ | −4.6537303136e−41 | 2.5810336301e−41 | 4.1542091892e−43 |
| C164 | $x^6 y^{11}$ | −9.7599138870e−41 | 7.3112347639e−41 | −1.9958832693e−42 |
| C166 | $x^4 y^{13}$ | −5.9459311599e−41 | −4.8220899053e−41 | −4.7351257764e−42 |
| C168 | $x^2 y^{15}$ | 1.2720447494e−40 | −8.4809471974e−41 | 2.4401389987e−41 |
| C170 | $y^{17}$ | 8.2411634751e−41 | −3.7518921770e−39 | 2.1345403254e−40 |
| C171 | $x^{18}$ | −5.2010804722e−49 | 0.0000000000e+00 | 0.0000000000e+00 |
| C173 | $x^{16} y^2$ | 4.6552952197e−48 | 0.0000000000e+00 | 0.0000000000e+00 |
| C175 | $x^{14} y^4$ | 3.1771147417e−46 | 0.0000000000e+00 | 0.0000000000e+00 |
| C177 | $x^{12} y^6$ | 5.2114551883e−45 | 0.0000000000e+00 | 0.0000000000e+00 |
| C179 | $x^{10} y^8$ | 3.7966577141e−44 | 0.0000000000e+00 | 0.0000000000e+00 |
| C181 | $x^8 y^{10}$ | 1.2968787476e−43 | 0.0000000000e+00 | 0.0000000000e+00 |
| C183 | $x^6 y^{12}$ | 1.4542909181e−43 | 0.0000000000e+00 | 0.0000000000e+00 |
| C185 | $x^4 y^{14}$ | −2.1274209641e−43 | 0.0000000000e+00 | 0.0000000000e+00 |
| C187 | $x^2 y^{16}$ | −1.3772108729e−43 | 0.0000000000e+00 | 0.0000000000e+00 |
| C189 | $y^{18}$ | 2.8828999315e−43 | 0.0000000000e+00 | 0.0000000000e+00 |
| C191 | $x^{18} y$ | 6.8747666500e−50 | 0.0000000000e+00 | 0.0000000000e+00 |
| C193 | $x^{16} y^3$ | 1.6916457672e−48 | 0.0000000000e+00 | 0.0000000000e+00 |
| C195 | $x^{14} y^5$ | 1.8657042468e−47 | 0.0000000000e+00 | 0.0000000000e+00 |
| C197 | $x^{12} y^7$ | 1.2497955372e−46 | 0.0000000000e+00 | 0.0000000000e+00 |
| C199 | $x^{10} y^9$ | 5.4091025908e−46 | 0.0000000000e+00 | 0.0000000000e+00 |
| C201 | $x^8 y^{11}$ | 1.5332821025e−45 | 0.0000000000e+00 | 0.0000000000e+00 |
| C203 | $x^6 y^{13}$ | 2.4431547493e−45 | 0.0000000000e+00 | 0.0000000000e+00 |
| C205 | $x^4 y^{15}$ | 2.2357622797e−46 | 0.0000000000e+00 | 0.0000000000e+00 |
| C207 | $x^2 y^{17}$ | −3.8156071226e−45 | 0.0000000000e+00 | 0.0000000000e+00 |
| C209 | $y^{19}$ | −1.9780451731e−45 | 0.0000000000e+00 | 0.0000000000e+00 |
| C210 | $x^{20}$ | 1.5074597316e−54 | 0.0000000000e+00 | 0.0000000000e+00 |
| C212 | $x^{18} y^2$ | −3.5024384387e−53 | 0.0000000000e+00 | 0.0000000000e+00 |
| C214 | $x^{16} y^4$ | −1.6498258573e−51 | 0.0000000000e+00 | 0.0000000000e+00 |
| C216 | $x^{14} y^6$ | −2.8501261062e−50 | 0.0000000000e+00 | 0.0000000000e+00 |
| C218 | $x^{12} y^8$ | −2.5116502593e−49 | 0.0000000000e+00 | 0.0000000000e+00 |

TABLE 3a-continued for FIG. 4
Free-form coefficients of the surfaces

| Coefficient | Formula | M01 | M02 | M03 |
|---|---|---|---|---|
| C220 | $x^{10} y^{10}$ | −1.1751075664e−48 | 0.0000000000e+00 | 0.0000000000e+00 |
| C222 | $x^{8} y^{12}$ | −2.7048362223e−48 | 0.0000000000e+00 | 0.0000000000e+00 |
| C224 | $x^{6} y^{14}$ | −1.0365538736e−48 | 0.0000000000e+00 | 0.0000000000e+00 |
| C226 | $x^{4} y^{16}$ | 6.7278997311e−48 | 0.0000000000e+00 | 0.0000000000e+00 |
| C228 | $x^{2} y^{18}$ | 3.1593457232e−48 | 0.0000000000e+00 | 0.0000000000e+00 |
| C230 | $y^{20}$ | −3.3426013289e−48 | 0.0000000000e+00 | 0.0000000000e+00 |
| C232 | $x^{20} y$ | −2.3275454579e−55 | 0.0000000000e+00 | 0.0000000000e+00 |
| C234 | $x^{18} y^{3}$ | −6.5838004778e−54 | 0.0000000000e+00 | 0.0000000000e+00 |
| C236 | $x^{16} y^{5}$ | −8.5358922407e−53 | 0.0000000000e+00 | 0.0000000000e+00 |
| C238 | $x^{14} y^{7}$ | −6.8601309056e−52 | 0.0000000000e+00 | 0.0000000000e+00 |
| C240 | $x^{12} y^{9}$ | −3.6346432388e−51 | 0.0000000000e+00 | 0.0000000000e+00 |
| C242 | $x^{10} y^{11}$ | −1.2811570294e−50 | 0.0000000000e+00 | 0.0000000000e+00 |
| C244 | $x^{8} y^{13}$ | −2.9597819821e−50 | 0.0000000000e+00 | 0.0000000000e+00 |
| C246 | $x^{6} y^{15}$ | −3.3113941481e−50 | 0.0000000000e+00 | 0.0000000000e+00 |
| C248 | $x^{4} y^{17}$ | 2.0137888698e−50 | 0.0000000000e+00 | 0.0000000000e+00 |
| C250 | $x^{2} y^{19}$ | 6.7673907223e−50 | 0.0000000000e+00 | 0.0000000000e+00 |
| C252 | $y^{21}$ | 2.9295025055e−50 | 0.0000000000e+00 | 0.0000000000e+00 |
| C253 | $x^{22}$ | −2.4603692380e−60 | 0.0000000000e+00 | 0.0000000000e+00 |
| C255 | $x^{20} y^{2}$ | 1.0973062012e−58 | 0.0000000000e+00 | 0.0000000000e+00 |
| C257 | $x^{18} y^{4}$ | 4.6269535664e−57 | 0.0000000000e+00 | 0.0000000000e+00 |
| C259 | $x^{16} y^{6}$ | 8.4202946903e−56 | 0.0000000000e+00 | 0.0000000000e+00 |
| C261 | $x^{14} y^{8}$ | 8.6149657028e−55 | 0.0000000000e+00 | 0.0000000000e+00 |
| C263 | $x^{12} y^{10}$ | 5.0760581892e−54 | 0.0000000000e+00 | 0.0000000000e+00 |
| C265 | $x^{10} y^{12}$ | 1.7018652219e−53 | 0.0000000000e+00 | 0.0000000000e+00 |
| C267 | $x^{8} y^{14}$ | 2.6418541764e−53 | 0.0000000000e+00 | 0.0000000000e+00 |
| C269 | $x^{6} y^{16}$ | −1.2369940506e−53 | 0.0000000000e+00 | 0.0000000000e+00 |
| C271 | $x^{4} y^{18}$ | −9.4447695548e−53 | 0.0000000000e+00 | 0.0000000000e+00 |
| C273 | $x^{2} y^{20}$ | −3.4638064037e−53 | 0.0000000000e+00 | 0.0000000000e+00 |
| C275 | $y^{22}$ | 2.2803655011e−53 | 0.0000000000e+00 | 0.0000000000e+00 |
| C277 | $x^{22} y$ | 4.5360799915e−61 | 0.0000000000e+00 | 0.0000000000e+00 |
| C279 | $x^{20} y^{3}$ | 1.4474213680e−59 | 0.0000000000e+00 | 0.0000000000e+00 |
| C281 | $x^{18} y^{5}$ | 2.1591104991e−58 | 0.0000000000e+00 | 0.0000000000e+00 |
| C283 | $x^{16} y^{7}$ | 2.0291925467e−57 | 0.0000000000e+00 | 0.0000000000e+00 |
| C285 | $x^{14} y^{9}$ | 1.2891319706e−56 | 0.0000000000e+00 | 0.0000000000e+00 |
| C287 | $x^{12} y^{11}$ | 5.5300139583e−56 | 0.0000000000e+00 | 0.0000000000e+00 |
| C289 | $x^{10} y^{13}$ | 1.6132195435e−55 | 0.0000000000e+00 | 0.0000000000e+00 |
| C291 | $x^{8} y^{15}$ | 2.9862645686e−55 | 0.0000000000e+00 | 0.0000000000e+00 |
| C293 | $x^{6} y^{17}$ | 1.9042632836e−55 | 0.0000000000e+00 | 0.0000000000e+00 |
| C295 | $x^{4} y^{19}$ | −4.1396281321e−55 | 0.0000000000e+00 | 0.0000000000e+00 |
| C297 | $x^{2} y^{21}$ | −6.5369599736e−55 | 0.0000000000e+00 | 0.0000000000e+00 |
| C299 | $y^{23}$ | −2.4271746030e−55 | 0.0000000000e+00 | 0.0000000000e+00 |
| C300 | $x^{24}$ | 1.6865566354e−66 | 0.0000000000e+00 | 0.0000000000e+00 |
| C302 | $x^{22} y^{2}$ | −1.3218969952e−64 | 0.0000000000e+00 | 0.0000000000e+00 |
| C304 | $x^{20} y^{4}$ | −5.4230015849e−63 | 0.0000000000e+00 | 0.0000000000e+00 |
| C306 | $x^{18} y^{6}$ | −1.0401476060e−61 | 0.0000000000e+00 | 0.0000000000e+00 |
| C308 | $x^{16} y^{8}$ | −1.2001601142e−60 | 0.0000000000e+00 | 0.0000000000e+00 |
| C310 | $x^{14} y^{10}$ | −8.4941982153e−60 | 0.0000000000e+00 | 0.0000000000e+00 |
| C312 | $x^{12} y^{12}$ | −3.6856639792e−59 | 0.0000000000e+00 | 0.0000000000e+00 |
| C314 | $x^{10} y^{14}$ | −9.2680758504e−59 | 0.0000000000e+00 | 0.0000000000e+00 |
| C316 | $x^{8} y^{16}$ | −8.5859029721e−59 | 0.0000000000e+00 | 0.0000000000e+00 |
| C318 | $x^{6} y^{18}$ | 1.7584577359e−58 | 0.0000000000e+00 | 0.0000000000e+00 |
| C320 | $x^{4} y^{20}$ | 5.0909627775e−58 | 0.0000000000e+00 | 0.0000000000e+00 |
| C322 | $x^{2} y^{22}$ | 1.4777719596e−58 | 0.0000000000e+00 | 0.0000000000e+00 |
| C324 | $y^{24}$ | −7.2040307491e−59 | 0.0000000000e+00 | 0.0000000000e+00 |
| C326 | $x^{24} y$ | −3.8753396347e−67 | 0.0000000000e+00 | 0.0000000000e+00 |
| C328 | $x^{22} y^{3}$ | −1.3737971995e−65 | 0.0000000000e+00 | 0.0000000000e+00 |
| C330 | $x^{20} y^{5}$ | −2.3177535183e−64 | 0.0000000000e+00 | 0.0000000000e+00 |
| C332 | $x^{18} y^{7}$ | −2.4930374948e−63 | 0.0000000000e+00 | 0.0000000000e+00 |
| C334 | $x^{16} y^{9}$ | −1.8559546738e−62 | 0.0000000000e+00 | 0.0000000000e+00 |
| C336 | $x^{14} y^{11}$ | −9.5385810418e−62 | 0.0000000000e+00 | 0.0000000000e+00 |
| C338 | $x^{12} y^{13}$ | −3.3807095747e−61 | 0.0000000000e+00 | 0.0000000000e+00 |
| C340 | $x^{10} y^{15}$ | −8.2292905811e−61 | 0.0000000000e+00 | 0.0000000000e+00 |
| C342 | $x^{8} y^{17}$ | −1.1695390480e−60 | 0.0000000000e+00 | 0.0000000000e+00 |
| C344 | $x^{6} y^{19}$ | −7.5294071607e−62 | 0.0000000000e+00 | 0.0000000000e+00 |
| C346 | $x^{4} y^{21}$ | 2.5628883928e−60 | 0.0000000000e+00 | 0.0000000000e+00 |
| C348 | $x^{2} y^{23}$ | 2.6452321744e−60 | 0.0000000000e+00 | 0.0000000000e+00 |
| C350 | $y^{25}$ | 8.5436508124e−61 | 0.0000000000e+00 | 0.0000000000e+00 |

TABLE 3b

| | | for FIG. 4 | | |
|---|---|---|---|---|
| Coefficient | Formula | M04 | M05 | M06 |
| C2 | $y$ | 4.6035967040e−04 | 4.2479022324e−04 | −1.4460348051e−03 |
| C7 | $x^2 y$ | −1.7643375831e−08 | −1.1338573083e−08 | 3.1439768924e−08 |
| C9 | $y^3$ | 1.1528125385e−08 | −4.1185294086e−09 | −4.0468973801e−09 |
| C10 | $x^4$ | 6.5593351045e−11 | −7.6643929413e−11 | 4.8014291149e−12 |
| C12 | $x^2 y^2$ | 1.9091348846e−11 | 1.1364378618e−11 | −3.0966577413e−11 |
| C14 | $y^4$ | −1.2588382315e−11 | 1.3701842199e−11 | 8.6863010388e−11 |
| C16 | $x^4 y$ | −5.5910485534e−14 | 1.3443303219e−13 | −4.1095241663e−14 |
| C18 | $x^2 y^3$ | −2.6997808773e−14 | −2.7166057150e−14 | 7.1889204007e−15 |
| C20 | $y^5$ | −8.7706393844e−15 | −9.7703222446e−15 | −1.6090687634e−13 |
| C21 | $y^6$ | −1.2201045039e−16 | 1.1154016196e−16 | 7.1161579471e−18 |
| C23 | $x^4 y^2$ | 1.2815963979e−17 | −1.3515097010e−16 | −8.7856899972e−17 |
| C25 | $x^2 y^4$ | −8.2873735111e−18 | −3.0030214659e−17 | −1.0011525737e−16 |
| C27 | $y^6$ | −1.3764442088e−17 | −8.7071098527e−17 | −6.7886456239e−15 |
| C29 | $x^6 y$ | 4.8957213545e−20 | −2.7482753799e−19 | −1.3658847912e−20 |
| C31 | $x^4 y^3$ | −2.0543759784e−21 | 4.8564114281e−20 | 4.4524082811e−19 |
| C33 | $x^2 y^5$ | −1.8327091886e−21 | −4.0867022535e−19 | −2.8869684177e−17 |
| C35 | $y^7$ | −3.0043141716e−21 | 1.2078475874e−18 | 3.5367835719e−17 |
| C36 | $x^8$ | −6.6730371273e−23 | −4.9868316899e−23 | 5.6736118081e−23 |
| C38 | $x^6 y^2$ | −1.7128533557e−23 | 1.4613727334e−22 | 5.1615574620e−22 |
| C40 | $x^4 y^4$ | 1.1435072933e−22 | −9.3017126702e−22 | −4.7169137737e−20 |
| C42 | $x^2 x^6$ | 1.5102293558e−22 | 4.9695201041e−21 | 1.3937127057e−19 |
| C44 | $y^8$ | 8.2954505580e−23 | 1.6861482733e−21 | 6.2440903513e−20 |
| C46 | $x^8 y$ | 5.3472779336e−25 | 5.2343796302e−25 | 8.9019480836e−25 |
| C48 | $x^6 y^3$ | −4.2537254329e−25 | −1.1258528493e−24 | −3.7134964045e−23 |
| C50 | $x^4 y^5$ | −9.7979646353e−25 | 9.9839670198e−24 | 2.8569149209e−22 |
| C52 | $x^2 y^7$ | −1.4732437699e−24 | −9.6929057343e−25 | 2.3681014554e−22 |
| C54 | $y^9$ | −6.6706131971e−25 | −6.9161874166e−23 | −1.4203837398e−21 |
| C55 | $x^{10}$ | −3.5224466642e−29 | 1.9957655023e−28 | 1.0226231714e−28 |
| C57 | $x^8 y^2$ | −4.2748027627e−28 | −1.0901321568e−27 | −1.4663336937e−26 |
| C59 | $x^6 y^4$ | −9.1617082881e−28 | 1.3763971885e−26 | 3.2379325041e−25 |
| C61 | $x^4 y^6$ | −2.7610541638e−27 | −6.7566362123e−27 | 9.5014063625e−25 |
| C63 | $x^2 y^8$ | −5.8508303957e−27 | −2.7265694062e−25 | −4.6034176839e−24 |
| C65 | $y^{10}$ | −3.5213520429e−27 | 2.3862752675e−25 | −5.7483546686e−24 |
| C67 | $x^{10} y$ | −2.2494177966e−30 | −2.1100651228e−30 | −8.2079987250e−30 |
| C69 | $x^8 y^3$ | 5.4279174255e−30 | 1.3494997255e−29 | 1.7124237614e−28 |
| C71 | $x^6 y^5$ | 2.2501380493e−29 | −2.2270966167e−29 | 9.5129914926e−28 |
| C73 | $x^4 y^7$ | 3.9132948108e−29 | −5.4102053544e−28 | −9.0548018099e−27 |
| C75 | $x^2 y^9$ | 5.2105642109e−29 | 1.2959435944e−27 | −2.5383572792e−26 |
| C77 | $y^{11}$ | 1.1229872145e−29 | 8.9006221989e−28 | 8.9845489264e−26 |
| C78 | $x^{12}$ | 1.7375383919e−33 | −1.9059488347e−33 | −3.4648040526e−34 |
| C80 | $x^{10} y^2$ | 8.5487105053e−34 | 1.5621438023e−32 | 3.6491245469e−32 |
| C82 | $x^8 y^4$ | −8.4648600815e−33 | −3.4750753279e−32 | 3.6280240948e−31 |
| C84 | $x^6 y^6$ | −3.0168976195e−32 | −7.5134795936e−31 | −1.7131610781e−29 |
| C86 | $x^4 y^8$ | 5.7355199361e−32 | 2.9721825736e−30 | −9.1882003894e−29 |
| C88 | $x^2 y^{10}$ | 9.2829088230e−32 | 2.2549223578e−30 | 3.3289102135e−28 |
| C90 | $y^{12}$ | 7.0583029137e−32 | −7.2414460941e−30 | −1.1913134267e−28 |
| C92 | $x^{12} y$ | 5.9350679257e−36 | 3.9447837666e−37 | 2.6470340457e−35 |
| C94 | $x^{10} y^3$ | −3.3115591909e−35 | −4.8830105952e−35 | 4.0679106787e−34 |
| C96 | $x^8 y^5$ | −2.0146868466e−34 | −6.2979241641e−34 | −1.3083361021e−32 |
| C98 | $x^6 y^7$ | −5.5189911344e−34 | 4.4185035602e−33 | −1.3752387714e−31 |
| C100 | $x^4 y^9$ | −6.9106487795e−34 | 2.1572513104e−33 | 6.0464874654e−31 |
| C102 | $x^2 y^{11}$ | −1.2793425808e−33 | −3.1287206959e−32 | −8.6618446129e−31 |
| C104 | $y^{13}$ | 1.7006247893e−34 | 9.7638568791e−33 | −2.0192926345e−30 |
| C105 | $x^{14}$ | −3.9513959629e−39 | 6.9653649110e−39 | −4.7385801045e−39 |
| C107 | $x^{12} y^2$ | 1.9611029970e−40 | −7.9590547641e−38 | 2.8596552573e−37 |
| C109 | $x^{10} y^4$ | 1.5056245963e−37 | −4.5725206337e−37 | −3.2588645221e−36 |
| C111 | $x^8 y^6$ | 9.4242214152e−37 | 5.0510561424e−36 | −7.5301483789e−35 |
| C113 | $x^6 y^8$ | 8.8447443876e−37 | 4.0783057960e−37 | 1.0745543996e−33 |
| C115 | $x^4 y^{10}$ | −1.6720724017e−37 | −5.9514316719e−35 | −9.0969369304e−34 |
| C117 | $x^2 y^{12}$ | −1.8421587738e−36 | 6.5477405837e−35 | −5.1726522685e−33 |
| C119 | $y^{14}$ | 3.9973011677e−37 | 3.0986894323e−35 | 2.5166960919e−33 |
| C121 | $x^{14} y$ | −8.5200931010e−42 | 3.0459290798e−41 | −4.5991893622e−41 |
| C123 | $x^{12} y^3$ | 6.6961456462e−41 | −1.7045551425e−40 | −1.4764540671e−39 |
| C125 | $x^{10} y^5$ | 3.4955968208e−40 | 3.3487733370e−39 | −2.8215002598e−38 |
| C127 | $x^8 y^7$ | 1.5540220063e−39 | −2.3886100945e−39 | 1.1476321908e−36 |
| C129 | $x^6 y^9$ | 4.1694171119e−39 | −6.5875604124e−38 | 7.7242085699e−37 |
| C131 | $x^4 y^{11}$ | 7.1573976929e−39 | 1.4504552830e−37 | −7.5863733168e−37 |
| C133 | $x^2 y^{13}$ | 1.4074057977e−38 | 4.9590116924e−38 | 1.2005763197e−35 |
| C135 | $y^{15}$ | −3.5972898324e−39 | −8.4803955226e−38 | 3.2783960491e−35 |
| C136 | $x^{16}$ | 7.3843284985e−45 | −8.1980105223e−45 | 1.9050227234e−44 |
| C138 | $x^{14} y^2$ | −2.8038825947e−43 | 1.5992905280e−43 | −1.0644871334e−42 |
| C140 | $x^{12} y^4$ | −4.7903056315e−43 | 2.2964809680e−42 | −2.4212687480e−41 |
| C142 | $x^{10} y^6$ | −4.1855002977e−42 | −6.1902593156e−42 | 5.7119964512e−40 |
| C144 | $x^8 y^8$ | −1.1269169710e−41 | −4.4851614288e−41 | 1.0081850630e−39 |
| C146 | $x^6 y^{10}$ | −3.1669058190e−42 | 1.4952137291e−40 | 2.4731421183e−39 |
| C148 | $x^4 y^{12}$ | −8.5742590324e−42 | 1.8048945410e−41 | 2.1885615033e−38 |

TABLE 3b-continued

| | | for FIG. 4 | | |
| --- | --- | --- | --- | --- |
| Coefficient | Formula | M04 | M05 | M06 |
| C150 | $x^2 y^{14}$ | 2.8620341503e−41 | −2.8146462989e−40 | 9.7395235871e−38 |
| C152 | $y^{16}$ | −2.3372739555e−41 | −9.3262549711e−42 | −4.6124848976e−38 |
| C154 | $x^{16} y$ | 5.9834891399e−48 | −5.9666115815e−47 | 1.3360193977e−46 |
| C156 | $x^{14} y^3$ | 1.6481466093e−47 | 1.1046215321e−45 | −9.3569334766e−45 |
| C158 | $x^{12} y^5$ | 1.0787538529e−45 | −7.2373341113e−46 | 9.8704399718e−44 |
| C160 | $x^{10} y^7$ | 7.1840832836e−45 | −2.7485709058e−44 | 3.0525258910e−43 |
| C162 | $x^8 y^9$ | 6.7833697738e−45 | 9.2524406295e−44 | 8.7172215515e−43 |
| C164 | $x^6 y^{11}$ | −4.0355561949e−46 | −2.6327654695e−44 | 3.3100741915e−42 |
| C166 | $x^4 y^{13}$ | −6.1130937123e−44 | −3.0399531217e−43 | 8.0820796068e−41 |
| C168 | $x^2 y^{15}$ | −6.3713164928e−45 | 1.9916980911e−43 | −1.8887869848e−41 |
| C170 | $y^{17}$ | −3.4456053003e−44 | 1.2588779208e−43 | −6.0437373060e−41 |

TABLE 3c

| | | for FIG. 4 | | |
| --- | --- | --- | --- | --- |
| Coefficient | Formula | M07 | M08 | M09 |
| C2 | $y$ | 1.7919082265e−02 | 2.2354011687e−01 | 4.6143819312e−02 |
| C7 | $x^2 y$ | −1.1672423084e−07 | −6.4824823204e−07 | 2.2926688501e−08 |
| C9 | $y^3$ | 1.4370301300e−08 | 2.7774861063e−06 | 4.6479617874e−08 |
| C10 | $x^4$ | 6.9040473284e−11 | 4.7599489311e−10 | −1.6260802968e−11 |
| C12 | $x^2 y^2$ | −9.3778973808e−11 | 1.8423252132e−09 | −4.6268220481e−11 |
| C14 | $y^4$ | −1.1154632595e−11 | 1.1003751016e−08 | −2.0851442909e−11 |
| C16 | $x^4 y$ | 5.8800397669e−14 | −3.0918283215e−13 | 2.3191302108e−14 |
| C18 | $x^2 y^3$ | 6.4115588877e−15 | 2.9696591699e−12 | 6.9559678853e−14 |
| C20 | $y^5$ | 2.5295409085e−15 | 6.1614108756e−11 | 4.8358777380e−14 |
| C21 | $y^6$ | −7.1946527648e−17 | −4.4890605268e−16 | −8.4280830509e−18 |
| C23 | $x^4 y^2$ | −9.7527345973e−17 | 1.0174990249e−14 | −1.0121543658e−16 |
| C25 | $x^2 y^4$ | 7.6031583773e−17 | 5.1689131032e−14 | −1.1003135447e−16 |
| C27 | $y^6$ | 6.2580985029e−17 | 3.5956631183e−13 | −3.4607661833e−17 |
| C29 | $x^6 y$ | −1.2664540925e−19 | −5.6753779291e−18 | 9.9606407078e−21 |
| C31 | $x^4 y^3$ | −6.3323286131e−19 | 2.7134327828e−17 | 1.0604665922e−19 |
| C33 | $x^2 y^5$ | −7.6791008974e−19 | 2.6708260186e−16 | 1.4373504781e−19 |
| C35 | $y^7$ | −1.5116058751e−19 | 2.4037708886e−15 | 6.1280088804e−20 |
| C36 | $x^8$ | −8.3978320004e−22 | −1.2921570680e−21 | 8.8420264741e−24 |
| C38 | $x^6 y^2$ | 5.9017307028e−22 | −2.9842585499e−20 | −1.5544072540e−22 |
| C40 | $x^4 y^4$ | 3.2080602542e−21 | 4.1607078307e−19 | −2.9493763825e−22 |
| C42 | $x^2 x^6$ | 1.4977555855e−21 | 2.4096784455e−18 | −2.1100574101e−22 |
| C44 | $y^8$ | −2.2407098234e−22 | 1.7215701525e−17 | −5.9222213359e−23 |
| C46 | $x^8 y$ | −3.2135337805e−24 | 3.9452129829e−23 | −2.0108708549e−26 |
| C48 | $x^6 y^3$ | −5.9108759679e−24 | −4.4802744870e−22 | 1.4586933764e−25 |
| C50 | $x^4 y^5$ | −3.0903187728e−24 | 1.9463320101e−21 | 2.9946107792e−25 |
| C52 | $x^2 y^7$ | 4.3458302622e−24 | 1.9206388470e−20 | 2.5305866324e−25 |
| C54 | $y^9$ | 8.8141041142e−25 | 1.1591853171e−19 | 7.6198663455e−26 |
| C55 | $x^{10}$ | 9.4773249908e−27 | 3.5741305990e−26 | −4.8657072328e−29 |
| C57 | $x^8 y^2$ | 6.9979748186e−27 | 1.5632705341e−24 | −1.7921075595e−28 |
| C59 | $x^6 y^4$ | 7.5959994705e−27 | 2.5570557553e−24 | −5.1243590425e−28 |
| C61 | $x^4 y^6$ | −4.3204448271e−26 | 1.6292936926e−23 | −5.6991580324e−28 |
| C63 | $x^2 y^8$ | −1.3242121198e−26 | 1.5036981157e−22 | −3.5016835468e−28 |
| C65 | $y^{10}$ | 3.4356615684e−27 | 5.8394442003e−22 | −8.2479703316e−29 |
| C67 | $x^{10} y$ | −1.6325740473e−29 | −1.1140077720e−27 | 7.3707775774e−32 |
| C69 | $x^8 y^3$ | −1.2317472634e−28 | 1.2801879088e−26 | 2.3794842503e−31 |
| C71 | $x^6 y^5$ | 1.3768618594e−28 | 3.9992668962e−26 | 8.7729409191e−31 |
| C73 | $x^4 y^7$ | 1.1635579021e−28 | 1.5378840632e−25 | 1.2112308914e−30 |
| C75 | $x^2 y^9$ | −4.6768762716e−29 | 1.3470022107e−24 | 7.4499678049e−31 |
| C77 | $y^{11}$ | −1.4414536306e−29 | 1.9798483612e−24 | 1.8099433913e−31 |
| C78 | $x^{12}$ | −6.2573622636e−32 | 9.6840022387e−31 | 4.1915134481e−35 |
| C80 | $x^{10} y^2$ | −1.3705906237e−31 | −2.1627131588e−29 | −5.3057626425e−34 |
| C82 | $x^8 y^4$ | −1.1701207834e−30 | −1.2320987581e−28 | −2.2287547235e−33 |
| C84 | $x^6 y^6$ | −8.1382269072e−31 | −3.0243301537e−28 | −4.1583414211e−33 |
| C86 | $x^4 y^8$ | 4.4593120730e−31 | 1.3537235795e−27 | −3.5237066868e−33 |
| C88 | $x^2 y^{10}$ | 2.0466652524e−31 | 1.2747204738e−26 | −1.1994865841e−33 |
| C90 | $y^{12}$ | 3.8840349497e−33 | 5.9926442904e−27 | −2.2221338718e−35 |
| C92 | $x^{12} y$ | 5.7005243953e−34 | 9.9015092784e−33 | −3.0957933927e−37 |
| C94 | $x^{10} y^3$ | 3.9638923346e−33 | −3.8105669740e−31 | −5.0992497858e−37 |
| C96 | $x^8 y^5$ | 3.2101895033e−33 | −1.8952660084e−30 | −2.0052445840e−36 |
| C98 | $x^6 y^7$ | −3.7245005367e−33 | −7.4308159032e−30 | −4.4777909769e−36 |
| C100 | $x^4 y^9$ | −2.6055880635e−33 | 1.2387446272e−29 | −4.6096387637e−36 |
| C102 | $x^2 y^{11}$ | −2.3075372481e−34 | 9.9493160654e−29 | −2.0864057762e−36 |
| C104 | $y^{13}$ | 1.7624892289e−35 | 2.8734192234e−29 | −2.7804742330e−37 |
| C105 | $x^{14}$ | 3.9994949971e−37 | −2.3461598956e−35 | −5.0895650473e−41 |
| C107 | $x^{12} y^2$ | 5.4076191152e−37 | 6.4574876761e−35 | 1.3534605782e−39 |

TABLE 3c-continued

| | | for FIG. 4 | | |
|---|---|---|---|---|
| Coefficient | Formula | M07 | M08 | M09 |
| C109 | $x^{10} y^4$ | 1.1118810332e−35 | 4.2942578332e−33 | 8.8416325093e−39 |
| C111 | $x^8 y^6$ | 3.2559140624e−35 | 2.8673320335e−32 | 2.4001412388e−38 |
| C113 | $x^6 y^8$ | 2.0670357607e−35 | −2.1991840412e−32 | 3.0013772158e−38 |
| C115 | $x^4 y^{10}$ | 3.4244272822e−36 | 1.4083056638e−31 | 1.8018959697e−38 |
| C117 | $x^2 y^{12}$ | 3.9691527754e−37 | 5.8340538680e−31 | 3.7828363842e−39 |
| C119 | $y^{14}$ | 1.4878451183e−37 | 1.3709170354e−31 | −9.0199805810e−40 |
| C121 | $x^{14} y$ | −4.3213523241e−39 | 1.2396051300e−37 | 1.6357254755e−42 |
| C123 | $x^{12} y^3$ | −3.7487408487e−38 | 9.3145282891e−36 | 7.3649581384e−42 |
| C125 | $x^{10} y^5$ | −1.0450728693e−37 | 6.8057675451e−35 | 2.5826640631e−41 |
| C127 | $x^8 y^7$ | −5.6766501485e−38 | 4.0451096046e−34 | 6.0129862312e−41 |
| C129 | $x^6 y^9$ | 5.3027665655e−39 | 3.8842076952e−34 | 7.8946108862e−41 |
| C131 | $x^4 y^{11}$ | 4.9446191449e−39 | 1.4032341431e−33 | 5.7797404833e−41 |
| C133 | $x^2 y^{13}$ | −1.7196314065e−39 | 2.3094763385e−33 | 2.2356418383e−41 |
| C135 | $y^{15}$ | −6.0134489663e−40 | 4.8486471018e−34 | 2.9641050860e−42 |
| C136 | $x^{16}$ | −1.5186175276e−42 | 2.8300687848e−40 | −4.6943614205e−46 |
| C138 | $x^{14} y^2$ | 1.0650904384e−42 | 6.2369201480e−39 | −9.7272328282e−45 |
| C140 | $x^{12} y^4$ | −1.0807917038e−41 | −5.5937407185e−38 | −6.4414916805e−44 |
| C142 | $x^{10} y^6$ | −1.8250235250e−40 | −9.4517306458e−37 | −1.9963070788e−43 |
| C144 | $x^8 y^8$ | −2.6773469853e−40 | 4.0008142625e−37 | −3.3011761498e−43 |
| C146 | $x^6 y^{10}$ | −1.2990789110e−40 | 7.5040126203e−36 | −3.0232075860e−43 |
| C148 | $x^4 y^{12}$ | −1.8571773748e−41 | 1.0603482616e−35 | −1.5330362590e−43 |
| C150 | $x^2 y^{14}$ | 2.9852299389e−42 | 5.4150048200e−36 | −3.4566781760e−44 |
| C152 | $y^{16}$ | 8.1601330425e−43 | 1.6610541213e−36 | 1.9989924896e−45 |
| C154 | $x^{16} y$ | 1.2764893211e−44 | −4.1316714265e−42 | −7.0898000350e−48 |
| C156 | $x^{14} y^3$ | 1.2384703510e−43 | −1.4289667271e−40 | −4.0509877408e−47 |
| C158 | $x^{12} y^5$ | 6.1653990242e−43 | −1.3287749077e−39 | −1.3193097650e−46 |
| C160 | $x^{10} y^7$ | 8.2097899551e−43 | −1.1041409323e−38 | −3.1959838801e−46 |
| C162 | $x^8 y^9$ | 4.9483256526e−43 | −8.2531460500e−39 | −4.9263887132e−46 |
| C164 | $x^6 y^{11}$ | 1.5183483262e−43 | 8.4797298954e−38 | −4.6999085380e−46 |
| C166 | $x^4 y^{13}$ | 1.4846166702e−44 | 5.6268382413e−38 | −2.7071757645e−46 |
| C168 | $x^2 y^{15}$ | −1.7115618922e−45 | 1.4165984177e−38 | −9.0553625721e−47 |
| C170 | $y^{17}$ | −3.9898569454e−46 | 5.5390173410e−39 | −1.1297783952e−47 |
| C171 | $x^{18}$ | 0.0000000000e+00 | −2.1831463451e−45 | 1.8005511319e−51 |
| C173 | $x^{16} y^2$ | 0.0000000000e+00 | −1.5183464124e−43 | 3.3892684645e−50 |
| C175 | $x^{14} y^4$ | 0.0000000000e+00 | −1.5714917233e−44 | 2.3678591193e−49 |
| C177 | $x^{12} y^6$ | 0.0000000000e+00 | 1.6429641123e−41 | 8.3966680622e−49 |
| C179 | $x^{10} y^8$ | 0.0000000000e+00 | 1.3825962459e−41 | 1.7088438276e−48 |
| C181 | $x^8 y^{10}$ | 0.0000000000e+00 | −5.8345885452e−41 | 2.0978197924e−48 |
| C183 | $x^6 y^{12}$ | 0.0000000000e+00 | 6.2027082462e−40 | 1.5431054903e−48 |
| C185 | $x^4 y^{14}$ | 0.0000000000e+00 | 2.1860201839e−40 | 6.8694624354e−49 |
| C187 | $x^2 y^{16}$ | 0.0000000000e+00 | 1.0896130706e−40 | 1.4521537112e−49 |
| C189 | $y^{18}$ | 0.0000000000e+00 | 1.5536206833e−41 | −2.5532307450e−51 |
| C191 | $x^{18} y$ | 0.0000000000e+00 | 4.1370971907e−47 | 2.0985806012e−53 |
| C193 | $x^{16} y^3$ | 0.0000000000e+00 | 1.0259243899e−45 | 1.4384045207e−52 |
| C195 | $x^{14} y^5$ | 0.0000000000e+00 | 1.0829939153e−44 | 4.8976270137e−52 |
| C197 | $x^{12} y^7$ | 0.0000000000e+00 | 1.5381284633e−43 | 1.2397598026e−51 |
| C199 | $x^{10} y^9$ | 0.0000000000e+00 | 2.9582332188e−43 | 2.1195519880e−51 |
| C201 | $x^8 y^{11}$ | 0.0000000000e+00 | −9.9465705373e−43 | 2.3966288455e−51 |
| C203 | $x^6 y^{13}$ | 0.0000000000e+00 | 3.0478995293e−42 | 1.8045192605e−51 |
| C205 | $x^4 y^{15}$ | 0.0000000000e+00 | 7.5826692066e−43 | 8.5142849832e−52 |
| C207 | $x^2 y^{17}$ | 0.0000000000e+00 | 4.3510343502e−43 | 2.5554775815e−52 |
| C209 | $y^{19}$ | 0.0000000000e+00 | 4.4983426610e−44 | 3.2789192601e−53 |
| C210 | $x^{20}$ | 0.0000000000e+00 | 9.4025168781e−51 | −4.8982206388e−57 |
| C212 | $x^{18} y^2$ | 0.0000000000e+00 | 1.5979992892e−48 | −8.4642680532e−56 |
| C214 | $x^{16} y^4$ | 0.0000000000e+00 | 4.7951541761e−48 | −6.0942213536e−55 |
| C216 | $x^{14} y^6$ | 0.0000000000e+00 | −1.8725391845e−46 | −2.3937549869e−54 |
| C218 | $x^{12} y^8$ | 0.0000000000e+00 | −3.4522910678e−46 | −5.6749442855e−54 |
| C220 | $x^{10} y^{10}$ | 0.0000000000e+00 | 6.7145285910e−46 | −8.7002702399e−54 |
| C222 | $x^8 y^{12}$ | 0.0000000000e+00 | −8.1886726797e−45 | −8.5308017562e−54 |
| C224 | $x^6 y^{14}$ | 0.0000000000e+00 | 1.0625533311e−44 | −5.3919378498e−54 |
| C226 | $x^4 y^{16}$ | 0.0000000000e+00 | 1.2142915895e−45 | −2.2096502123e−54 |
| C228 | $x^2 y^{18}$ | 0.0000000000e+00 | −2.6445448193e−46 | −4.5639041010e−55 |
| C230 | $y^{20}$ | 0.0000000000e+00 | 5.1567161269e−47 | −1.1458931420e−56 |
| C232 | $x^{20} y$ | 0.0000000000e+00 | −1.8489977294e−52 | −3.6684819452e−59 |
| C234 | $x^{18} y^3$ | 0.0000000000e+00 | −6.7113312306e−52 | −2.9802612500e−58 |
| C236 | $x^{16} y^5$ | 0.0000000000e+00 | 6.3665604307e−51 | −1.0548900495e−57 |
| C238 | $x^{14} y^7$ | 0.0000000000e+00 | −5.9082007882e−49 | −2.7310764825e−57 |
| C240 | $x^{12} y^9$ | 0.0000000000e+00 | −7.0984511249e−49 | −4.9775424699e−57 |
| C242 | $x^{10} y^{11}$ | 0.0000000000e+00 | 1.1816874777e−47 | −6.0690096296e−57 |
| C244 | $x^8 y^{13}$ | 0.0000000000e+00 | −2.4676429338e−47 | −5.2891688050e−57 |
| C246 | $x^6 y^{15}$ | 0.0000000000e+00 | 2.3676526297e−47 | −3.1894928322e−57 |
| C248 | $x^4 y^{17}$ | 0.0000000000e+00 | −1.1680856709e−47 | −1.1997680633e−57 |
| C250 | $x^2 y^{19}$ | 0.0000000000e+00 | −5.9156182754e−48 | −3.4091556993e−58 |
| C252 | $y^{21}$ | 0.0000000000e+00 | −4.9840929752e−49 | −4.8852450262e−59 |
| C253 | $x^{22}$ | 0.0000000000e+00 | −8.6018309536e−57 | 6.7583456543e−63 |
| C255 | $x^{20} y^2$ | 0.0000000000e+00 | −7.5719552914e−54 | 1.1435056559e−61 |

TABLE 3c-continued

| | | for FIG. 4 | | |
|---|---|---|---|---|
| Coefficient | Formula | M07 | M08 | M09 |
| C257 | $x^{18} y^4$ | 0.0000000000e+00 | 1.2423723571e−53 | 8.7814602964e−61 |
| C259 | $x^{16} y^6$ | 0.0000000000e+00 | 2.2154605324e−51 | 3.8023936971e−60 |
| C261 | $x^{14} y^8$ | 0.0000000000e+00 | 1.0718378770e−50 | 1.0188585320e−59 |
| C263 | $x^{12} y^{10}$ | 0.0000000000e+00 | 1.6207410241e−50 | 1.8585402994e−59 |
| C265 | $x^{10} y^{12}$ | 0.0000000000e+00 | 7.5030478949e−50 | 2.2883849344e−59 |
| C267 | $x^8 y^{14}$ | 0.0000000000e+00 | −1.4317313342e−50 | 1.8867885133e−59 |
| C269 | $x^6 y^{16}$ | 0.0000000000e+00 | 2.7060215361e−50 | 1.0646498615e−59 |
| C271 | $x^4 y^{18}$ | 0.0000000000e+00 | −7.1529079167e−50 | 4.0499607257e−60 |
| C273 | $x^2 y^{20}$ | 0.0000000000e+00 | −5.4986399267e−51 | 8.0372003795e−61 |
| C275 | $y^{22}$ | 0.0000000000e+00 | −2.1987115359e−51 | 3.7976977375e−62 |
| C277 | $x^{22} y$ | 0.0000000000e+00 | 4.1594171074e−58 | 3.5821349455e−65 |
| C279 | $x^{20} y^3$ | 0.0000000000e+00 | −1.7598285342e−56 | 3.4233223414e−64 |
| C281 | $x^{18} y^5$ | 0.0000000000e+00 | −7.2367430997e−56 | 1.2460695752e−63 |
| C283 | $x^{16} y^7$ | 0.0000000000e+00 | 1.2828750183e−54 | 3.2165689750e−63 |
| C285 | $x^{14} y^9$ | 0.0000000000e+00 | −2.0525475758e−53 | 6.0362047203e−63 |
| C287 | $x^{12} y^{11}$ | 0.0000000000e+00 | −1.6182512770e−52 | 7.1716822438e−63 |
| C289 | $x^{10} y^{13}$ | 0.0000000000e+00 | −6.5901384853e−53 | 5.7941474226e−63 |
| C291 | $x^8 y^{15}$ | 0.0000000000e+00 | 1.3795774067e−53 | 3.5620161540e−63 |
| C293 | $x^6 y^{17}$ | 0.0000000000e+00 | 9.8527347691e−53 | 1.3441795539e−63 |
| C295 | $x^4 y^{19}$ | 0.0000000000e+00 | −6.8712074405e−53 | 1.6238675608e−64 |
| C297 | $x^2 y^{21}$ | 0.0000000000e+00 | 5.2529273887e−53 | 9.5836665918e−65 |
| C299 | $y^{23}$ | 0.0000000000e+00 | −2.3540990413e−54 | 3.0168560979e−65 |
| C300 | $x^{24}$ | 0.0000000000e+00 | −5.9600761077e−62 | −4.1632164935e−69 |
| C302 | $x^{22} y^2$ | 0.0000000000e+00 | 1.0863938638e−59 | −7.4193151527e−68 |
| C304 | $x^{20} y^4$ | 0.0000000000e+00 | −4.0117982534e−58 | −6.1380557517e−67 |
| C306 | $x^{18} y^6$ | 0.0000000000e+00 | −1.5718722173e−56 | −2.9000240486e−66 |
| C308 | $x^{16} y^8$ | 0.0000000000e+00 | −1.4008357766e−55 | −8.6301101146e−66 |
| C310 | $x^{14} y^{10}$ | 0.0000000000e+00 | −6.0634631448e−55 | −1.8025017378e−65 |
| C312 | $x^{12} y^{12}$ | 0.0000000000e+00 | −1.4840722112e−54 | −2.6701863663e−65 |
| C314 | $x^{10} y^{14}$ | 0.0000000000e+00 | −1.3091733247e−54 | −2.7523229011e−65 |
| C316 | $x^8 y^{16}$ | 0.0000000000e+00 | −1.0629302071e−55 | −1.9927587216e−65 |
| C318 | $x^6 y^{18}$ | 0.0000000000e+00 | 5.8613810290e−55 | −1.0289816420e−65 |
| C320 | $x^4 y^{20}$ | 0.0000000000e+00 | 3.4823418947e−55 | −3.6376834969e−66 |
| C322 | $x^2 y^{22}$ | 0.0000000000e+00 | 1.5803081162e−55 | −6.9805336821e−67 |
| C324 | $y^{24}$ | 0.0000000000e+00 | 1.3772093915e−57 | −4.4575627675e−68 |
| C326 | $x^{24} y$ | 0.0000000000e+00 | −1.1110895016e−63 | −1.5290482156e−71 |
| C328 | $x^{22} y^3$ | 0.0000000000e+00 | −2.3434183181e−62 | −1.5903156950e−70 |
| C330 | $x^{20} y^5$ | 0.0000000000e+00 | −4.1697969521e−60 | −5.3832975201e−70 |
| C332 | $x^{18} y^7$ | 0.0000000000e+00 | −7.3360581606e−59 | −1.1290838039e−69 |
| C334 | $x^{16} y^9$ | 0.0000000000e+00 | −4.6620713883e−58 | −1.5329526355e−69 |
| C336 | $x^{14} y^{11}$ | 0.0000000000e+00 | −1.5035720530e−57 | 9.0217799998e−71 |
| C338 | $x^{12} y^{13}$ | 0.0000000000e+00 | −2.7848666110e−57 | 3.9073170434e−69 |
| C340 | $x^{10} y^{15}$ | 0.0000000000e+00 | −2.2750829395e−57 | 6.3530673758e−69 |
| C342 | $x^8 y^{17}$ | 0.0000000000e+00 | −1.5116865996e−58 | 5.7536054649e−69 |
| C344 | $x^6 y^{19}$ | 0.0000000000e+00 | 9.9972805825e−58 | 3.6839558863e−69 |
| C346 | $x^4 y^{21}$ | 0.0000000000e+00 | 6.8363951038e−58 | 1.5730396762e−69 |
| C348 | $x^2 y^{23}$ | 0.0000000000e+00 | 1.3061391061e−58 | 2.9148927646e−70 |
| C350 | $y^{25}$ | 0.0000000000e+00 | 1.6092085911e−60 | 1.4331730920e−71 |

TABLE 4

| | for FIG. 4 Coordinates of the stop edge | | |
|---|---|---|---|
| $x_i$ [mm] | $y_i$ [mm] | $x_{i+N/2}$ [mm] | $y_{i+N/2}$ [mm] |
| −367.893612 | 15.028813 | 368.008707 | 1.526968 |
| −367.407246 | 21.811473 | 367.638792 | −5.183369 |
| −366.635369 | 28.609124 | 366.986046 | −11.861030 |
| −365.579212 | 35.416952 | 366.052980 | −18.502010 |
| −364.240770 | 42.230004 | 364.842783 | −25.102475 |
| −362.622783 | 49.043199 | 363.359289 | −31.658752 |
| −360.728713 | 55.851344 | 361.606936 | −38.167330 |
| −358.562717 | 62.649150 | 359.590708 | −44.624845 |
| −356.129606 | 69.431245 | 357.316093 | −51.028077 |
| −353.434805 | 76.192194 | 354.789017 | −57.373934 |
| −350.484301 | 82.926515 | 352.015789 | −63.659443 |
| −347.284593 | 89.628697 | 349.003036 | −69.881740 |
| −343.842625 | 96.293220 | 345.757639 | −76.038050 |
| −340.165735 | 102.914576 | 342.286673 | −82.125682 |
| −336.261581 | 109.487286 | 338.597335 | −88.142008 |
| −332.138082 | 116.005920 | 334.696886 | −94.084461 |
| −327.803345 | 122.465121 | 330.592587 | −99.950513 |

TABLE 4-continued for FIG. 4
Coordinates of the stop edge

| $x_i$ [mm] | $y_i$ [mm] | $x_{i+N/2}$ [mm] | $y_{i+N/2}$ [mm] |
|---|---|---|---|
| −323.265608 | 128.859621 | 326.291644 | −105.737673 |
| −318.533166 | 135.184258 | 321.801149 | −111.443474 |
| −313.614316 | 141.433997 | 317.128038 | −117.065468 |
| −308.517295 | 147.603941 | 312.279044 | −122.601221 |
| −303.250227 | 153.689346 | 307.260664 | −128.048307 |
| −297.821071 | 159.685627 | 302.079129 | −133.404311 |
| −292.237581 | 165.588366 | 296.740388 | −138.666825 |
| −286.507265 | 171.393320 | 291.250091 | −143.833451 |
| −280.637356 | 177.096417 | 285.613586 | −148.901808 |
| −274.634789 | 182.693760 | 279.835921 | −153.869529 |
| −268.506179 | 188.181626 | 273.921854 | −158.734272 |
| −262.257819 | 193.556459 | 267.875861 | −163.493722 |
| −255.895668 | 198.814871 | 261.702163 | −168.145599 |
| −249.425361 | 203.953631 | 255.404740 | −172.687661 |
| −242.852209 | 208.969664 | 248.987360 | −177.117711 |
| −236.181218 | 213.860042 | 242.453604 | −181.433605 |
| −229.417101 | 218.621980 | 235.806895 | −185.633249 |
| −222.564299 | 223.252825 | 229.050522 | −189.714613 |
| −215.626999 | 227.750050 | 222.187669 | −193.675724 |
| −208.609157 | 232.111249 | 215.221442 | −197.514680 |
| −201.514524 | 236.334125 | 208.154893 | −201.229641 |
| −194.346662 | 240.416488 | 200.991040 | −204.818841 |
| −187.108973 | 244.356244 | 193.732894 | −208.280582 |
| −179.804714 | 248.151388 | 186.383472 | −211.613238 |
| −172.437025 | 251.800002 | 178.945818 | −214.815255 |
| −165.008940 | 255.300247 | 171.423017 | −217.885152 |
| −157.523409 | 258.650359 | 163.818207 | −220.821518 |
| −149.983313 | 261.848644 | 156.134590 | −223.623015 |
| −142.391478 | 264.893478 | 148.375437 | −226.288373 |
| −134.750687 | 267.783301 | 140.544103 | −228.816393 |
| −127.063692 | 270.516618 | 132.644021 | −231.205947 |
| −119.333220 | 273.091998 | 124.678710 | −233.455972 |
| −111.561985 | 275.508076 | 116.651776 | −235.565473 |
| −103.752691 | 277.763552 | 108.566909 | −237.533520 |
| −95.908038 | 279.857195 | 100.427882 | −239.359251 |
| −88.030725 | 281.787845 | 92.238545 | −241.041866 |
| −80.123451 | 283.554417 | 84.002825 | −242.580631 |
| −72.188921 | 285.155903 | 75.724719 | −243.974874 |
| −64.229844 | 286.591381 | 67.408285 | −245.223988 |
| −56.248933 | 287.860009 | 59.057639 | −246.327431 |
| −48.248905 | 288.961039 | 50.676950 | −247.284721 |
| −40.232484 | 289.893812 | 42.270428 | −248.095441 |
| −32.202396 | 290.657766 | 33.842323 | −248.759240 |
| −24.161371 | 291.252439 | 25.396915 | −249.275828 |
| −16.112140 | 291.677466 | 16.938507 | −249.644980 |
| −8.057438 | 291.932587 | 8.471424 | −249.866536 |
| 0.000000 | 292.017645 | 0.000000 | −249.940398 |
| 8.057438 | 291.932587 | −8.471424 | −249.866536 |
| 16.112140 | 291.677466 | −16.938507 | −249.644980 |
| 24.161371 | 291.252439 | −25.396915 | −249.275828 |
| 32.202396 | 290.657766 | −33.842323 | −248.759240 |
| 40.232484 | 289.893812 | −42.270428 | −248.095441 |
| 48.248905 | 288.961039 | −50.676950 | −247.284721 |
| 56.248933 | 287.860009 | −59.057639 | −246.327431 |
| 64.229844 | 286.591381 | −67.408285 | −245.223988 |
| 72.188921 | 285.155903 | −75.724719 | −243.974874 |
| 80.123451 | 283.554417 | −84.002825 | −242.580631 |
| 88.030725 | 281.787845 | −92.238545 | −241.041866 |
| 95.908038 | 279.857195 | −100.427882 | −239.359251 |
| 103.752691 | 277.763552 | −108.566909 | −237.533520 |
| 111.561985 | 275.508076 | −116.651776 | −235.565473 |
| 119.333220 | 273.091998 | −124.678710 | −233.455972 |
| 127.063692 | 270.516618 | −132.644021 | −231.205947 |
| 134.750687 | 267.783301 | −140.544103 | −228.816393 |
| 142.391478 | 264.893478 | −148.375437 | −226.288373 |
| 149.983313 | 261.848644 | −156.134590 | −223.623015 |
| 157.523409 | 258.650359 | −163.818207 | −220.821518 |
| 165.008940 | 255.300247 | −171.423017 | −217.885152 |
| 172.437025 | 251.800002 | −178.945818 | −214.815255 |
| 179.804714 | 248.151388 | −186.383472 | −211.613238 |
| 187.108973 | 244.356244 | −193.732894 | −208.280582 |
| 194.346662 | 240.416488 | −200.991040 | −204.818841 |
| 201.514524 | 236.334125 | −208.154893 | −201.229641 |
| 208.609157 | 232.111249 | −215.221442 | −197.514680 |
| 215.626999 | 227.750050 | −222.187669 | −193.675724 |

TABLE 4-continued

| for FIG. 4 Coordinates of the stop edge | | | |
|---|---|---|---|
| $x_i$ [mm] | $y_i$ [mm] | $x_{i+N/2}$ [mm] | $y_{i+N/2}$ [mm] |
| 222.564299 | 223.252825 | −229.050522 | −189.714613 |
| 229.417101 | 218.621980 | −235.806895 | −185.633249 |
| 236.181218 | 213.860042 | −242.453604 | −181.433605 |
| 242.852209 | 208.969664 | −248.987360 | −177.117711 |
| 249.425361 | 203.953631 | −255.404740 | −172.687661 |
| 255.895668 | 198.814871 | −261.702163 | −168.145599 |
| 262.257819 | 193.556459 | −267.875861 | −163.493722 |
| 268.506179 | 188.181626 | −273.921854 | −158.734272 |
| 274.634789 | 182.693760 | −279.835921 | −153.869529 |
| 280.637356 | 177.096417 | −285.613586 | −148.901808 |
| 286.507265 | 171.393320 | −291.250091 | −143.833451 |
| 292.237581 | 165.588366 | −296.740388 | −138.666825 |
| 297.821071 | 159.685627 | −302.079129 | −133.404311 |
| 303.250227 | 153.689346 | −307.260664 | −128.048307 |
| 308.517295 | 147.603941 | −312.279044 | −122.601221 |
| 313.614316 | 141.433997 | −317.128038 | −117.065468 |
| 318.533166 | 135.184258 | −321.801149 | −111.443474 |
| 323.265608 | 128.859621 | −326.291644 | −105.737673 |
| 327.803345 | 122.465121 | −330.592587 | −99.950513 |
| 332.138082 | 116.005920 | −334.696886 | −94.084461 |
| 336.261581 | 109.487286 | −338.597335 | −88.142008 |
| 340.165735 | 102.914576 | −342.286673 | −82.125682 |
| 343.842625 | 96.293220 | −345.757639 | −76.038050 |
| 347.284593 | 89.628697 | −349.003036 | −69.881740 |
| 350.484301 | 82.926515 | −352.015789 | −63.659443 |
| 353.434805 | 76.192194 | −354.789017 | −57.373934 |
| 356.129606 | 69.431245 | −357.316093 | −51.028077 |
| 358.562717 | 62.649150 | −359.590708 | −44.624845 |
| 360.728713 | 55.851344 | −361.606936 | −38.167330 |
| 362.622783 | 49.043199 | −363.359289 | −31.658752 |
| 364.240770 | 42.230004 | −364.842783 | −25.102475 |
| 365.579212 | 35.416952 | −366.052980 | −18.502010 |
| 366.635369 | 28.609124 | −366.986046 | −11.861030 |
| 367.407246 | 21.811473 | −367.638792 | −5.183369 |
| 367.893612 | 15.028813 | −368.008707 | 1.526968 |
| 368.093999 | 8.265809 | −368.093999 | 8.265809 |

Further data of the projection optical unit 7 arise from Table 5 below:

TABLE 5

| for FIG. 4 | | |
|---|---|---|
| NA | Numerical aperture | 0.75 |
| $|\beta x|$ | Magnification scale in the cross-scan direction | 4.0 |
| $|\beta y|$ | Magnification scale in the scan direction | 8.0 |
| RMS | Scanned wavefront deviation | 8.9 m$\lambda$ |
| N | Number of mirrors | 9 |

The projection optical unit 32 according to FIG. 4 has an object/image offset a of 3731 mm. The working distance b is present between the object plane 5 and the reflection portion of the mirror M5, closest thereto, in the case of the projection optical unit 32 and is 275 mm. The meridional transverse dimension c is present between the separation plane 31a and the reflection portion of the mirror M9, furthest from the separation plane 31a, in the case of the projection optical unit 32 and is 4397 mm in the case of the projection optical unit 32.

The ratio a/c is 0.85 in the case of the projection optical unit 32. The ratio b/c is 0.063 in the case of the projection optical unit 32.

The ratio a/c is greater than 0.5 in each of the three above-described projection optical units 7, 31 and 32.

The dimensional ratio b/c is greater than 0.05 in each of the projection optical units 7, 31 and 32.

The projection optical units 7, 31 and 32 each have an object/image offset a of at least 1500 mm.

The projection optical units 7, 31 and 32 each have a working distance b of at least 270 mm. The projection optical units 7, 31 and 32 each have a meridional transverse dimension of at most 4500 mm.

Important characteristics of the projection optical units 7, 31, 32 are summarized again below in a characteristics table:

| Projection optical unit | Object/image offset (mm) | Working distance (mm) | Meridional transverse dimension (mm) | a/c | b/c |
|---|---|---|---|---|---|
| FIG. 2 | 1650 | 275 | 2154 | 0.76 | 0.128 |
| FIG. 3 | 3468 | 277 | 4112 | 0.84 | 0.067 |
| FIG. 4 | 3731 | 275 | 4397 | 0.85 | 0.063 |

Characteristics of the Projection Optical Units According to FIGS. 2, 3 and 4

In order to produce a microstructured or nanostructured component, the projection exposure apparatus 1 is used as follows: first, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An imaging optical unit, comprising:

a plurality of mirrors configured to image an object field in an object plane into an image field in an image plane, wherein:

the imaging optical unit has an image-side numerical aperture greater than 0.55;

the imaging optical unit has an object/image offset between a separation plane and a center of the image field;

a center of the object field is located in the separation plane;

the separation plane is perpendicular to a meridional plane of the imaging optical unit;

the imaging optical unit has a working distance between the object plane and a reflection portion, closest to the object plane, of one of the mirrors;

the working distance is at least 270 mm;

the imaging optical unit has a meridional transverse dimension between the separation plane and a reflection portion, furthest from the separation plane, of one of the mirrors;

a ratio of the object/image offset to the meridional transverse dimension is 0.76; and a ratio of the working distance to the meridional transverse dimension is at least 0.05.

2. The imaging optical unit of claim 1, wherein the object/image offset is at least 1500 mm.

3. The imaging optical unit of claim 1, wherein the working distance is at least 275 mm.

4. The imaging optical unit of claim 1, wherein the meridional transverse dimension is at most 4500 mm.

5. The imaging optical unit of claim 1, wherein the imaging optical unit is an anamorphic imaging optical unit.

6. The imaging optical unit of claim 1, wherein the imaging optical unit has a wavefront aberration of no more than 20 mλ.

7. The imaging optical unit of claim 1, wherein the mirrors total at least eight.

8. The imaging optical unit of claim 1, wherein the mirrors comprise at least four grazing incidence mirrors.

9. The imaging optical unit of claim 1, wherein the mirrors comprise at least three normal incidence mirrors.

10. The imaging optical unit of claim 1, wherein the object/image offset is at least 1500 mm, and the working distance is at least 275 mm.

11. The imaging optical unit of claim 10, wherein the object/image offset is at least 1500 mm, and the working distance is at least 275 mm, and the meridional transverse dimension is at most 4500 mm.

12. The imaging optical unit of claim 1, wherein the working distance is at least 275 mm, and the meridional transverse dimension is at most 4500 mm.

13. The imaging optical unit of claim 1, wherein mirrors total at least eight, and the mirrors comprise at least four grazing incidence mirrors.

14. The imaging optical unit of claim 13, wherein the imaging optical unit is an anamorphic imaging optical unit.

15. The imaging optical unit of claim 13, wherein the imaging optical unit has a wavefront aberration of no more than 20 mλ.

16. The imaging optical unit of claim 1, wherein:

the object/image offset is at least 1500 mm;

the working distance is at least 275 mm;

the meridional transverse dimension is at most 4500 mm;

the imaging optical unit is an anamorphic imaging optical unit;

the imaging optical unit has a wavefront aberration of no more than 20 mλ;

the mirrors total at least eight;

the mirrors comprise at least four grazing incidence mirrors; and the mirrors comprise at least three normal incidence mirrors.

17. An optical system, comprising:

an imaging optical unit according to claim 1; and an illumination optical unit configured to illuminate the object field with illumination and imaging light.

18. An illumination system, comprising:

an optical system, comprising:

an imaging optical unit according to claim 1; and an illumination optical unit configured to illuminate the object field with illumination and imaging light; and an EUV light source configured to produce the illumination and imaging light.

19. An apparatus, comprising:

an illumination system, comprising:

an optical system, comprising:

an imaging optical unit according to claim 1; and an illumination optical unit configured to illuminate the object field with illumination and imaging light; and an EUV light source configured to produce the illumination and imaging light, wherein the apparatus is a projection exposure apparatus for projection lithography.

20. A method, comprising:

using a projection exposure apparatus to project a structure on a reticle onto a light-sensitive material of a wafer, wherein the projection exposure apparatus comprises:

an illumination system, comprising:

an optical system, comprising:

an imaging optical unit according to claim 1; and an illumination optical unit configured to illuminate the object field with illumination and imaging light; and an EUV light source configured to produce the illumination and imaging light.

* * * * *